(12) United States Patent
Kunita et al.

(10) Patent No.: US 6,902,864 B2
(45) Date of Patent: Jun. 7, 2005

(54) POLYMERIZABLE COMPOSITION

(75) Inventors: Kazuto Kunita, Shizuoka-ken (JP);
Kazuhiro Fujimaki, Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 20 days.

(21) Appl. No.: 10/669,526

(22) Filed: Sep. 25, 2003

(65) Prior Publication Data

US 2004/0068026 A1 Apr. 8, 2004

(30) Foreign Application Priority Data

Sep. 26, 2002 (JP) ........................................ 2002-281557

(51) Int. Cl.[7] .............................................. G03F 7/038
(52) U.S. Cl. ................................ 430/287.1; 430/281.1
(58) Field of Search ........................... 430/287.1, 281.1

(56) References Cited

U.S. PATENT DOCUMENTS

| | | | |
|---|---|---|---|
| 2,850,445 A | | 9/1958 | Oster |
| 3,418,118 A | | 12/1968 | Thommes et al. |
| 5,576,399 A | | 11/1996 | Roth et al. |
| 6,232,038 B1 | | 5/2001 | Takasaki et al. |
| 6,531,195 B2 | * | 3/2003 | Negoro et al. ............... 428/1.2 |
| 6,540,940 B1 | * | 4/2003 | Negoro et al. ......... 252/299.01 |
| 2002/0048639 A1 | * | 4/2002 | Negoro et al. ............... 428/1.2 |
| 2003/0198893 A1 | * | 10/2003 | Oshima ................... 430/273.1 |
| 2004/0100600 A1 | * | 5/2004 | Takeuchi et al. ............ 349/117 |

FOREIGN PATENT DOCUMENTS

| | | |
|---|---|---|
| EP | 0 747 770 A2 | 12/1996 |
| JP | 44-20189 B | 8/1969 |
| JP | 8/276558 A | 10/1996 |
| JP | 2000-187322 A | 7/2000 |
| JP | 2004-93947 * | 3/2004 |

OTHER PUBLICATIONS

Database WPI, Section Ch, Week 199248, Derwent Publications Ltd., London, GB, class A89, AN 1992–394823, XP002267774, JP 04 294352 A, (Tamura Kaken Co Ltd), Oct. 19, 1992, *abstract*.

* cited by examiner

*Primary Examiner*—Hoa Van Le
(74) *Attorney, Agent, or Firm*—Sughrue Mion, PLLC

(57) ABSTRACT

A photo- or thermo-polymerizable composition including an alkali-soluble polymerizable polymer that contains a structure represented by the following general formula (I) on a side chain. In general formula (I), X represents a polymerizable group; A represents an alkali-soluble group; Q represents a hydrocarbon linking group or a hetero ring; $Z^1$ and $Z^2$ each independently represent a single bond or a hydrocarbon linking group; and $P^1$ to $P^5$ each independently represent a single bond, or a linking group constituted by a hydrogen atom, a nitrogen atom, an oxygen atom, a sulfur atom, and a carbonyl group (>C=O)

General formula (I)

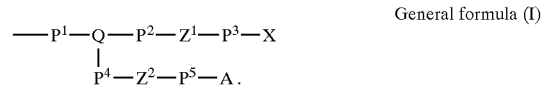

19 Claims, No Drawings

POLYMERIZABLE COMPOSITION

CROSS-REFERENCE TO RELATED APPLICATION

This application claims priority under 35USC 119 from Japanese Patent Application No. 2002-281557, the disclosure of which is incorporated by reference herein.

BACKGROUND OF THE INVENTION

1. Field of the Invention

The present invention relates to a polymerizable composition that can be polymerized and cured by light or heat. More specifically, it relates to a photo- or thermo-polymerizable composition that can be used as a recording layer of a "Computer-to-Plate" planographic printing plate precursor with high sensitivity. In "Computer-to-Plate" system, images are recorded on a planographic printing plate by image-wise irradiating with lasers based on digital signals from computers or the like.

2. Description of the Related Art

Solid lasers, semiconductor lasers and gas lasers that emit UV light, visible light, and infrared light in a wavelength range of 300 to 1200 nm are widely available and they are high in power and small in size. These lasers are useful as a recording light source when direct plate making is performed from digital data of a computer or the like. There are various studies on image recording materials that can respond to these various laser lights; as typical image recording materials, acid catalyst crosslinking negative image recording materials (for instance, JP-A No. 8-276558) that allow recording with an infrared laser of a photosensitive wavelength of 760 nm or more are known. Furthermore, examples of recording materials sensitive to UV light or visible light in a range of 300 to 700 nm also include a lot of radical polymerizable negative image recording materials (for instance, U.S. Pat. No. 2,850,445 and JP-B No. 44-20189).

As high sensitive radical polymerizable recording materials particularly suitable for a printing plate, usually, polymerizable compositions that contain an alkali-soluble polymerizable polymer binder and a polymerizable crosslinking agent (monomer, oligomer) are used. In such radical polymerizable compositions, while an increase in an amount of the polymer serving as a binder is generally effective in improving storage stability, on the other hand, a tendency toward lower sensitivity is observed. On the contrary, when a content of the polymerizable crosslinking agent is increased to attain higher sensitivity, storage stability is likely to deteriorate. Accordingly, the present situation is that a balance between storage stability and high sensitivity is attained by controlling a ratio of the binder to the polymerizable crosslinking agent.

On the other hand, as highly sensitive radical polymerizable photo- or heat-sensitive materials suitable for a recording layer of the printing plate, usually, combinations of alkali-soluble polymerizable polymer binders and polymerizable crosslinking agents (monomer, oligomer) are used. With the intention of attaining high sensitivity, for instance, JP-A No. 2000-187322 proposes a technique in which one that is endowed with a radical polymerizable group within a molecule is used as a binder. When the binder is endowed with the radical polymerizable group, since the binder that is a polymer participates directly in the crosslinking, an augmentation of the crosslinking reaction due to a molecular weight effect is caused, and thereby a little bit higher sensitivity can be assuredly obtained; on the contrary, since the photosensitive materials become thermally unstable, there are concerns in that storage stability may deteriorate owing to the higher gelling efficiency of the crosslinking binder, and deterioration of the developability of non-image areas interposed between image fine lines due to a crosslink structure formed in the polymer may result in less sharpness of the fine lines, that is, lower image quality. This is a general dilemma when the polymers are used; even with the above technique, the essential reciprocality between the stability and the sensitivity cannot be avoided. This is considered that generally in the case of the polymers, when the polymerizability thereof is improved, storage stability that is observed in non-polymers tends to decrease, as a result, the balance between the sensitivity and storage stability is deteriorated.

Usually, photo-radical polymerizable compositions allow a curing reaction to occur with high sensitivity; however, since polymerization inhibition due to oxygen in the air is likely to occur, it is common to dispose an oxygen-shielding layer on an image formation layer. However, the disposition of the oxygen-shielding layer causes fogging due to dark polymerization, resulting in deterioration in storage stability.

Furthermore, in a recording layer obtained by forming a film from the photo-polymerizable composition, a curing reaction due to light proceeds sufficiently in the neighborhood of a surface thereof. However, in the depths of the recording layer, there is a problem in that since a sufficient curing reaction does not proceed, high press life is difficult to attain.

Thus, in photo-polymerizable compositions that utilize a curing reaction due to light exposure, a technique that can sufficiently accomplish both objects of high sensitivity and storage stability has not been obtained at present.

SUMMARY OF THE INVENTION

One object of the present invention is to provide photo- or thermo-polymerizable compositions in which a curing reaction occurs and proceeds with high sensitivity and an obtained cured film is excellent in hardness and storage stability.

Furthermore, another object of the invention is to provide photo- or thermo-polymerizable compositions preferable as a recording layer of a planographic printing plate precursor that can be recorded with high sensitivity by using infrared laser exposure, and is excellent in press life and storage stability.

The present inventors, after intensive study, have found that polymer binders that have on a side chain a functional group that contains both of a specific polymerizable partial structure (polymerizable group) and an alkali-soluble group can be cured with high sensitivity, and that when these polymer binders are used in an image recording material, the image recording material can form a high quality image, and is excellent in press life and storage stability, to thereby accomplish the invention.

That is, the polymerizable composition according to the invention includes an alkali-soluble polymerizable polymer that has on a side chain a structure represented by the following general formula (I), and, when subjected to either exposure or heating, is polymerized and cured.

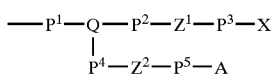
General Formula (I)

In general formula (I), X represents a polymerizable group and A represents an alkali-soluble group. Q represents a hydrocarbon linking group or a hetero ring, and $Z^1$ and $Z^2$ each independently represent a single bond or a hydrocarbon linking group. $P^1$ to $P^5$ each independently represent a single bond, or a linking group constituted by a hydrogen atom, a nitrogen atom, an oxygen atom, a sulfur atom, and a carbonyl group (>C=O).

In the invention, a "photo- or thermo-polymerizable composition" indicates a composition in which, when energy is given by exposing or heating, polymerization is caused, forwarded followed by curing, and includes compositions that polymerize owing to "light", "heat" and furthermore "light and heat". In the following, in the present specification, these are simply referred to as "polymerizable compositions".

Although an operational mechanism of the invention is not clear, it is considered as mentioned below. That is, in an alkali-soluble polymerizable polymer used in the invention, different from existing ones, a polymerizable group is located in the neighborhood of a pole of the alkali-soluble group. Accordingly, in an unexposed area (non-image area in an image recording material), the polymerizable group is present in a network structure of hydrogen-bonding interactions formed between acid groups. As a result, movement of the polymerizable groups is restricted, and, in comparison with a polymerizable group that does not have the acid groups in the neighborhood as in a polymer that has both structures differently, the polymer according to the invention can be more stabilized thermally. Furthermore, in the alkali-soluble polymerizable polymer, even if the crosslinking is slightly caused owing to heat during storage, since the development (removal of non-image area) can effectively work owing to the acid group in the neighborhood, both storage stability and developability can be excellently maintained.

On the other hand, in an exposed area (an image area in the image recording material), the acid groups are included in a crosslink network formed through a crosslink reaction of the polymerizable groups and shielded from developing solution, resulting in excellent development resistance. Accordingly, since change of the film formability between an exposed area and an unexposed area, furthermore, of the developability therebetween becomes larger. As a result, high sensitivity recording is made possible, high quality image formation is made possible, and excellent storage stability can be obtained.

Furthermore, it is considered as follows. That is, networks due to the hydrogen bond of the acid groups and network structures due to the crosslink of the polymerizable groups are not independent but present entangled in the neighborhood. Accordingly, since a strong crosslink film is formed, that is, the film strength is excellent, even in the case of being used as an image recording material, even when compared with a polymer that has the acid group and the polymerizable group separately, more higher press life can be realized.

Furthermore, the polymerizable compositions according to the invention, though polymerized due to either heating or light exposing, can be preferably polymerized when exposed in particular due to a heat-mode laser whose wavelength of the laser light is at least 800 nm; that is, it can be preferably used as a recording layer of a heat-mode corresponding direct planographic printing plate. The reason for this is as follows. In the heat-mode sensitive materials, light is converted into heat, and the heat generates radicals; accordingly, the compatibility between storage stability (thermal stability) and the sensitivity is more difficult than in the photon-mode sensitive materials where the radicals are generated owing to light. However, since the sensitive materials according to the invention, as mentioned above, can overcome the existing trade-off relationship between storage stability and sensitivity, that is, allows these to be compatible, these can be particularly effective used. Furthermore, the polymerization cure (write-in) mechanism due to the heat-mode, different from the photon-mode, has a problem in that because of low heat diffusion, in the neighborhood of a support, the curing due to radical reaction does not proceed sufficiently. Also from this standpoint, a rigid cured film property is required of the exposure area (image area). Even in this point, the polymerizable composition according to the invention, which is excellent in the curing property of the film, is effective.

DETAILED DESCRIPTION OF THE INVENTION

The polymerizable compositions according to the invention will be detailed as follows.

The photo- or thermo-polymerizable composition according to the invention includes an alkali-soluble polymerizable polymer that contains a structure represented by the following general formula (I) on a side chain (hereinafter, sometimes referred to as a "specific polymerizable polymer").

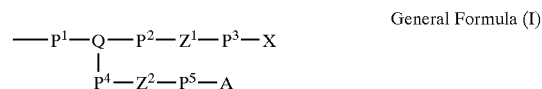
General Formula (I)

<Alkali-soluble Polymer Having a Structure Represented by General Formula (I) on a Side Chain>

The specific polymerizable polymers according to the present invention are preferably linear organic polymers. They preferably have, on a side chain, a structure represented by general formula (I), that is, a structure that includes both the specific polymerizable group and the alkali-soluble group. In the following, a preferable main chain structure of the polymer and the structure represented by general formula (I) that characterizes the specific polymerizable polymer will be sequentially explained.

The alkali-soluble polymerizable polymers according to the invention are basically preferable to belong to linear organic polymers described below.

As such "linear organic polymer", as far as it is a linear organic polymer having the compatibility with a photo-polymerizable ethylenic unsaturated compound, any one can be used. Preferably, a water or weak alkaline aqueous solution soluble or swelling linear organic polymer that enables to develop with water or weak alkaline aqueous solution is selected.

A main chain of the linear organic polymer is not particularly limited. However, preferable examples of main chains, from a view point of the effectiveness, include polyurethane polymers, polyamide polymers, polyester polymers, polyvinyl polymers, polystyrenic polymers, poly(meth)acrylic polymers and novolak polymers. More preferable examples include the polystyrene polymers and poly(meth)acrylic polymers.

In the present specification, when both of the acryl and methacryl or either one of these is indicated, in some cases, it may be referred to as (meth)acryl.

The specific polymerizable polymer according to the invention is necessary to have the structure represented by general formula (I) on a side chain, and the side chain structure has the characteristics of "polymerizable alkali soluble group".

First, the polymerizable group (X in general formula (I)) in the side chain structure will be explained. Examples of the polymerizable group X include a cation polymerizable group and a radical polymerizable group; between these, the radical polymerizable group is preferable.

The radical polymerizable group that can be introduced in the side chain structure of the polymer according to the invention, as far as it is the radical polymerizable group, is not particularly limited.

Preferable examples include an α-alkyl acryl group [—OC(=O)—C(—$C_nH_{2n+1}$)=$CH_2$ (n=from 2 to 12)], α-substituted methyl acryl group [—OC(=O)—C($CH_2Z$)=$CH_2$ (here, Z is a hydrocarbon group starting from a hetero atom)], acryl group, methacryl group, allyl group, styryl group, vinyl group, chrotonyl group, isocrotonyl group and itaconyl group. Among these, an acryl group, methacryl group, and allyl group are particularly preferable.

Next, the alkali-soluble group (A in general formula (I)) in the side chain structure will be explained. There is no particular limitation to the alkali-soluble group A as far as it is an acid that dissolves in an alkali developing solution whose pH is in a range of 10 to 13.

Preferable examples include sulfonic acid, carboxylic acid, phenol, sulfonic acid amide, sulfonic acid imide, imide, hydroxamic acid, barbituric acid, thiol, phosphoric acid, phosphonic acid and others such as functional groups having an active proton of pKa of 10 or less. Among these, carboxylic acid, sulfonic acid imide, barbituric acid and phenol are particularly preferable.

The polymerizable group X and the alkali-soluble group A are described as integrally contained in the side chain structure represented by general formula (I) according to the invention. However, other than the above side chain structure, as independent constituent units respectively having the polymerizable group or the alkali-soluble group, these may be copolymerized in the specific polymerizable alkali-soluble polymerizable polymer according to the invention.

A content of the radical polymerizable group in the specific polymerizable polymer (a content of radical-polymerizable unsaturated double bond due to bromometry) per gram of the polymer is preferably in a range of 0.1 to 10.0 mmol, more preferably 1.0 to 7.0 mmol, and most preferably 2.0 to 5.0 mmol. When the content is less than 0.1 mmol, the curability becomes low and the sensitivity tends to decrease; on the other hand, when the content exceeds 10.0 mmol, the instability is caused and storage stability tends to decrease.

Furthermore, a content of the alkali-soluble group in the specific polymerizable polymer (an acid value due to neutralization titration) per gram of the polymer is preferably in a range of 0.1 to 10.0 mmol, more preferably 0.5 to 7.0 mmol, and most preferably 0.7 to 3.0 mmol. When the content is less than 0.1 mmol, the alkali solubility tends to decrease; accordingly, when it is used as an image recording material, precipitation occurs at the development and scum tends to be generated. On the other hand, when the content exceeds 10.0 mmol, the hydrophilic property becomes so high that press life tends to decrease.

The structure of the side chain as the "polymerizable" and "alkali soluble" group represented by general formula (I) will be explained as follows. In the invention, as obvious from the structure represented by general formula (I), it is important that the polymerizable group and the alkali-soluble group are not only contained in one side chain structure but also present with a fixed mutual positional relationship.

In general formula (I), $Z^1$ and $Z^2$ each independently represent a single bond or a hydrocarbon linking group that may have a substituent group. The hydrocarbon linking group may be either one that has a chain structure or one that has a cyclic structure. Examples of those having a cyclic structure include an aryl linking group (a polyvalent linking group in which hydrogen atoms are removed from an aryl group in accordance with the valence) and cycloalkyl linking group (a polyvalent linking group in which hydrogen atoms are removed from a cycloalkyl group in accordance with the valence). Examples of the aryl group include those in which condensed rings consist of 1 to 3 benzene rings and those in which condensed rings consist of a benzene ring and a 5-membered unsaturated ring. Specific examples thereof include a phenyl group, naphthyl group, anthryl group, phenanthryl group, indenyl group, acenabutenyl group, and fluorenyl group. Specific examples of the cycloalkyl groups include a cyclobutyl group, cyclopentyl group, cyclohexyl group, cycloheptyl group, cyclooctyl group, adamanthyl group, and norbornyl group.

Furthermore, examples of those having a chain structure include an ethyl group, propyl group, butyl group, pentyl group, hexyl group, heptyl group, octyl group, decyl group, and dodecyl group.

Examples of substituent groups that can be introduced into these hydrocarbon groups include monovalent non-metal atomic groups except for hydrogen. Preferable examples include a halogen atom (—F, —Br, —Cl and —I), hydroxyl group, alkoxy group, aryloxy group, mercapto group, alkylthio group, arylthio group, alkyldithio group, aryldithio group, amino group, N-alkylamino group, N,N-dialkylamino group, N-arylamino group, N,N-diarylamino group, N-alkyl-N-arylamino group, acyloxy group, carbamoyloxy group, N-alkylcarbamoyloxy group, N-arylcarbamoyloxy group, N,N-dialkylcarbamoyloxy group, N,N-diarylcarbamoyloxy group, N-alkyl-N-arylcarbamoyloxy group, alkylsulfoxy group, arylsulfoxy group, acylthio group, acylamino group, N-alkylacylamino group, N-arylacylamino group, ureide group, N'-alkylureide group, N',N'-dialkylureide group, N'-arylureide group, N',N'-diarylureide group, N'-alkyl-N'-arylureide group, N-alkylureide group, N-arylureide group, N'-alkyl-N-alkylureide group, N'-alkyl-N-arylureide group, N',N'-dialkyl-N-alkylureide group, N',N'-dialkyl-N-arylureide group, N'-aryl-N-alkylureide group, N'-aryl-N-arylureide group, N',N'-diaryl-N-alkylureide group, N',N'-diaryl-N-arylureide group, N'-alkyl-N'-aryl-N-alkylureide group, N'-alkyl-N'-aryl-N-arylureide group, alkoxycarbonylamino group, aryloxycarbonylamino group, N-alkyl-N-alkoxycarbonylamino group, N-alkyl-N-aryloxycarbonylamino group, N-aryl-N-alkoxycarbonylamino group, N-aryl-N-aryloxycarbonylamino group, formyl group, acyl group, carboxyl group and conjugate base group thereof (hereinafter, referred to as carboxylate), alkoxycarbonyl group, aryloxycarbonyl group, carbamoyl group, N-alkylcarbamoyl group, N,N-dialkylcarbamoyl group, N-arylcarbamoyl group, N,N-diarylcarbamoyl group, N-alkyl-N-arylcarbamoyl group, alkylsulfinyl group, aryl-sulfinyl group, alkylsulfonyl group, arylsulfonyl group, sulfo group (—$SO_3H$) and conjugate base group thereof (hereinafter referred to as sulfonate), alkoxysulfonyl group, aryloxysulfonyl group, sulfinamoyl group, N-alkylsulfinamoyl group, N,N-dialkylsulfinamoyl group, N-arylsulfinamoyl group, N,N-diarylsulfinamoyl group, N-alkyl-N-arylsulfinamoyl group, sulfamoyl group, N-alkylsulfamoyl group, N,N-dialkylsulfamoyl group, N-arylsulfamoyl group, N,N-diarylsulfamoyl group, N-alkyl-N-arylsulfamoyl group, N-acylsulfamoyl group and conjugate base group thereof, N-alkylsulfonylsulfamoyl group (—$SO_2NHSO_2$(alkyl)) and conjugate base group thereof, N-arylsulfonylsulfamoyl group (—$SO_2NHSO_2$(aryl)) and conjugate base group thereof, N-alkylsulfonylcarbamoyl(—$CONHSO_2$(alkyl)) and conjugate base group thereof, N-arylsulfonylcarbamoyl group (—$CONHSO_2$(aryl)) and conjugate base group thereof, alkoxysilyl group (—$Si(Oalkyl)_3$), aryloxysilyl group (—$Si(Oaryl)_3$), hydroxysilyl group (—$Si(OH)_3$) and conjugate base group thereof, phosphono group (—$PO_3H_2$) and conjugate base group thereof (hereinafter referred to as phosphonate group), dialkylphosphono group (—$PO_3(alkyl)_3$), diarylphosphono group (—$PO_3(aryl)_2$), alkylarylphosphono group (—$PO_3$(alkyl)(aryl)), monoalkylphosphono group (—$PO_3H$(alkyl)) and conjugate base group thereof (hereinafter referred to as alkylphosphonate group), monoarylphosphono group (—$PO_3H$(aryl)) and conjugate base group thereof (hereinafeter referred to as arylphosphonate group), phosphonooxy group(—$OPO_3H_2$) and conjugate base group thereof (hereinafter referred to as phosphonateoxy group), dialkylphosphonooxy group (—$OPO_3$(alkyl)$_2$), diarylphosphonooxy group (—$OPO_3$(aryl)$_2$), alkylarylphosphonoxy group (—$OPO_3$(alkyl)(aryl)), monoalkylphosphonooxy group (—$OPO_3H$(alkyl)) and conjugate base group thereof (hereinafter referred to as alkylphosphonateoxy group), monoarylphosphonooxy group (—$OPO_3H$(aryl)) and conjugate base group thereof (hereinafter referred to as arylphosphonateoxy group), cyano group, nitro group, aryl group, alkenyl group and alkynyl group.

Examples of the alkyl groups in these substituent groups include a straight chain, a branched chain or a cyclic alkyl group having 1 to 20 carbon atoms. Specific examples thereof include a methyl group, ethyl group, propyl group, butyl group, pentyl group, hexyl group, heptyl group, octyl group, nonyl group, decyl group, undecyl group, dodecyl group, tridecyl group, hexadecyl group, octadecyl group, eicosyl group, isopropyl group, isobutyl group, s-butyl group, t-butyl group, isopentyl group, neopentyl group, 1-methylbutyl group, isohexyl group, 2-ethylhexyl group, 2-methylhexyl group, cyclohexyl group, cyclopentyl group, and 2-norbornyl group. Among these, alkyl groups of straight chain having 1 to 12 carbon atoms, side chain having 3 to 12 carbon atoms, and ring having 5 to 10 carbon atoms are more preferable.

Specific examples of the aryl groups include a phenyl group, bi phenyl group, naphthyl group, tolyl group, xylyl group, mesityl group, cumenyl group, fluorophenyl group, chlorophenyl group, bromophenyl group, chloromethylphenyl group, hydroxyphenyl group, methoxyphenyl group, ethoxyphenyl group, phenoxyphenyl group, acetoxyphenyl group, benzoyloxyphenyl group, methylthiophenyl group, phenylthiophenyl group, methylaminophenyl group, dimethylaminophenyl group, acetylaminophenyl group, carboxyphenyl group, methoxycarbonylphenyl group, ethoxycarbonylphenyl group, phenoxycarbonylphenyl group, N-phenylcarbamoylphenyl group, ethorophenyl group, cyanophenyl group, sulfophenyl group, sulfonatephenyl group, phosphonophenyl group and phosphonatephenyl group.

Furthermore, examples of alkenyl groups include a vinyl group, 1-propenyl group, 1-butenyl group, cinnamyl group, and 2-chloro-1-ethenyl group. Examples of alkynyl groups include ethynyl group, 1-propynyl group, 1-butynyl group, trimethylsilylethynyl group and phenylethynyl group.

Examples of the above-mentioned acyl groups ($R^4CO$—) include those in which $R^4$ represents one of a hydrogen atom, the above-mentioned alkyl group, aryl group, alkenyl group, and alkynyl group.

On the other hand, examples of the alkylene groups in substituted alkyl groups include those in which any one of hydrogen atoms on the alkyl group having 1 to 20 carbon atoms is removed and thereby a divalent organic residue is formed. Preferable examples include alkylene groups of straight chains having 1 to 12 carbon atoms, side chains having 3 to 12 carbon atoms and rings having 5 to 10 carbon atoms. Specific examples of substituted alkyl groups include a chloromethyl group, bromomethyl group, 2-chloroethyl group, trifluoromethyl group, methoxymethyl group, methoxyethoxyethyl group, allyloxymethyl group, phenoxymethyl group, methylthiomethyl group, tolylthiomethyl group, ethylaminoethyl group, diethylaminopropyl group, morpholinopropyl group, acetyloxymethyl group, benzoyloxymethyl group, N-cyclohexylcarbamoyloxyethyl group, N-phenylcarbamoyloxyethyl group, acetylaminoethyl group, N-methylbenzoylaminopropyl group, 2-oxoethyl group, 2-oxopropyl group, carboxypropyl group, methoxycarbonylethyl group, methoxycarbonylmethyl group, methoxycarbonylbutyl group, ethoxycarbonylmethyl group, buthoxycarbonylmethyl group, allyloxycarbonylmethyl group, benziloxycarbonylmethyl group, methoxycarbonylphenylmethyl group, trichloromethylcarbonylmethyl group, allyloxycarbonylbutyl group, chlorophenoxycarbonylmethyl group, carbamoylmethyl group, N-methylcarbamoylethyl group, N,N-dipropylcarbamoylmethyl group, N-(methoxyphenyl)carbamoylethyl group, N-methyl-N-(sulfophenyl)carbamoylmethyl group, sulfopropyl group, sulfobutyl group, sulfonatebutyl group, sulfamoylbutyl group, N-ethylsulfamoylmethyl group, N,N-dipropylsulfamoylpropyl group, N-trisulfamoylpropyl group, N-methyl-N-(phosphnophenyl) sukfamoyloctyl group, the following functional groups,

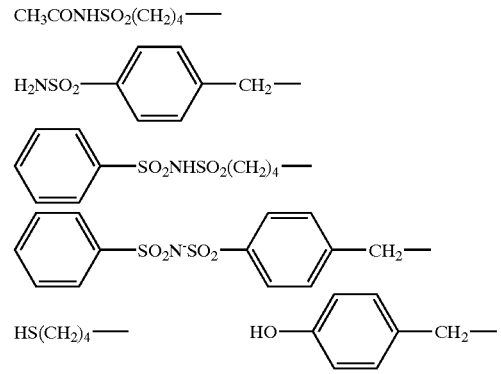

and, phosphonobutyl group, phosphonatehexyl group, diethylphosphonobutyl group, diphenylphosphonopropyl group, methylphosphonobutyl group, methylphosphonatebutyl group, tolylphosphonohexyl group, tolylphosphonatehexyl group, phosphonoxypropyl group, phosphonateoxybutyl group, benzil group, phenetyl group, α-methylbenzil group, 1-methyl-1-phenylethyl group, p-methylbenzil group, cinnamyl group, allyl group, 1-propenylmethyl group, 2-butenyl group, 2-methylallyl group, 2-methylpropenylmethyl group, 2-propynyl group, 2-butynyl group and 3-butynyl group.

Furthermore, examples of substituent groups that can be introduced include the alkyl groups, substituted alkyl groups and those shown as the substituent groups in the substituted-alkyl groups. Preferable specific examples of the substituted aryl groups include a biphenyl group, tolyl group, xylyl group, mesityl group, cumenyl group, chlorophenyl group, bromophenyl group, fluorophenyl group, chloromethylphenyl group, trifluoromethylphenyl group, hydroxyphenyl group, methoxyphenyl group, methoxyethoxyphenyl group, allyloxyphenyl group, phenoxyphenyl group, methylthiophenyl group, tolylthiophenyl group, phenylthiophenyl group, ethylaminophenyl group, diethylaminophenyl group, morpholinophenyl group, acetyloxyphenyl group, benzoyloxyphenyl group, N-cyclohexylcarbamoyloxyphenyl group, N-phenylcarbamoyloxyphenyl group, acetylaminophenyl group, N-methylbenzoylaminophenyl group, carboxyphenyl group, methoxycarbonylphenyl group, allyloxycarbonylphenyl group, chlorophenoxycarbonylphenyl group, carbamoylphenyl group, N-methylcarbamoylphenyl group, N,N-dipropylcarbamoylphenyl group, N-(methoxyphenyl)carbamoylphenyl group, N-methyl-N-(sulfophenyl)carbamoylphenyl group, sulfophenyl group, sulfonatephenyl group, sulfamoylphenyl group, N-ethylsulfamoylphenyl group, N,N-dipropylsulfamoylphenyl group, N-tolylsulfamoylphenyl group, N-methyl-N-(phosphonophenyl)sulfamoylphenyl group, phosphonophenyl group, phosphonatephenyl group, diethylphosphonophenyl group, diphenylphosphonophenyl group, methylphosphonophenyl group, methylphosphonatephenyl group, tolylphosphonophenyl group, tolylphosphonatephenyl group, allyl group, 1-propenylmethyl group, 2-butenyl group, 2-methylallylphenyl group, 2-methylpropenylphenyl group, 2-propylphenyl group, 2-butynylphenyl group, and 3-butynylphenyl group.

In general formula (I), Q represents a hydrocarbon linking group or a hetero ring, which may have a substituent group. Q has a function of linking the polymerizable group X and the alkali-soluble group A with a predetermined positional relationship so as to form a side chain structure represented by general formula (I). Q may be either a cyclic structure or a branched chain structure. The hydrocarbon linking group preferably has a cyclic structure. Examples of the cyclic structure include an aromatic ring that may have a substituent group, a cyclohydrocarbon ring that may have a substituent group, and a heterocycle that may have a substituent group.

As mentioned above, it is important that the polymerizable group and the alkali-soluble group are both present while maintaining a fixed mutual positional relationship. When Q is a hydrocarbon linking group having a ring structure, the movement of the polymerizable group in an exposed area is restricted, and thus deterioration of the film property can be effectively suppressed. From a similar viewpoint, when Q does not contain a ring structure, the number of atoms from a terminal carbon atom of the unsaturated double bond of the polymerizable group X to a dissociating hydrogen atom of the acid group A is preferably 14 or less, and more preferably 10 or less. As the number of atoms between the polymerizable group and the alkali-soluble group becomes smaller, that is, as the polymerizable group and the alkali-soluble group are disposed closer to each other, the stability improving effect due to the mutual interaction therebetween becomes more prominent. When the number of atoms is 15 or more, as the distance between the polymerizable group and the alkali-soluble group becomes larger, the stabilizing effect caused by their mutual interaction when they exist in proximity becomes smaller.

In the invention, the aromatic ring means an aryl linking group (a polyvalent linking group in which hydrogen atoms are removed from an aryl group in accordance with valence). Examples of the aryl group include those having 1 to 3 benzene rings forming a condensed ring, and those having a benzene ring and a 5-membered unsaturated ring forming a condensed ring. Specific examples thereof include a phenyl group, naphthyl group, anthryl group, phenanthryl group, indenyl group, acenabutenyl group, and fluorenyl group. Among these, phenyl group and naphthyl group are preferable.

As the cyclohydrocarbons, cyclic alkyl groups having 5 to 20 carbon atoms are preferable, and cyclic alkyl groups having 5 to 10 carbon atoms are more preferable. Specific examples include cyclobutyl, cyclopentyl and cyclohexyl.

Furthermore, examples of the hetero ring include 5 or more membered heterocyclic groups containing at least one of N, S and O, preferably 5 to 7 membered heterocyclic groups. The heterocyclic groups may contain a condensed group.

These hydrocarbon linking groups having the ring structure may have a substituent group. Examples of the substituent group include those raised as preferable substituent groups of the substituted aryl groups.

In general formula (I), $P^1$ to $P^5$ each independently represent a single bond, or a linking group constituted by a hydrogen atom, a nitrogen atom, an oxygen atom, a sulfur atom, and a carbonyl group (>C=O). Preferable examples include —NHCO—, —CO$_2$—, —SO$_3$—, —NHSO$_2$—, —N<, —O—, and —S—.

Preferable embodiments of the structures represented by general formula (I) preferable for the specific polymerizable polymers according to the invention will be shown below; however, the invention should not be construed to be limited thereto. (A-1) to (A-43) are those having an aromatic ring as a linking group in the structure represented by general formula (I).

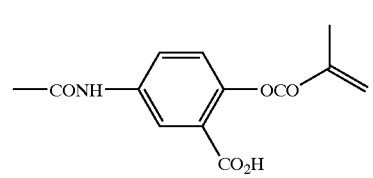

A-1

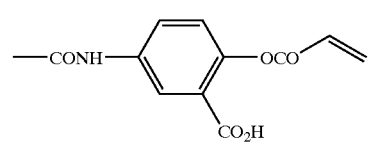

A-2

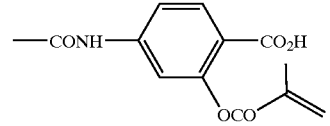

A-3

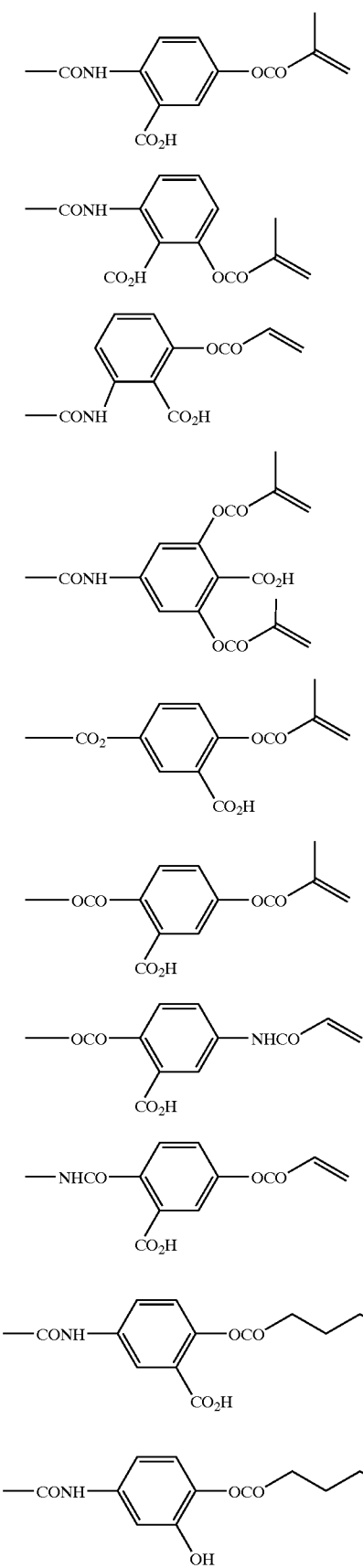
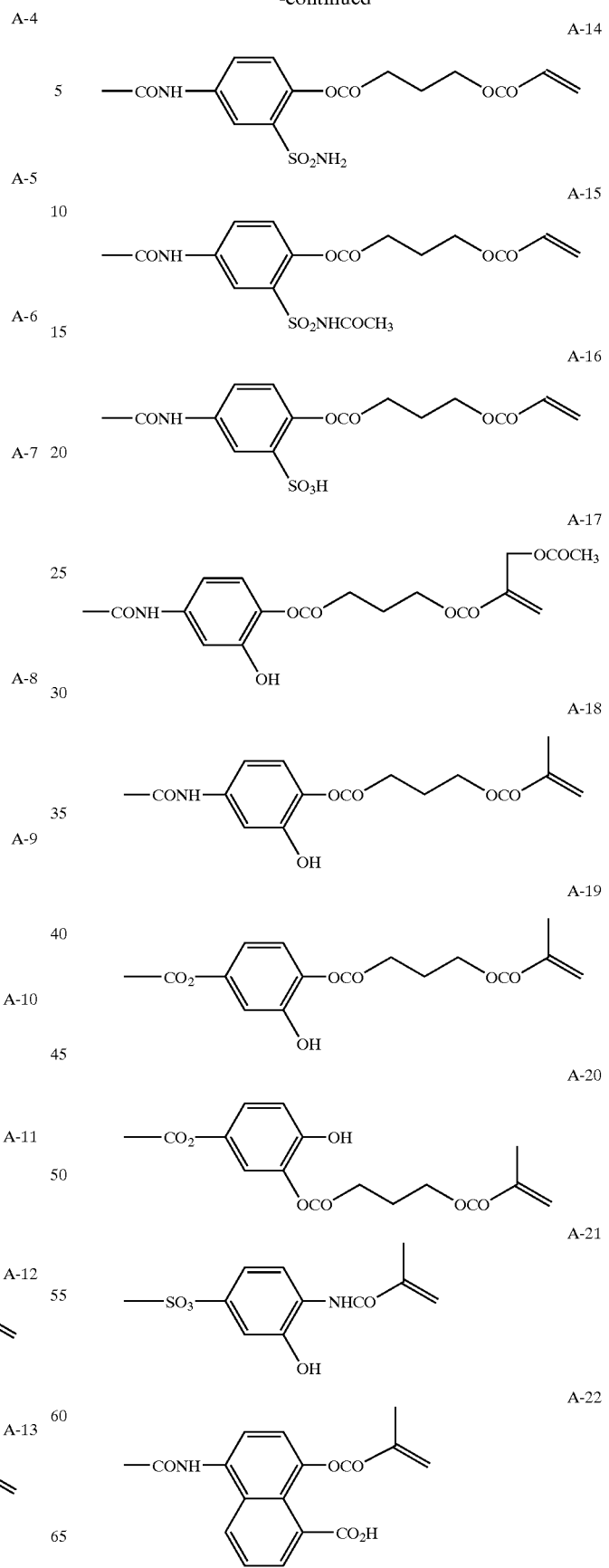

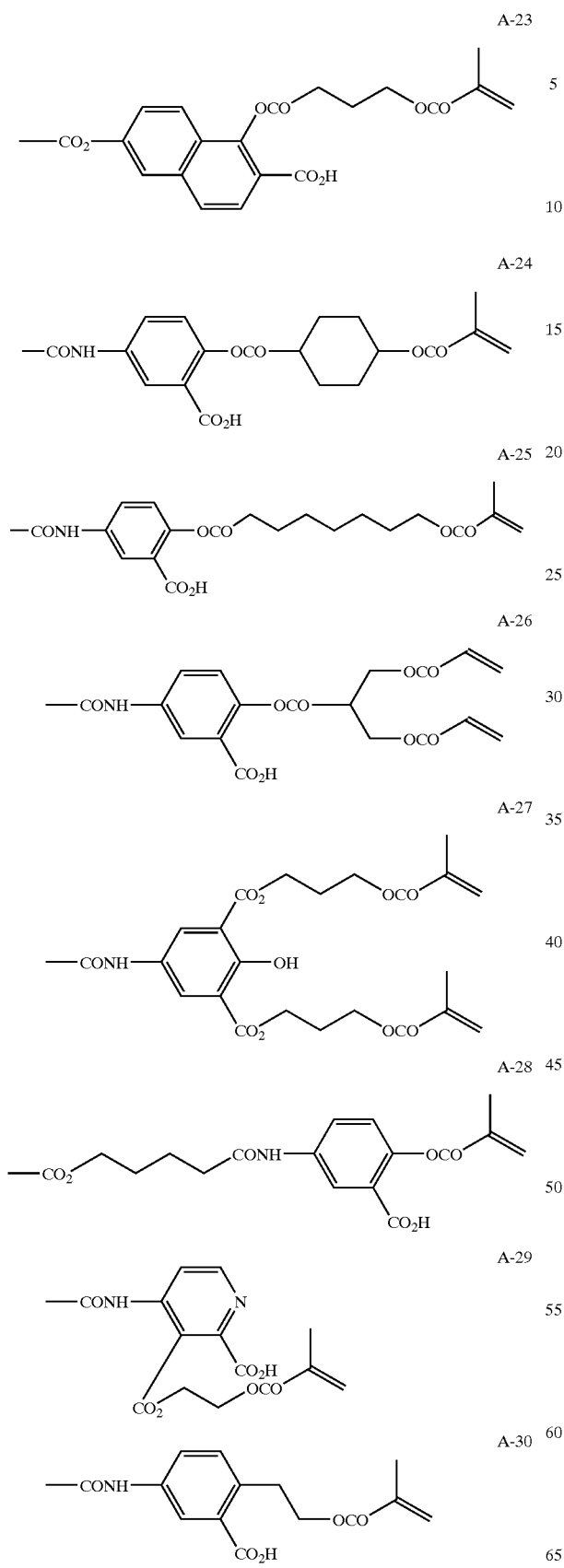
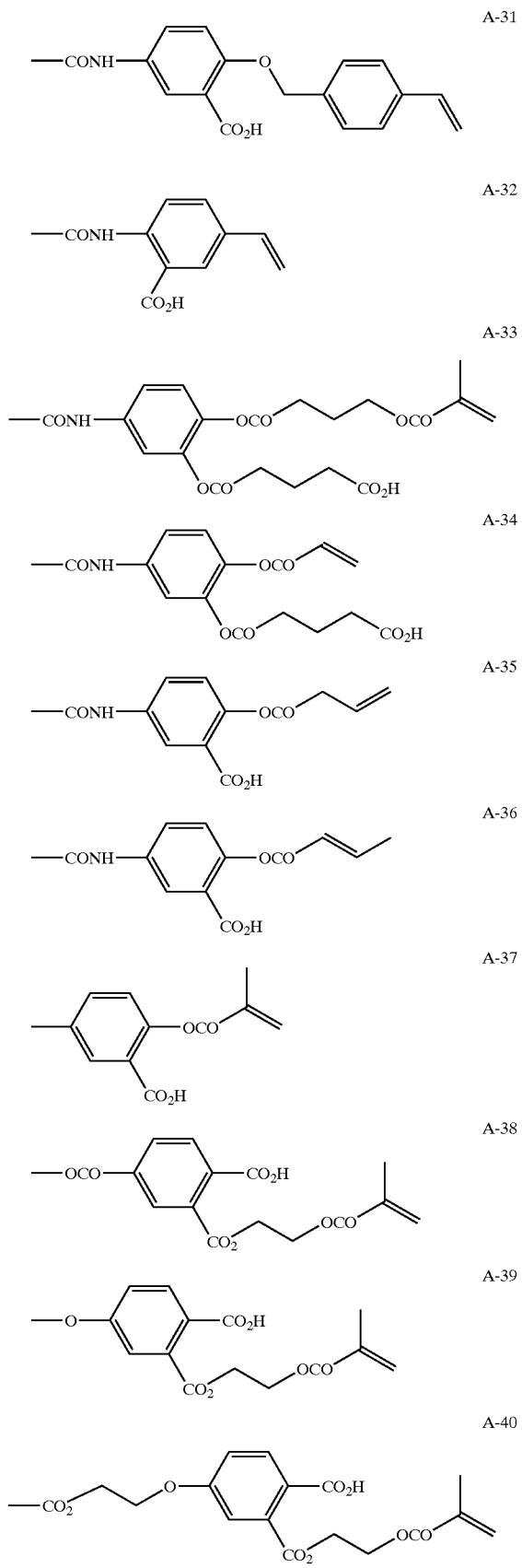

A-41 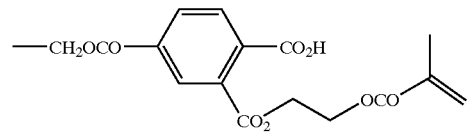
A-42 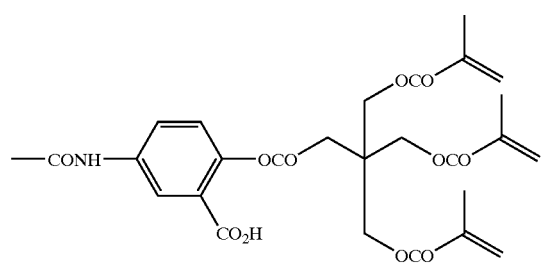
A-43 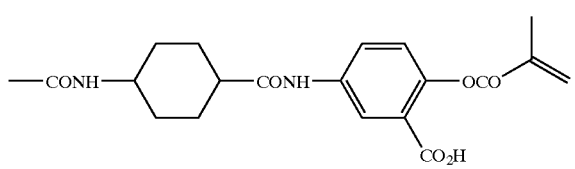
Examples (B-1) to (B-17) shown below are those having a cyclohydrocarbon ring (saturated hydrocarbon ring) as a linking group in the structure according to general formula (I).
B-1 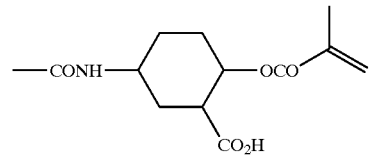
B-2 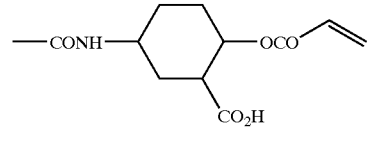
B-3 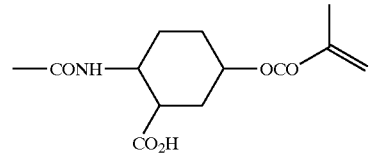
B-4 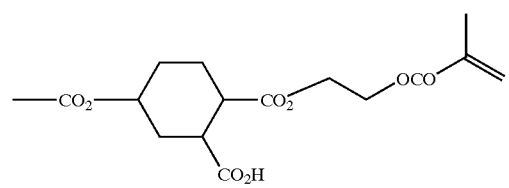
B-5 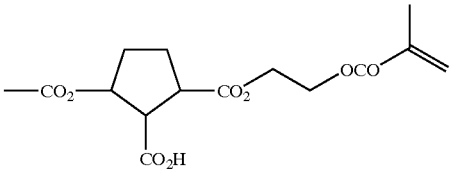
B-6 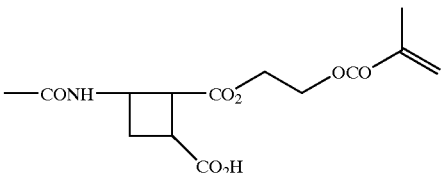
B-7 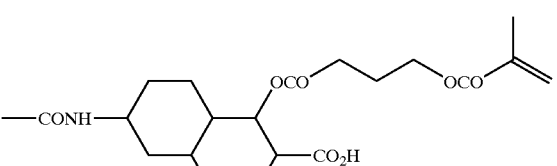
B-8 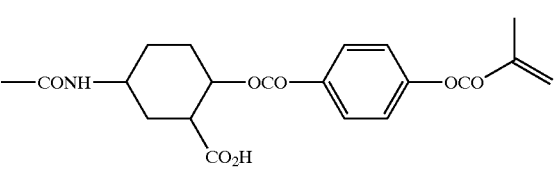
B-9 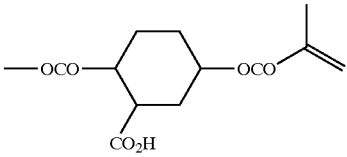
B-10 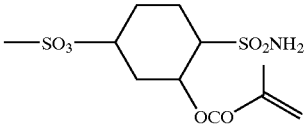
B-12 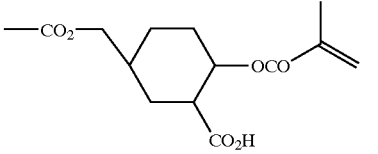
B-13 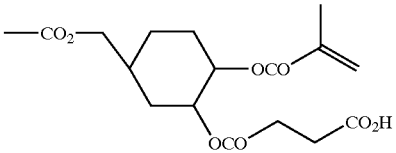

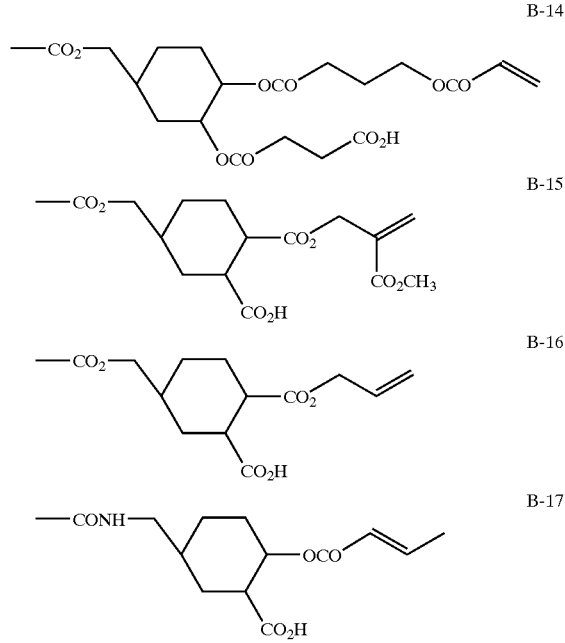

Specific examples (C-1) to (C-12) shown below are examples of one that has a heterocycle as a linking group in the structure according to general formula (I).

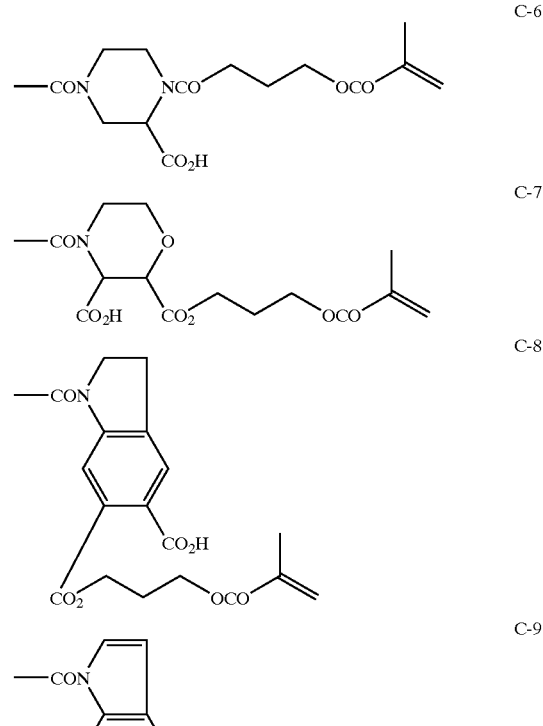

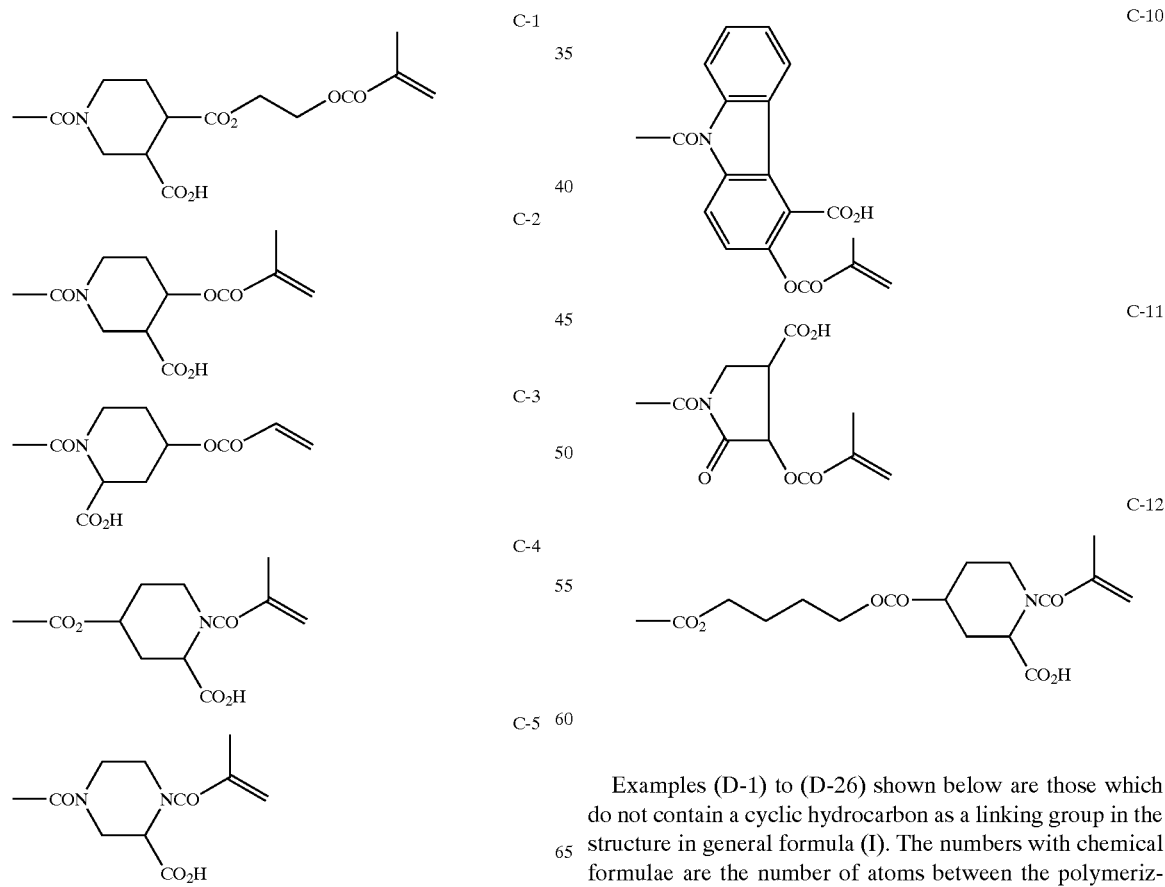

Examples (D-1) to (D-26) shown below are those which do not contain a cyclic hydrocarbon as a linking group in the structure in general formula (I). The numbers with chemical formulae are the number of atoms between the polymerizable group X and the alkali-soluble group (acid group) A.

|  | | Number of atoms from polymerizing group to acid group |
|---|---|---|
| D-1 | 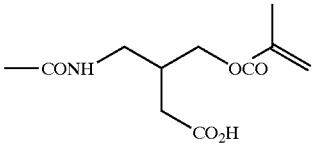 | 10 |
| D-2 | 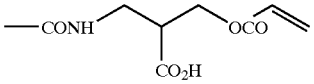 | 9 |
| D-3 | 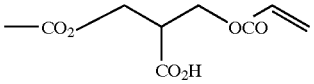 | 9 |
| D-4 | 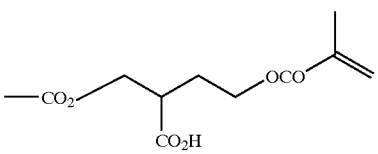 | 10 |
| D-5 | 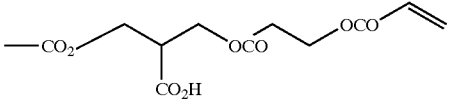 | 12 |
| D-6 | 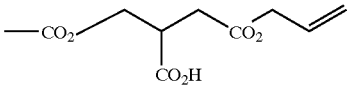 | 10 |
| D-7 | 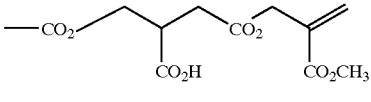 | 10 |
| D-8 | 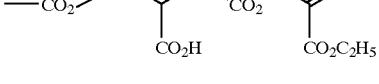 | 10 |
| D-9 | 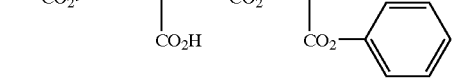 | 10 |
| D-10 | 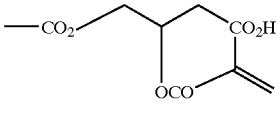 | 9 |
| D-11 |  | 9 |
| D-12 | 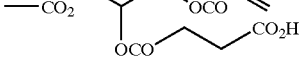 | 13 |

-continued

| | | Number of atoms from polymerizing group to acid group |
|---|---|---|
| D-13 | ![structure] | 13 |
| D-14 | ![structure] | 10 |
| D-15 | ![structure] | 14 |
| D-16 | ![structure] | 8 |
| D-17 | ![structure] | 8 |
| D-18 | ![structure] | 8 |
| D-19 | ![structure] | 14 |
| D-20 | ![structure] | 15 |
| D-21 | ![structure] | 17 |
| D-22 | ![structure] | 21 |
| D-23 | ![structure] | 8 |

-continued

| | | Number of atoms from polymerizing group to acid group |
|---|---|---|
| D-24 | 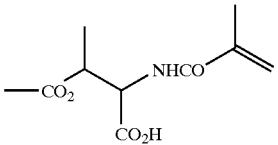 | 8 |
| D-25 | 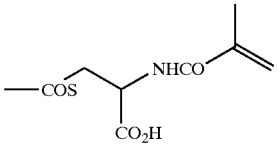 | 8 |
| D-26 | 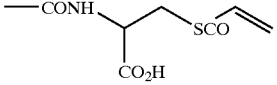 | 9 |

A content of the structure according to general formula (I) in the specific polymerizable polymer according to the invention is, per gram of the polymer, preferably in a range of 0.1 to 10.0 mmol, more preferably 0.5 to 7.0 mmol, and most preferably 0.7 to 5.0 mmol. When the content is less than 0.1 mmol, the effect according to the invention may not be sufficiently obtained; on the other hand, when the content exceeds 10.0 mmol, the synthesis thereof is difficult.

In the specific polymerizable polymer, other than the alkali-soluble group and a constituent unit having a structure of general formula (I), as far as the effect of the invention is not damaged, with an intention of improving the film property, other constituent units may be copolymerized.

Examples of other constituent units that can be used together include the constituent units having the polymerizable group X, the constituent units having the alkali-soluble group, and generally used constituent units having the film formability. Examples thereof include the constituent units derived from known monomers such as acrylic acid esters, methacrylic acid esters, acrylamides, methacrylamides, vinylesters, styrenes, acrylic acid, methacrylic acid, acrylonitrile, maleic anhydride, and maleic acid imide.

Examples of the acrylic acid esters include such as methyl acrylate, ethyl acrylate, (n- or i-)propyl acrylate, (n-, i-, sec- or t-)butyl acrylate, amyl acrylate, 2-ethylhexyl acrylate, dodecyl acrylate, chloroethyl acrylate, 2-hydroxyethyl acrylate, 2-hydroxypropyl acrylate, 5-hydroxypentyl acrylate, cyclohexyl acrylate, allyl acrylate, trimethylolpropane monoacrylate, pentaerythritol monoacrylate, glycidyl acrylate, benzyl acrylate, methoxybenzyl acrylate, chlorobenzyl acrylate, 2-(p-hydroxyphenyl)ethyl acrylate, furfuryl acrylate, tetrahydrofurfuryl acrylate, phenyl acrylate, chlorophenyl acrylate, and sulfamoylphenyl acrylate.

Examples of the methacrylic acid esters include such as methyl methacrylate, ethyl methacrylate, (n, or i-)propyl methacrylate, (n, i-, sec- or t-)butyl methacrylate, amyl methacrylate, 2-ethylhexyl methacrylate, dodecyl methacrylate, chloroethyl methacrylate, 2-hydroxyethyl methacrylate, 2-hydroxypropyl methacrylate, 5-hydroxypentyl methacrylate, cyclohexyl methacrylate, allyl methacrylate, trimethylolpropane monomethacrylate, pentaerythritol monomethacrylate, glycidyl methacrylate, methoxybenzyl methacrylate, chlorobenzyl methacrylate, 2-(p-hydroxyphenyl)ethyl methacrylate, furfuryl methacrylate, tetrahydrofurfuryl methacrylate, phenyl methacrylate, chlorophenyl methacrylate, and sulfamoylphenyl methacrylate.

Examples of the acrylamide include such as acrylamide, N-methylacrylamide, N-ethylacrylamide, N-propylacrylamide, N-butylacrylamide, N-benzylacrylamide, N-hydroxyethylacrylamide, N-phenylacrylamide, N-tolylacrylamide, N-(p-hydroxyphenyl)acrylamide, N-(sulfamoylphenyl) acrylamide, N-(phenylsulfonyl)acrylamide, N-(tolylsulfonyl)acrylamide, N,N-dimethylacrylamide, N-methyl-N-phenylacrylamide, and N-hydroxyethyl-N-methylacrylamide.

Examples of the methacryamides include such as methacrylamide, N-methylmethacrylamide, N-ethylmethacrylamide, N-propylmethacrylamide, N-butylmethacrylamide, N-benzylmethacrylamide, N-hydroxyethylmethacrylamide, N-phenylmethacrylamide, N-tolylmethacrylamide, N-(p-hydroxyphenyl) methacrylamide, N-(sulfamoylphenyl)methacrylamide, N-(phenylsulfonyl)methacrylamide, N-(tolylsulfonyl) methacrylamide, N,N-dimethylmethacrylamide, N-methyl-N-phenylmethacrylamide, and N-hydroxyethyl-N-methylmethacrylamide.

Examples of the vinylesters include such as vinyl acetate, vinyl butyrate and vinyl benzoate.

Examples of styrenes include such as styrene, methylstyrene, dimethylstyrene, trimethylstyrene, ethylstyrene, propylstyrene, cyclohexylstyrene, chloromethylstyrene, trifluoromethylstyrene, ethoxymethylstyrene, acetoxymethylstyrene, methoxystyrene, dimethoxystyrene, chlorostyrene, dichlorostyrene, bromostyrene, iodostyrene, fluorostyrene, and carboxystyrene.

Among these monomers, the acrylic acid esters, methacrylic acid esters, acrylamides, methacrylamides, vinylesters, styrenes, acrylic acids, methacrylic acids and acrylonitriles all having 20 or less carbon atoms are preferable.

Examples of methods for polymerizing these constituent units include known methods such as graft copolymerization method, block copolymerization method, random polymerization method and so on.

A weight average molecular weight of the polymer according to the invention is preferably in a range of 3,000 to 500,000, more preferably 20,000 to 300,000, and most preferably 50,000 to 200,000. When the molecular weight is smaller than 3,000, the film property deteriorates and improvement of press life is insufficient. On the other hand, when the molecular weight exceeds 500,000, the polymer is difficult to be dissolved in a coating solvent, the handling property such as the coating property deteriorates and a uniform coating becomes difficult to obtain.

Furthermore, the glass transition temperature (Tg) of the specific polymerizable polymer is preferably in a range of 70 to 300° C., more preferably 80 to 250° C., and most preferably 90 to 200° C. When the polymer whose Tg is less than 70° C. is used, storage stability deteriorates and press life also tends to deteriorate. In the polymer whose Tg is 300° C. or more, since the mobility of the radicals in the coating decreases and curing reaction does not proceed sufficiently, there is concern of the sensitivity loss.

The specific polymerizable polymer according to the invention, in order to achieve the above range of the glass transition temperature, is preferable to include an amide group and an imide group, in particular, methacrylamide and a derivative of methacrylimide in a molecule.

In the following, structures of the specific polymerizable polymers [(P-1) to (P-34)] preferable in the invention are shown together with the weight average molecular weights thereof; however, the invention is not limited thereto.

P-1

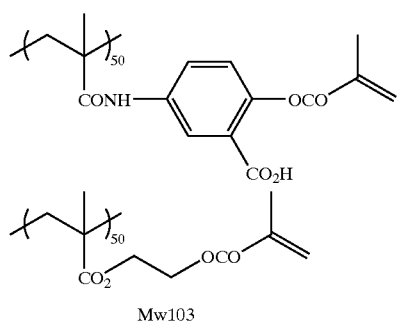

Mw103

P-2

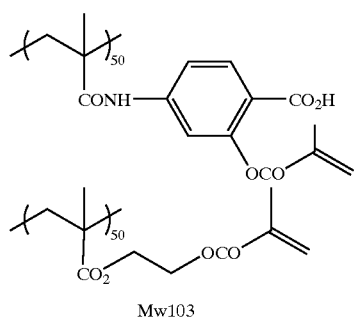

Mw103

P-3

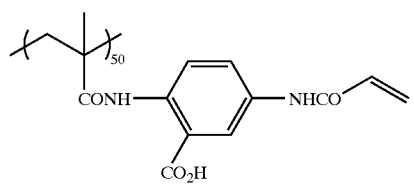

P-4

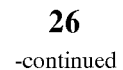

Mw103

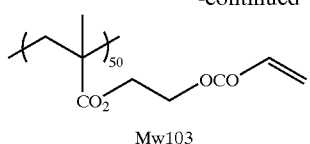

Mw53

P-5

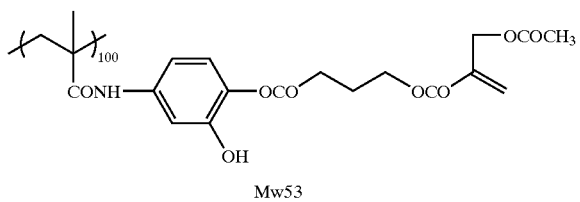

Mw53

P-6

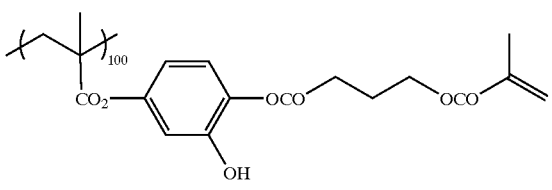

Mw53

P-7

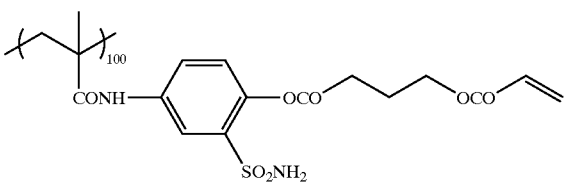

Mw63

P-8

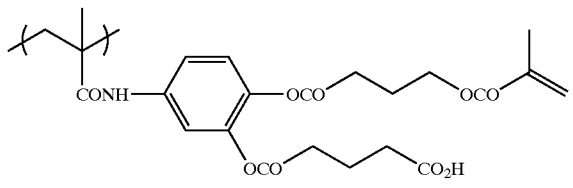

Mw83

P-9

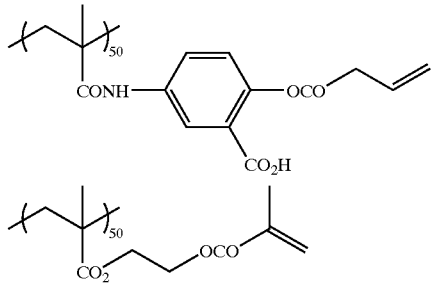

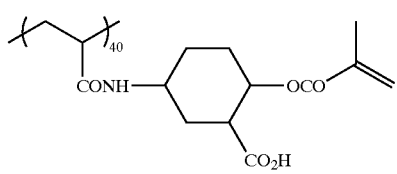

-continued
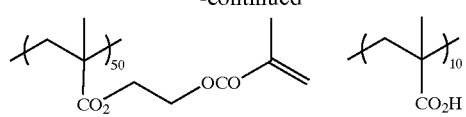
Mw103
P-10
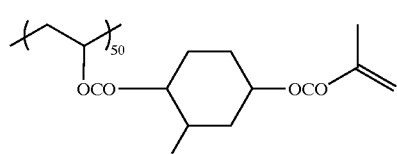
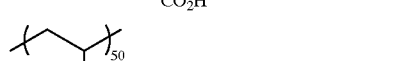
Mw53
P-11
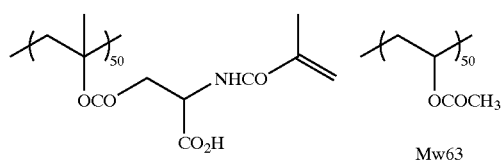
Mw63
P-12
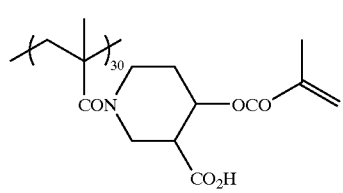
Mw63
P-13
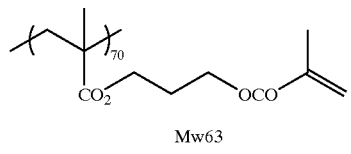
Mw63
P-14
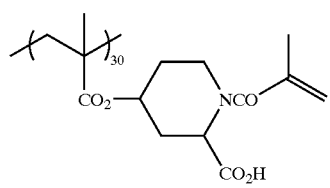
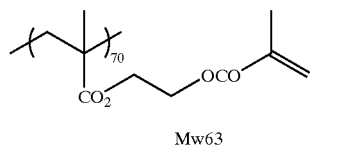
Mw103
-continued
P-15
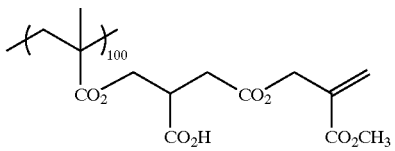
Mw73
P-16
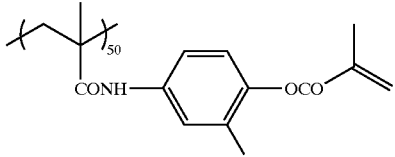
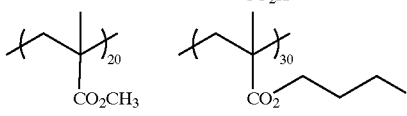
Mw103
P-17
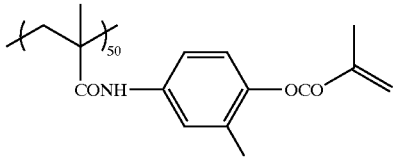
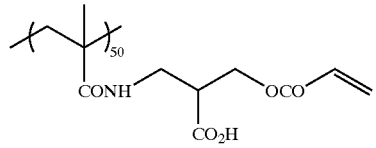
Mw103
P-18
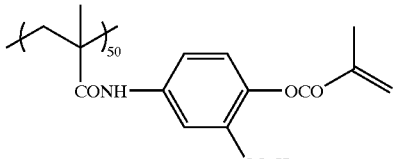
P-19
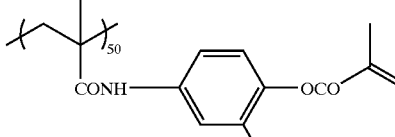
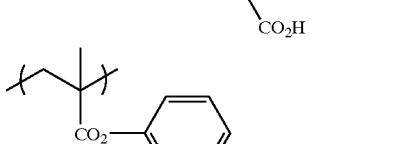
Mw103

-continued
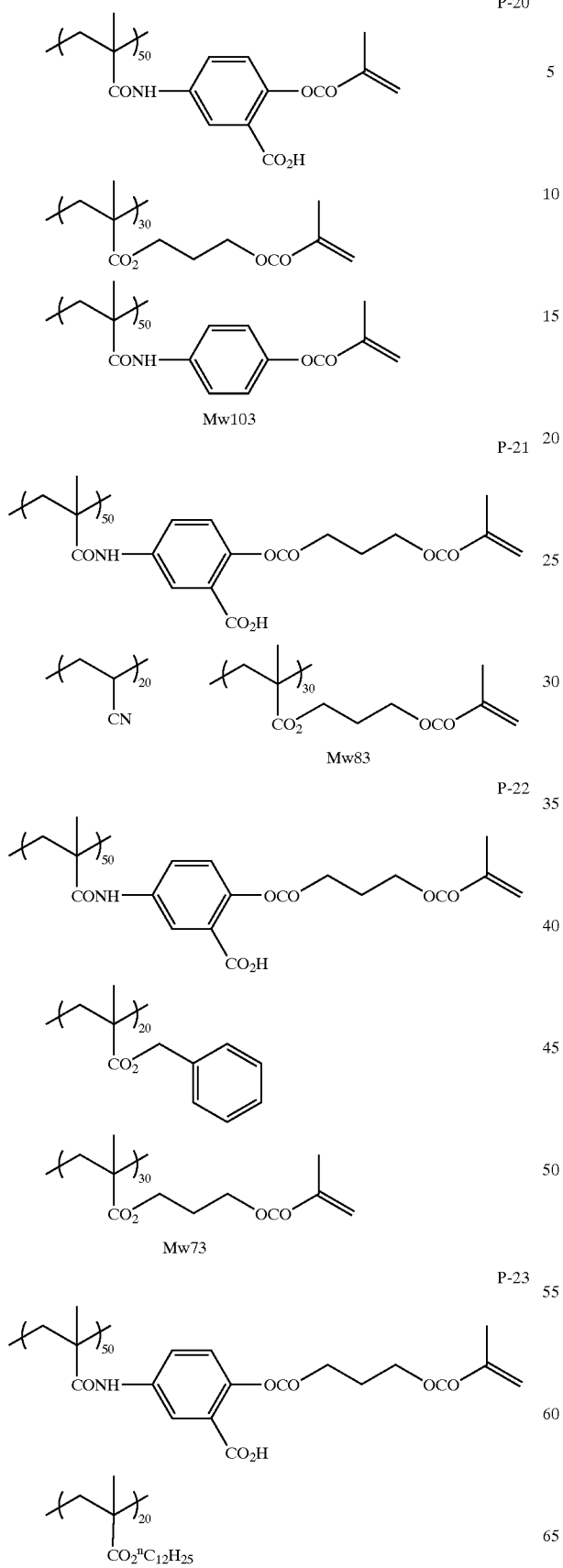
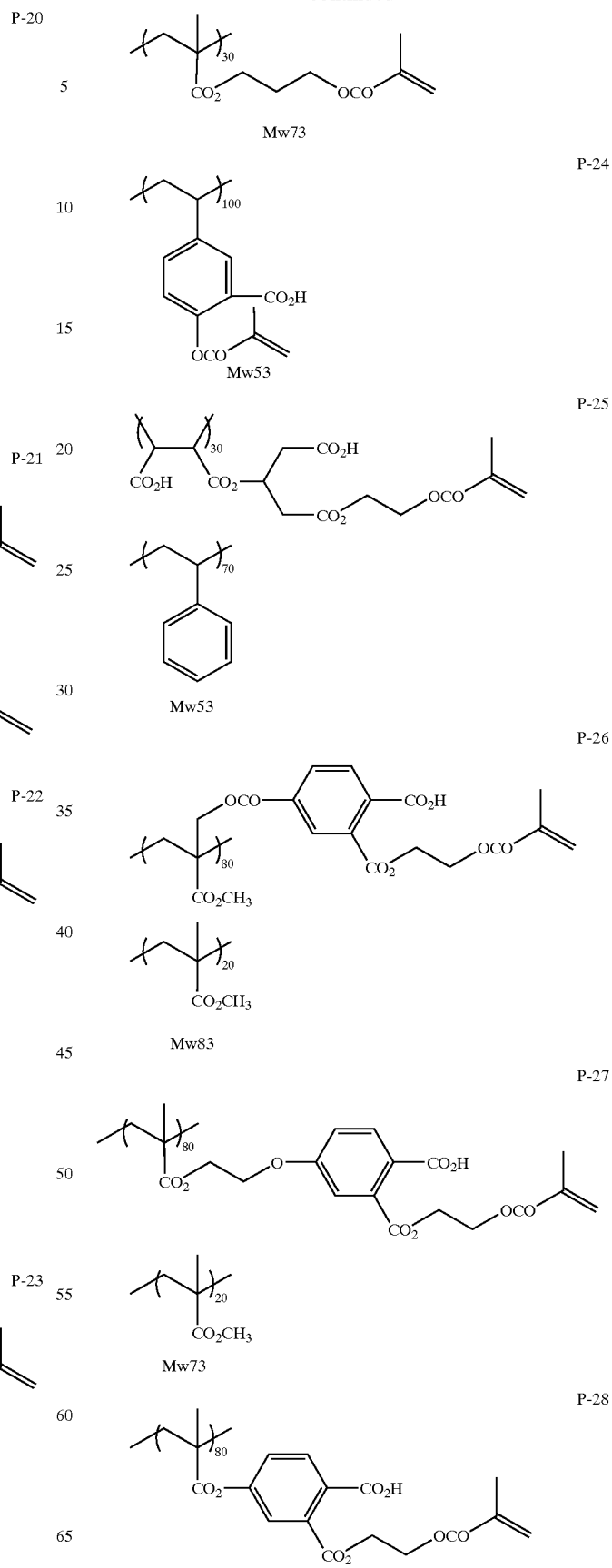

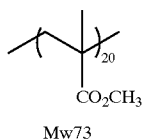

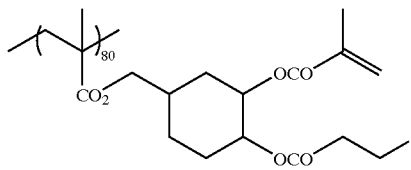

P-29

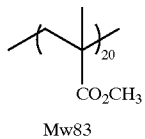

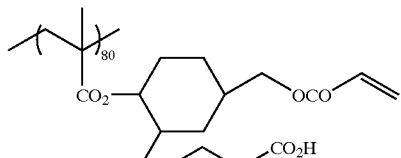

P-30

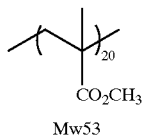

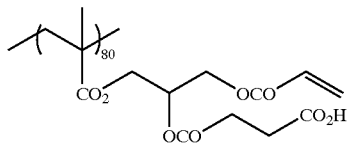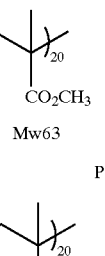

P-31

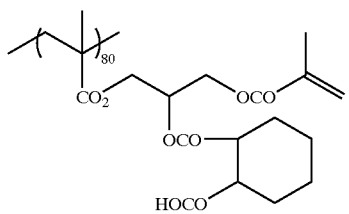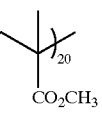

P-32

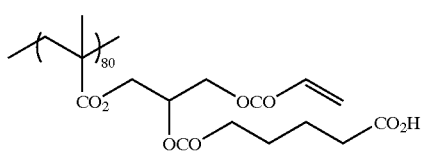

P-33

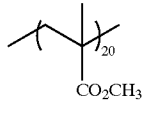

Mw63

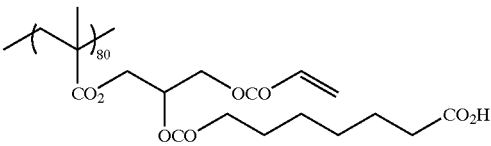

P-34

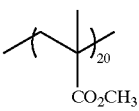

Mw63

The specific polymerizable polymer according to the invention can be easily obtained by copolymerizing an existing monomer and a monomer having the structure represented by general formula (I), or by introducing through a polymer reaction the structure represented by general formula (I) into an existing polymer.

The specific polymerizable polymers according to the invention may be used singly or in combination of two or more kinds. A content of the polymer is preferably in a range of 5 to 100% by mass based on an weight of a total solid component of the photo- or thermo-polymerizable composition. More preferably, it is in a range of 20 to 75% by mass, and most preferably 40 to 75% by mass. When the content is 5% by mass or less, it is difficult to obtain an excellent coating.

<Polymerizing Crosslinking Agent Having a Molecular Weight of 1,000 to 10,000>

The photo- or thermo-polymerizable composition according to the invention preferably further contains a polymerizable crosslinking agent having a molecular weight of 1,000 to 10,000. Such polymerizable crosslinking agent is a compound that has two or more radical polymerizable groups in a molecule and a molecular weight of 1,000 to 10,000. The polymerizable crosslinking agent may be separate one and a mixture thereof or oligomer. In the case of the oligomer, the molecular weight denotes a number average molecular weight; namely, it is a compound that has a number average molecular weight of 1,500 to 10,000.

As far as the polymerizable group is a radical polymerizable functional group, there is no particular limitation. Preferable examples include α-alkylacryl group [—OC(=O)—C(—$C_nH_{2n+1}$)=$CH_2$, (n=from 2 to 12)], α-substituted methylacryl group [—OC(=O)—C(—$CH_2Z$)=$CH_2$, (Z=a hydrocarbon group starting from a hetero atom)], acryl group, methacryl group, allyl group, styryl group, vinyl group, crotonyl group, isoctotonyl group, and itaconyl group. Among these, acryl group, methacryl group, and allyl group are particularly preferable.

The polymerizable crosslinking agents used in the invention more preferably contain a ring structure in a molecule. Examples of the ring structure include an aromatic ring, heteroaromatic ring, and heterocycle. Particularly preferable examples include those having the cyclic hydrocarbon groups explained as Q in general formula (I).

Furthermore, a content of the radical polymerizable group in the polymerizable crosslinking agent (a content of radical-polymerizable unsaturated double bond due to bromometry) per gram of the crosslinking agent is preferably in a range of 0.5 to 10.0 mmol, more preferably 2.0 to 8.0 mmol, and most preferably 3.0 to 6.0 mmol. When the content is less than 0.5 mmol, the curability becomes low and the sensitivity tends to decrease; on the other hand, when the content exceeds 10.0 mmol, the radical polymerizable group itself becomes unstable, and storage stability of the composition tends to decrease.

The polymerizable crosslinking agent may have an alkali-soluble group in the molecule. When the alkali-soluble group is dissolvable in an alkali developing solution whose pH is from 10 to 13, there is no particular limitation.

Preferable examples of the alkali-soluble groups include sulfonic acid, carboxylic acid, phenol, sulfonic acid amide, sulfonic acid imide, imide, hydroxamic acid, barbituric acid, thiol, phosphoric acid, phosphonic acid and others such as functional groups having an active proton whose pKa is 10 or less. Examples thereof include carboxylic acid, sulfonic acid imide, barbituric acid and phenol.

Furthermore, a content of the alkali-soluble group in the crosslinking agent (an acid value due to neutralization titration) per gram of the crosslinking agent is preferably in a range of 0.05 to 5.0 mmol, more preferably 0.1 to 3.0 mmol, and most preferably 0.2 to 1.0 mmol. When the content is less than 0.05 mmol, precipitation occurs at the development and scum tends to be generated. On the other hand, when the content exceeds 5.0 mmol, the hydrophilic property of the obtained coating becomes high and press life tends to decrease.

The polymerizable crosslinking agent preferably used in the invention is solid or waxy. The melting temperature or glass transition temperature (Tg) is preferably in a range of 40 to 300° C., more preferably 60 to 250° C., and most preferably 80 to 200° C. When it is lower than 40° C., storage stability deteriorates and press life tends to deteriorate. When it exceeds 300° C., since the mobility of the radicals decreases and the sensitivity tends to decrease.

In the following, structures of the polymerizable crosslinking agents [(Q-1) to (Q-26)] preferable in the invention are shown together with weight average molecular weights thereof; however, the invention is not limited thereto.

-continued

| | | (Mw) |
|---|---|---|
| Q-6 | chemical structure | 6,000 |
| Q-7 | chemical structure | 5,000 |
| Q-8 | chemical structure | 5,000 |
| Q-9 | chemical structure | 6,000 |
| Q-10 | chemical structure | 5,000 |
| Q-11 | chemical structure | 7,000 |
| Q-12 | chemical structure | 8,000 |
| Q-13 | chemical structure | 8,000 |
| Q-14 | chemical structure | 5,000 |

-continued

| | | (Mw) |
|---|---|---|
| Q-15 | | 5,000 |
| Q-16 | | 6,000 |
| Q-17 | | 5,000 |
| Q-18 | | 5,000 |
| Q-19 | | 5,000 |
| Q-20 | | 6,000 |
| Q-21 | | 6,000 |

-continued

| | | (Mw) |
|---|---|---|
| Q-22 | | 6,000 |
| Q-23 | | 3,000 |
| Q-24 | | 3,000 |
| Q-25 | | 3,000 |
| Q-26 | | |

A = —CO—⟨C₆H₄⟩—OCO—(CH₂)₄—OCO—CH=CH₂

An amount of the polymerizable crosslinking agent to be used is in a range of 5 to 90% by mass based on a total amount of the polymerizable composition, more preferably 20 to 75% by mass, and further preferably 40 to 75% by mass. When the amount to be added is less than 5%, since a sensitivity improvement is not sufficient, there is no advantage in using together. Furthermore, when more than 90% by mass is added, since a ratio of the polymer is lowered, the film property, storage stability, and press life tends to decrease.

<Other Components>

Various additives other than the above-mentioned components may be further added to the polymerizable compositions when necessary.

Other than the polymerizable crosslinking agent having the specific molecular weight, so far known polymerizable crosslinking agents described below, that is, compounds that have an addition polymerizable ethylenic unsaturated bond can be used together. Examples of known compounds that have an addition polymerizable ethylenic unsaturated bond include esters of a unsaturated carboxylic acid (for instance, acrylic acid, methacrylic acid, itaconic acid, crotonic acid, isocrotonic acid and maleic acid) and an aliphatic polyalcohol compound, and amides between the above unsaturated carboxylic acid and an aliphatic polyamine compound.

Specific examples of monomers of the ester between the aliphatic polyalcohol compound and the unsaturated carboxylic acid include, as acrylic acid esters, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, and a polyester acrylate oligomer.

The methacrylic acid esters include, for example, tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, and bis[p-(acryloxyethoxy)phenyl]dimethylmethane. The itaconic acid esters include, for example, ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate.

The crotonic acid esters include, for example, ethylene glycol dicrotonate, tetramethylene glycol dicrotonate, pentaerythritol dicrotonate, and sorbitol tetracrotonate. The isocrotonic acid esters include, for example, ethylene glycol diisocrotonate, pentaerythritol diisocrotonate, and sorbitol tetraisocrotonate. The maleic acid esters include, for example, ethylene glycol dimaleate, triethylene glycol dimaleate, pentaerythritol dimaleate, and sorbitol tetramaleate. Furthermore, examples thereof include mixtures of the ester monomers. Still furthermore, specific examples of a monomer of amide between an aliphatic polyamine compound and unsaturated carboxylic acid include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide and xylylene bismethacrylamide.

Other examples include vinylurethane compounds that are described in JP-B No. 48-41708 and have two or more polymerizable vinyl groups within one molecule that is obtained by adding a vinyl monomer containing a hydroxyl group represented by the following general formula (A) to a polyisocyanate compound having two or more isocyanate groups within one molecule.

CH$_2$=C(R)COOCH$_2$CH(R')OH     General Formula (A)

(Here, R and R' represent H or CH$_3$.)

Other examples also include polyfunctional acrylates and methacrylates such as urethane acrylates such as described in JP-A No. 51-37193, polyester acrylates such as described in JP-A No.48-64183 and JP-B Nos.49-43191 and 52-30490, and epoxy acrylates obtained by reacting an epoxy resin and (meth)acrylic acid. Furthermore, those introduced as photocuring monomers and oligomers in Nippon Secchaku Kyokai Shi (Journal of Japan Adhesion Society), Vol.20, No. 7, pp.300–308 (1984) can be used. In the invention, these monomers can be used in chemical forms such as prepolymer, that is, dimmer, trimer and oligomer, or mixtures thereof or copolymers thereof.

An amount of such other polymerizable crosslinking agent (monomer or oligomer type crosslinking agent) to be used is necessary to be 40% by mass or less with respect to a total amount of the polymerizable composition, preferably 30% by mass or less, and more preferably 20% by mass or less. When more than 40% by mass is compounded, the coating property, storage stability and press life deteriorate.

A polymerization initiator is preferably contained in the polymerizable composition according to the invention. Preferable examples of the polymerization initiator include (a) aromatic ketones, (b) aromatic onium salt compounds, (c) organic peroxides, (d) thio compounds, (e) hexaarylbiimidazole compounds, (f) ketoxime ester compounds, (g) borates, (h) azinium compounds, (i) metallocene compounds, (j) active ester compounds, and (k) compounds having carbon-halogen bond. Specific examples of the (a) to (k) will be described below; however, the invention should not be construed to be limited thereto.

(a) Aromatic Ketones

Examples of aromatic ketones preferably used as the polymerization initiator in the invention include compounds having a benzophenone skeleton or a thioxanthone skeleton described in J. P. Fouassier and J. F. Rabek, *RADIATION CURING IN POLYMER SCIENCE AND TECHNOLOGY* (1993), 77–117. Examples thereof include:

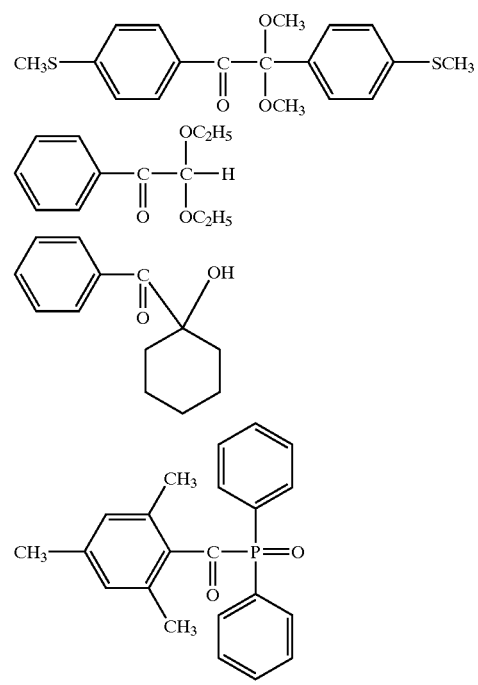

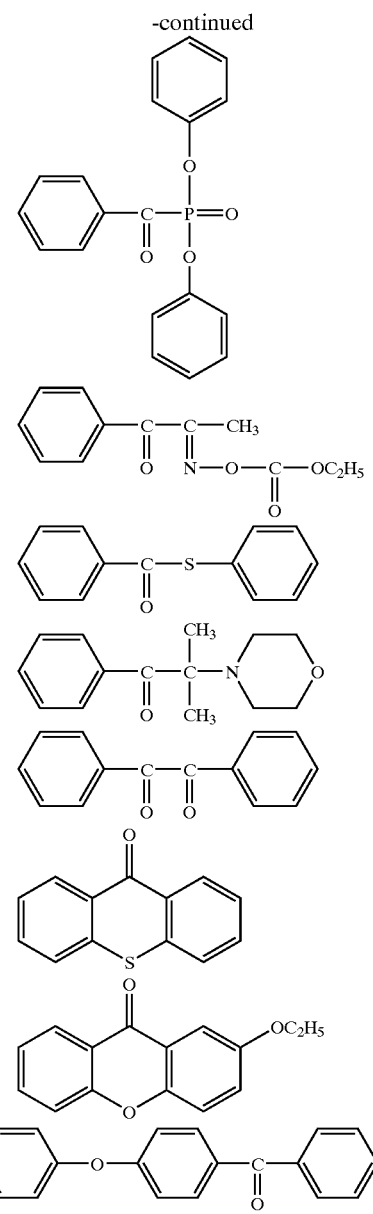

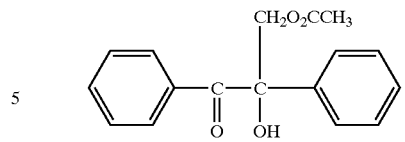

The benzoin derivatives described in JP-B No. 47-23664, aroylphosphonic acid esters described in JP-A 57-30704, and dialkoxybenzophenones described in JP-B No. 60-26483 such as the following compounds can also be cited as examples.

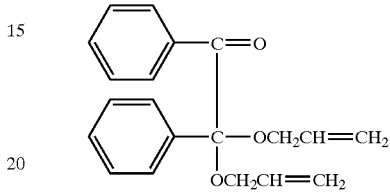

The benzoin ethers described in JP-B No. 60-26403 and JP-A No. 62-81345 such as the following compounds can also be cited as examples.

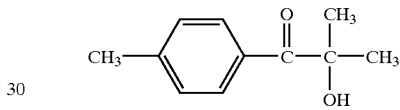

The α-aminobenzophenones described in JP-B No. 1-34242, U.S. Pat. No. 4,318,791, and EP No. 0284561A1 such as the following compounds can also be cited as examples.

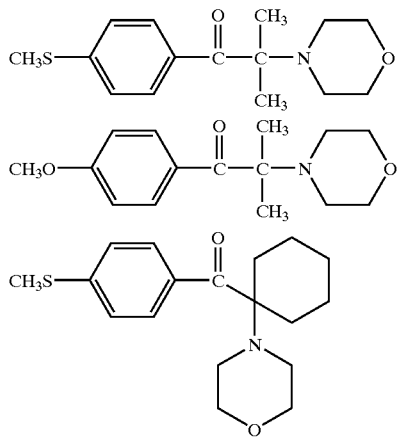

The p-di(dimethylaminobenzoyl)benzenes described in JP-A No. 2-211452 such as the following compound can also be cited as examples.

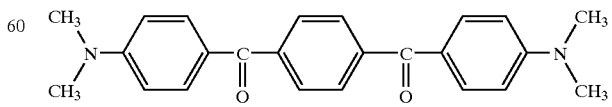

Among these, particularly preferable examples of aromatic ketones include α-thiobenzophenones described in JP-B No. 47-6416 and benzoin ethers described in JP-B No. 47-3981. Examples thereof include:

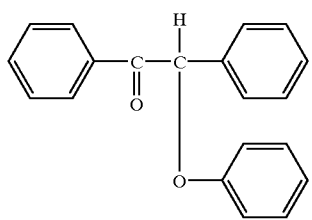

Alpha-substituted benzoin compounds described in JP-B No. 47-22326 such as the following compound can also be cited as examples.

The thio substituted aromatic ketones described in JP-A No. 61-194062 such as the following compound can also be cited as examples.

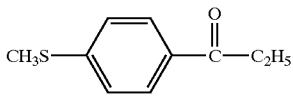

The acylphosphine sulfides described in JP-B No. 2-9597 such as the following compounds can also be cited as examples.

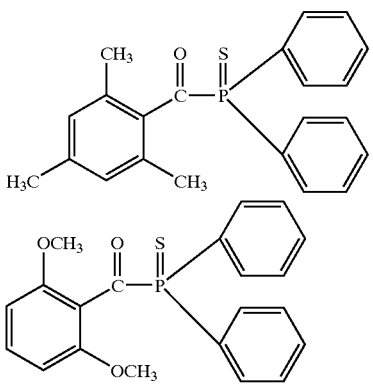

The acylphosphines described in JP-B No. 2-9596 such as the following compounds can also be cited as examples.

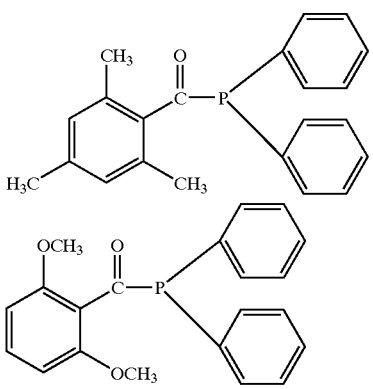

Furthermore, examples thereof also include the thioxanthones described in JP-B No. 63-61950 and the cumarins described in JP-B No. 59-42864.

(b) Onium Salt Compounds

Examples of (b) onium salt compounds used as the polymerization initiator in the invention include compounds represented by the following general formulae (1) to (3).

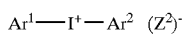 General formula (1)

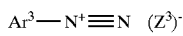 General formula (2)

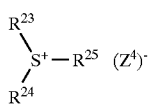 General formula (3)

In general formula (1), $Ar^1$ and $Ar^2$ each independently represent an aryl group that has 20 or less carbon atoms and may have a substituent group. When the aryl group has a substituent group, examples of a preferable substituent group include a halogen atom, nitro group, alkyl groups having 12 or less carbon atoms, alkoxy groups having 12 or less carbon atoms, or aryloxy groups having 12 or less carbon atoms. $(Z^2)^-$ represents a pair of ions selected from the group consisting of a halogen ion, perchloric acid ion, carboxylic acid ion, tetrafluoroborate ion, hexafluorophosphate ion and sulfonic acid ion, and preferably a perchloric acid ion, hexafluorophosphate ion and arylsulfonic acid ion.

In general formula (2), $Ar^3$ represents an aryl group that has 20 or less carbon atoms and may have a substituent group. Preferable examples of substituent groups include a halogen atom, nitro group, alkyl groups having 12 or less carbon atoms, alkoxy groups having 12 or less carbon atoms, aryloxy groups having 12 or less carbon atoms, alkylamino groups having 12 or less carbon atoms, dialkylamino groups having 12 or less carbon atoms, arylamino groups having 12 or less carbon atoms, or diarylamino groups having 12 or less carbon atoms. $(Z^3)^-$ represents an ion pair the same as that of $(Z^2)^-$.

In general formula (3), $R^{23}$, $R^{24}$ and $R^{25}$ each may be the same or different from each other, and represents a hydrocarbon group that has 20 or less carbon atoms and may have a substituent group. Examples of a preferable substituent group include a halogen atom, nitro group, alkyl groups having 12 or less carbon atoms, alkoxy groups having 12 or less carbon atoms, or aryloxy groups having 12 or less carbon atoms. $(Z^4)^-$ represents an ion pair the same as that of $(Z^2)^-$.

In the invention, specific examples of onium salts that can be preferably used include those described in JP-A No. 2001-133969 paragraph Nos. from [0030] to [0033], JP-A No. 2001-92127 paragraph Nos. from [0096] to [0101] and JP-A No. 2001-343742 paragraph Nos. from [0015] to [0046].

The onium salts used in the invention preferably have a maximum absorption wavelength in 400 nm or less, and furthermore preferably in 360 nm or less. By thus setting the absorption wavelength in the ultra-violet region, planographic printing plate precursor is allowed to handle under white light.

(c) Organic Peroxides

As (c) organic peroxides preferable as the polymerization initiator used in the invention, almost all organic compounds that have one or more of oxygen-oxygen bonds in a molecule are included. Examples thereof include methyl ethyl ketone peroxide, cyclohexanone peroxide, 3,3,5-trimethylcyclohexanone peroxide, methylcyclohexanone peroxide, acetylacetone peroxide, 1,1-bis(t-butylperoxy)-3,3,5-trimethylcyclohexane, 1,1-bis(t-butylperoxy)cyclohexane, 2,2-bis(t-butylperoxy)butane, t-butyl hydroperoxide, cumene hydroperoxide, diisopropylbenzene hydroperoxide, p-methane hydroperoxide, 2,5-dimethylhexane-2,5-dihydroperoxide, 1,1,3,3-tetramethylbutyl hydroperoxide, ditertiary butyl peroxide, t-butyl cumyl peroxide, dicumyl peroxide, bis(t-butylperoxyisopropyl)benzene, 2,5-dimethyl-2,5-di(t-butylperoxy)hexane, 2,5-xanoyl peroxide, succinic acid peroxide, benzoyl peroxide, 2,4-dichlorobenzoyl peroxide, m-toluoyl peroxide, diisopropyl peroxydicarbonate, di-2-ethylhexyl peroxydicarbonate, di-2-ethoxyethyl peroxydicarbonate, dimethoxyisopropyl peroxycarbonate, di(3-methyl-3-methoxybutyl) peroxydicarbonate, t-butyl peroxyacetate, t-butyl peroxypivalate, t-butyl peroxyneodecanoate, t-butyl peroxyoctanoate, t-butyl peroxy-3,5,5-trimethylhexanoate, t-butyl peroxylaurate, t-carbonate, 3,3',4,4'-tetra(t-butylperoxycarbonyl)benzophenone, 3,3',4,4'-tetra(t-amylperoxycarbonyl)benzophenone, 3,3',4,4'-tetra(t-hexylperoxycarbonyl)

benzophenone, 3,3',4,4'-tetra(t-octylperoxycarbonyl)benzophenone, 3,3',4,4'-tetra(cumylperoxycarbonyl)benzophenone, 3,3',4,4'-tetra(p-isopropylcumylperoxycarbonyl)benzophenone, carbonyl di(t-butylperoxydihydrogendiphthalate), and carbonyl di(t-hexylperoxydihydrogendiphthalate).

Among these, peroxide esters such as 3,3',4,4'-tetra(t-butylperoxycarbonyl)benzophenone, 3,3',4,4'-tetra(t-amylperoxycarbonyl)benzophenone, 3,3',4,4'-tetra(t-hexylperoxycarbonyl)benzophenone, 3,3',4,4'-tetra(t-octylperoxycarbonyl)benzophenone, 3,3',4,4'-tetra(cumylperoxycarbonyl) benzophenone, 3,3',4,4'-tetra(p-isopropylcumylperoxycarbonyl)benzophenone and di-t-butyl diperoxyisophthalate isophthalate are preferable.

(d) Thio Compounds

Examples of (d) thio compounds used as the polymerization initiator in the invention include compounds having the structure represented by the following general formula (4):

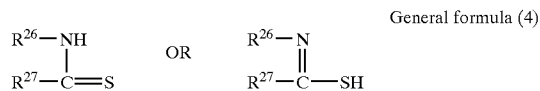

General formula (4)

In the above formulae, $R^{26}$ represents an alkyl group, aryl group or substituted aryl group, and $R^{27}$ represents a hydrogen atom or alkyl group. Furthermore, $R^{26}$ and $R^{27}$ may represent a group of non-metal atoms that are necessary for mutually combining and forming a 5- or 7-membered ring that may contains a hetero atom selected from an oxygen atom, sulfur atom and nitrogen atom.

The alkyl group in general formula (4) preferably has 1 to 4 carbon atoms. Examples of the aryl group in general formula (4) include those having 6 to 10 carbon atoms such as phenyl and naphthyl groups. Examples of the substituted aryl groups include the above-mentioned aryl group substituted with a halogen atom such as a chlorine atom, an alkyl group such as a methyl group, or an alkoxy group such as a methoxy group or an ethoxy group. The $R^{27}$ is preferably an alkyl group having 1 to 4 carbon atoms. Specific examples of the thio compounds represented by general formula (4) include compounds such as shown below.

TABLE 1

| No. | $R^{26}$ | $R^{27}$ |
|---|---|---|
| 1 | —H | —H |
| 2 | —H | —$CH_3$ |
| 3 | —$CH_3$ | —H |
| 4 | —$CH_3$ | —$CH_3$ |
| 5 | —$C_6H_5$ | —$C_2H_5$ |
| 6 | —$C_6H_5$ | —$C_4H_9$ |
| 7 | —$C_6H_4Cl$ | —$CH_3$ |
| 8 | —$C_6H_4Cl$ | —$C_4H_9$ |
| 9 | —$C_6H_4$—$CH_3$ | —$C_4H_9$ |
| 10 | —$C_6H_4$—$OCH_3$ | —$CH_3$ |
| 11 | —$C_6H_4$—$OCH_3$ | —$C_2H_5$ |
| 12 | —$C_6H_4$—$OC_2H_5$ | —$CH_3$ |
| 13 | —$C_6H_4$—$OC_2H_5$ | —$C_2H_5$ |
| 14 | —$C_6H_4$—$OCH_3$ | —$C_4H_9$ |
| 15 | —$(CH_2)_2$— | |
| 16 | —$(CH_2)_2$—S— | |
| 17 | —$CH(CH_3)$—$CH_2$—S— | |
| 18 | —$CH_2$—$CH(CH_3)$—S— | |
| 19 | —$C(CH_3)_2$—$CH_2$—S— | |
| 20 | —$CH_2$—$C(CH_3)_2$—S— | |
| 21 | —$(CH_2)_2$—O— | |
| 22 | —$CH(CH_3)$—$CH_2$—O— | |
| 23 | —$C(CH_3)_2$—$CH_2$—O— | |
| 24 | —CH=CH—$N(CH_3)$— | |

TABLE 1-continued

| No. | $R^{26}$ | $R^{27}$ |
|---|---|---|
| 25 | —$(CH_2)_3$—S— | |
| 26 | —$(CH_2)_2$—$CH(CH_3)$—S— | |
| 27 | —$(CH_2)_3$—O— | |
| 28 | —$(CH_2)_5$— | |
| 29 | —$C_6H_4$—O— | |
| 30 | —N=$C(SCH_3)$—S— | |
| 31 | —$C_6H_4$—NH— | |
| 32 | 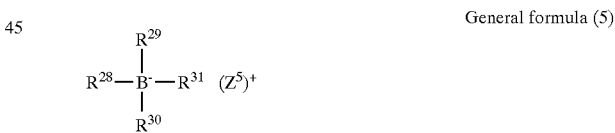 | | e) Hexaarylbiimidazole Compounds

Examples of (e) hexaarylbiimidazole compounds used as the polymerization initiator in the invention include lophine dimmers described in JP-B Nos. 45-37377 and 44-86516, for instance, 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4', 5,5'-tetraphenylbiimidazole, 2,2'-bis(o-methylphenyl)-4,4',5,5'-tetraphenylbiimidazole, and 2,2'-bis(o-trifluorophenyl)-4,4',5,5'-tetraphenylbiimidazole.

(f) Ketoxime Ester Compounds

Examples of (f) ketoxime ester compounds preferably used as the polymerization initiator in the invention include 3-benzoyloxyiminobutane-2-one, 3-acetoxyiminobutane-2-one, 3-propyonyloxyiminobutane-2-one, 2-acetoxyiminopentane-3-one, 2-acetoxyimino-1-phenylpropane-1-one, 2-benzoyloxyimino-1-phenylpropane-1-one, 3-p-toluenesulfonyloxyiminobutane-2-one, and 2-ethoxycarbonyloxyimino-1-phenylpropane-1-one.

(g) Borate Compounds

An example of (g) borate compounds preferably used as the polymerization initiator in the invention include a compound represented by the following general formula (5).

$$R^{28}-\underset{\underset{R^{30}}{|}}{\overset{\overset{R^{29}}{|}}{B^-}}-R^{31} \quad (Z^5)^+$$

General formula (5)

In general formula (5), $R^{28}$, $R^{29}$, $R^{30}$ and $R^{31}$ each may be the same or different from each other, and each independently represent a substituted or nonsubstituted alkyl group, a substituted or nonsubstituted aryl group, a substituted or nonsubstituted alkenyl group, a substituted or nonsubstituted alkynyl group, or a substituted or nonsubstituted heterocyclic group. Two or more groups of $R^{28}$, $R^{29}$, $R^{30}$ and $R^{31}$ may form a ring structure. However, at least one of $R^{28}$, $R^{29}$, $R^{30}$ and $R^{31}$ is a substituted or nonsubstituted alkyl group. $(Z^5)^+$ represents an alkali metal cation or quaternary ammonium cation.

The alkyl groups represented by $R^{28}$ to $R^{31}$ may be straight chain, branched chain, or ring and preferably have from 1 to 18 carbon atoms. Specific examples include a methyl group, ethyl group, propyl group, isopropyl group, butyl group, pentyl group, hexyl group, octyl group, stearyl group, cyclobutyl group, cyclopentyl group and cyclohexyl group. Furthermore, examples of the substituted alkyl groups include those that have, as a substituent group in the alkyl groups such as mentioned above, a halogen atom (for instance, —Cl, —Br and so on), cyano group, nitro group, aryl group (preferably phenyl group), hydroxy group, —COOR$^{32}$ (Here, R$^{32}$ represents a hydrogen atom, alkyl group having 1 to 14 carbon atoms, or aryl group), —OCOR$^{33}$ or —OR$^{34}$ (Here, R$^{33}$ and R$^{34}$ represent an alkyl group having 1 to 14 carbon atoms, or aryl group), and those represented by the following formula.

In the above formula, R$^{35}$ and R$^{36}$ each independently represent a hydrogen atom, alkyl group having 1 to 14 carbon atoms, or aryl group.

The aryl group represented by R$^{28}$ to R$^{31}$ may be an aryl group having 1 to 3 rings such as a phenyl group and naphthyl group. The substituted aryl group may be the above-mentioned aryl group that has a substituent group of the substituted alkyl group or an alkyl group having 1 to 14 carbon atoms. The alkenyl groups represented by R$^{28}$ to R$^{31}$ may be straight chain, branched chain, or cyclic; and preferably have 2 to 18 carbon atoms. Examples of the substituent groups of the substituted alkenyl groups include those raised as the substituent groups of the substituted alkyl groups. Examples of the alkynyl groups of R$^{28}$ to R$^{31}$ include those having a straight chain or a branched chain, and preferably have 2 to 28 carbon atoms. Examples of the substituent groups of the substituted alkynyl groups include those raised as the substituent groups of the substituted alkyl groups. Furthermore, examples of the heterocyclic groups of R$^{28}$ to R$^{31}$ include 5- or more-membered heterocyclic groups, preferably 5 to 7-membered heterocyclic groups containing at least one of N, S and O; here, the heterocyclic groups may contain a condensed ring. Furthermore, examples of the substituent group include those raised as the substituent groups of the substituted aryl group. Specific examples of compounds represented by general formula (5) include compounds described in U.S. Pat. Nos. 3,567,453 and 4,343,891, EP Nos. 109,772 and 109,773, and the following compounds.

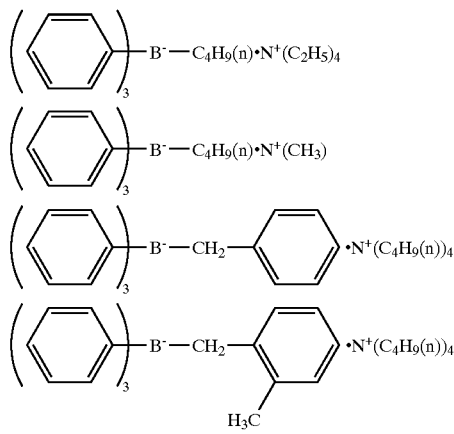

(h) Azinium Compounds

Examples of (h) azinium salt compounds preferably used as the polymerization initiator in the invention include a group of compounds that have a N—O bond described in JP-A Nos. 63-138345, 63-142345, 63-142346 and 63-143537 and JP-B No. 46-42363.

(i) Metallocene Compounds

Examples of (i) metallocene compounds preferably used as the polymerization initiator in the invention include titanocene compounds described in JP-A Nos. 59-152396, 61-151197, 63-41484, 2-249, and 2-4705, and iron-arene complexes described in JP-A Nos. 1-304453 and 1-152109.

Specific examples of the titanocene compounds include di-cyclopentadienyl-Ti-di-chloride, di-cyclopentadienyl-Ti-bis-phenyl, di-cyclopentadienyl-Ti-bis-2,3,4,5,6-pentafluorophen-1-yl, di-cyclopentadienyl-Ti-bis-2,3,5,6-tetrafluorophen-1-yl, di-cyclopentadienyl-Ti-bis-2,4,6-trifluorophen-1-yl, di-cyclopentadienyl-Ti-2,6-difluorophen-1-yl, di-cyclopentadienyl-Ti-bis-2,4-difluorophen-1-yl, di-methylcyclopentadienyl-Ti-bis-2,3,4,5,6-pentafluorophen-1-yl, di-methylcyclopentadienyl-Ti-bis-2,3,5,6-tetrafluorophen-1-yl, di-methylcyclopentadienyl-Ti-bis-2,4-difluorophen-1-yl, bis(cyclopentadienyl)-bis(2,6-difluoro-3-(pili-1-yl)phenyl)Ti, bis(cyclopentadienyl)bis[2,6-difluoro-3-(methylsulfoneamide)phenyl]Ti, bis(cyclopentadienyl)bis[2,6-difluoro-3-(N-butylbialloyl-amino)phenyl]Ti, bis(cyclopentadienyl)bis[2,6-difluoro-3-(N-butyl-(4-chlorobenzoyl)amino)phenyl]Ti, bis(cyclopentadienyl)bis[2,6-difluoro-3-(N-benzyl-2,2-dimethylpentanoylamino)phenyl]Ti, bis(cyclopentadienyl)bis[2,6-difluoro-3-(N-(2-ethylhexyl)-4-tolyl-sulfonyl)amino]phenyl]Ti, bis(cyclopentadienyl)bis[2,6-difluoro-3-(N-(3-oxaheptyl)benzoylamino) phenyl]Ti, bis(cyclopentadienyl) bis[2,6-difluoro-3-(N-(3,6-dioxadecyl)benzoylamino)phenyl]Ti, bis(cyclopentadienyl)bis[2,6-difluoro-3-(trifluoromethylsulfonyl)amino]phenyl]Ti, bis(cyclopentadienyl)bis[2,6-difluoro-3-(trifluoroacetylamino) phenyl]Ti, bis(cyclopentadienyl)bis[2,6-difluoro-3-(2-chlorobenzoylamino)phenyl]Ti, bis(cyclopentadienyl)bis[2,6-difluoro-3-(4-chlorobenzoyl)amino]phenyl]Ti, bis(cyclopentadienyl)bis[2,6-difluoro-3-(N-(3,6-dioxadecyl)-2,2-dimethylpentanoylamino)phenyl]Ti, bis(cyclopentadienyl)bis[2,6-difluoro-3-(N-(3,7-dimethyl-7-methoxyoctyl)benzoylamino)phenyl]Ti, and bis(cyclopentadienyl)bis[2,6-difluoro-3-(N-cyclohexylbenzoylamino)phenyl]Ti.

(j) Active Ester Compounds

Examples of (j) active ester compounds preferably used as the polymerization initiator in the invention include imidosulfonate compounds described in JP-B No. 62-6223 and active sulfonates described in JP-B No. 63-14340 and JP-A No. 59-174831.

(k) Compounds Having Carbon-halogen Bond

Examples of (k) compounds having a carbon-halogen bond preferably used as the polymerization initiator in the invention include compounds represented by the following general formulae (6) to (12).

The following general formulae (6) to (10) represent carbonylmethylene heterocyclic compounds having a trihalogenomethyl group.

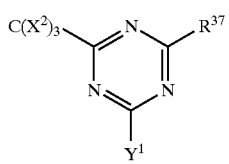

General formula (6)

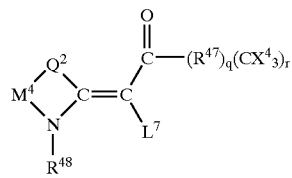

General formula (10)

(In general formula (6), $X^2$ represents a halogen atom, and $Y^1$ represents —$C(X^2)_3$, —$NH_2$, —$NHR^{38}$, —$NR^{38}$ or —$OR^{38}$. The $R^{38}$ represents an alkyl group, substituted alkyl group, aryl group, or substituted aryl group. Furthermore, $R^{37}$ represents —$C(X^2)_3$, alkyl group, substituted alkyl group, aryl group, substituted aryl group, or substituted alkenyl group.),

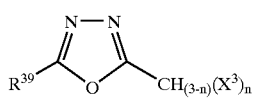

General formula (7)

(In general formula (7), $R^{39}$ represents an alkyl group, substituted alkyl group, alkenyl group, substituted alkenyl group, aryl group, substituted aryl group, halogen atom, alkoxy group, substituted alkoxy group, nitro group or cyano group, and $X^3$ represents a halogen atom, and n represents an integer of 1 to 3.),

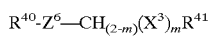

General formula (8)

(In general formula (8), $R^{40}$ represents an aryl group or substituted aryl group; $R^{41}$ represents groups shown below or a halogen; $Z^6$ represents —C(=O)—, —C(=S)— or —$SO_2$—; $X^3$ represents a halogen atom; and m is 1 or 2.),

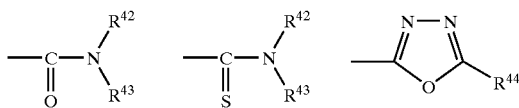

(In the above formulae, $R^{42}$ and $R^{43}$ each independently represent an alkyl group, substituted alkyl group, alkenyl group, substituted alkenyl group, aryl group or substituted aryl group; and $R^{44}$ is the same as $R^{38}$ in general formula (6)),

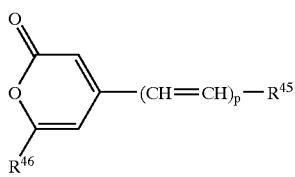

General formula (9)

(In general formula (9), $R^{45}$ represents an aryl group that may be substituted or heterocyclic group; $R^{46}$ represents a trihaloalkyl group or trihaloalkenyl group having 1 to 3 carbon atoms; and p is 1, 2 or 3.), and (In general formula (10), $L^7$ represents a hydrogen atom or a substituent group of CO—$(R^{47})_q(C(X^4)_3)_r$; $Q^2$ represents a sulfur, selenium or oxygen atom, dialkylmethylene group, alkene-1,2-ylene group, 1,2-phenylene group or N—R group; $M^4$ represents a substituted or nonsubstituted alkylene group or alkenylene group, or 1,2-arylene group; $R^{48}$ represents an alkyl group, aralkyl group or alkoxyalkyl group; $R^{48}$ represents a divalent aromatic group of carbocyclic or heterocyclic type; $X^4$ represents a chlorine, bromine or iodine atom; and q=0 and r=1 or q=1 and r=1 or 2.).

4-halogeno-5-(halogenomethyl-phenyl)-oxazole derivatives represented by the following general formula (11) can also be cited as examples.

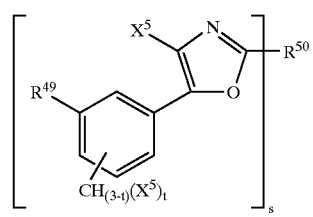

General formula (11)

(In general formula (11), $X^5$ represents a halogen atom, t denotes an integer of 1 to 3, s denotes an integer of 1 to 4, $R^{49}$ represents a hydrogen atom or $CH_{3-t}X^5_t$ group, $R^{50}$ represents a s-valent unsaturated organic group that may be substituted.).

Furthermore, 2-(halogenomethyl-phenyl)-4-halogeno-oxazole derivatives represented by the following general formula (12) can also be cited as examples.

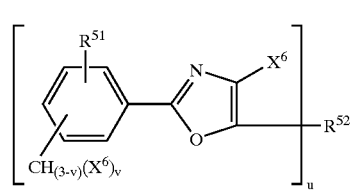

General formula (12)

(In general formula (12), $X^6$ represents a halogen atom, v denotes an integer of 1 to 3, u denotes an integer of 1 to 4, $R^{51}$ represents a hydrogen atom or $CH_{3-v}X^6_v$ group, and $R^{52}$ represents a u-valent unsaturated organic group that may be substituted.).

Specific examples of the compound having such a carbon-halogen bond include compounds described in Wakabayashi et al., Bull. Chem. Soc. Japan, 42, 2924 (1969), for instance, 2-phenyl-4,6-bis(trichlormethyl)-S-triazine, 2-(p-chlorphenyl)-4,6-bis(trichlormethyl)-S-triazine, 2-(p-tolyl)-4,6-bis(trichlormethyl)-S-triazine, 2-(p-methoxyphenyl)-4,6-bis(trichlormethyl)-S-triazine, 2-(2',4'-dichlorphenyl)-4,6-bis(trichlormethyl)-S-triazine, 2,4,6-tris(trichlormethyl)-S-triazine, 2-methyl-4,6-bis(trichlormethyl)-S-triazine, 2-n-nonyl-4,6-bis(trichlormethyl)-S-triazine, and 2-(α,α,β-trichloroethyl)-4,6-bis(trichlormethyl)-S-triazine. Other than these, compounds described in BP No. 1,388,492 such as 2-styryl-4,6-bis(trichlormethyl)-S-triazine, 2-(p- methylstyryl)-4,6-bis(trichloromethyl)-S-triazine, 2-(p-methoxystyryl)-4,6-bis(trichloromethyl)-S-triazine, and 2-(p-methoxystyryl)-4-amino-6-trichlormethyl-S-triazine; compounds described in JP-A No. 53-133428 such as 2-(4-methoxy-naphtho-1-yl)-4,6-bis-trichlormethyl-S-triazine, 2-(4-ethoxy-naphtho-1-yl)-4,6-bis-trichlormethyl-S-triazine, 2-[4-(2-ethoxyethyl)-naphtho-1-yl]-4,6-bis-trichlormethyl-S-triazine, 2-(4,7-dimethoxy-naphtho-1-yl)-4,6-bis-trichlormethyl-S-triazine, and 2-(acenaphtho-5-yl)-4,6-bis-trichlormethyl-s-triazine; and compounds described in GP No. 3,337,024 such as the compounds set forth below.

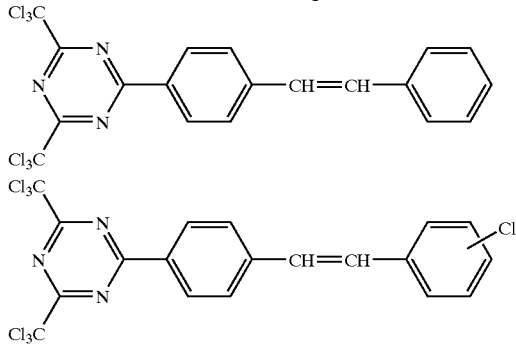

Furthermore, examples include compounds described in F. C. Schaefer et al, J. Org. Chem., 29, 1527 (1964) such as 2-methyl-4,6-bis(tribromomethyl)-S-triazine, 2,4,6-tris(tribromomethyl)-S-triazine, 2,4,6-tris(dibromomethyl)-S-triazine, 2-amino-4-methyl-6-tribromomethyl-S-triazine, and 2-methoxy-4-methyl-6-trichloromethyl-S-triazine. Still furthermore, examples include compounds described in JP-A No. 62-58241 such as compounds set forth below.

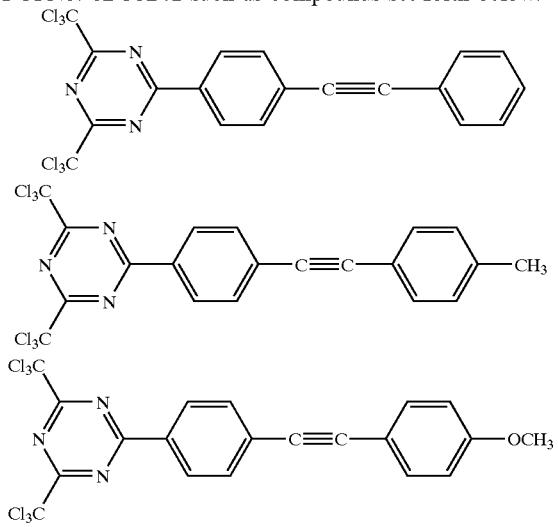

Furthermore, compounds described in JP-A No. 5-281728 such as the compounds set forth below can be cited as examples.

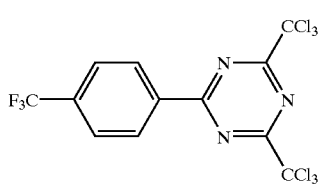

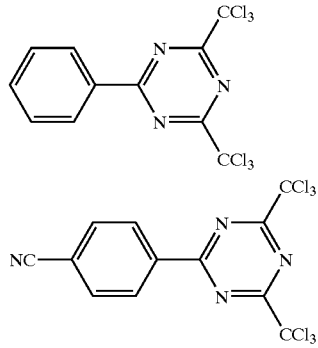

Alternatively, examples include a group of compounds that can be easily synthesized by one skilled in the art according to the synthesis method described in M. P. Hutt, E. F. Elslager and L. M. Herbel, Journal of Heterocyclic Chemistry, Vol. 7 (No. 3), 511 et seq (1970) such compounds as set forth below.

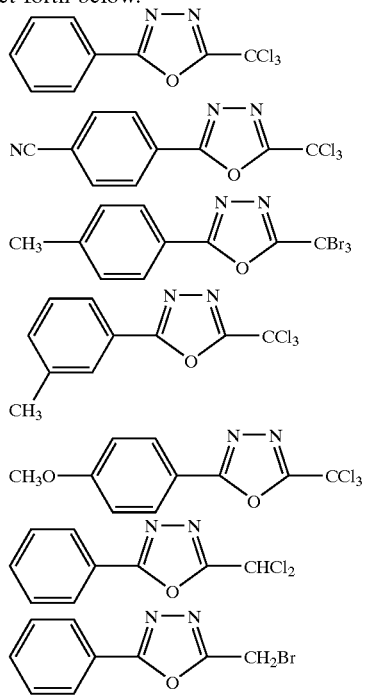

Furthermore, examples of preferable polymerization initiators include specific aromatic sulfonium salts disclosed in JP-A No. 2001-92127, and those disclosed by the present inventors in JP-A Nos. 2002-148790 and 2002-006482.

Examples of the polymerization initiator most preferably used in the polymerizable composition according to the invention include titanocene compounds, aromatic sulfonium salts and trihalomethyl-S-triazine compounds.

Such polymerization initiators can be used singly or in combination of 2 or more kinds.

Such polymerization initiator is preferably added as solid component by 0.01 to 10% by mass in the polymerizable composition, and more preferably by 0.1 to 2% by mass.

It is preferable from a viewpoint of improving the sensitivity to add a sensitizing dye to the polymerizable composition according to the invention. The sensitizing dye may have $\lambda_{max}$ (the wavelength at which the absorbance is the greatest) in a range of 330 nm to 700 nm, or in a range of 800 nm to 1300 nm. Examples of the sensitizing dye include a spectral sensitizing dye, and a dye or pigment that absorbs light from a light source and interacts with the polymerization initiator.

Examples of the spectral sensitizing dyes or dyestuffs preferably used as the sensitizing dye in the invention include polynuclear aromatics (for instance, pyrene, perilene, and triphenylene), xanthenes (for instance, fluorescein, eosine, erythrosine, rhodamine B, and rose Bengal), cyanines (for instance, thiacarbocyanine and oxacarbocyanine), merocyanines (for instance, merocyanine and carbomerocyanine), thiazines (for instance, thionine, methylene blue, and toluidine blue), acridines (for instance, acridine orange, chloroflavine, and acryflavine), phthalocyanines (for instance, phthalocyanine and metal phthalocyanine), porphyrins (for instance, tetraphenylporphirin and center metal substituted porphyrin), chlorofylls (for instance, chlorophyll, chlorophylline, and center metal substituted chlorophyll), metal complexes (for instance, a compound described below), anthraquinones (for instance, anthraquinone), and squariums (for instance, squarium).

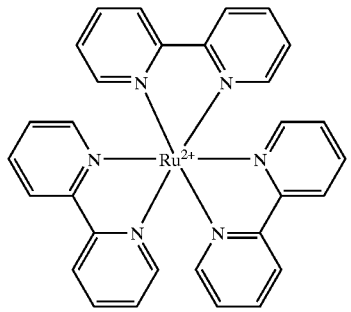

Examples of the more preferable spectral sensitizing dyes and dyestuffs include styrylic dyes described in JP-B No. 37-13034, for instance,

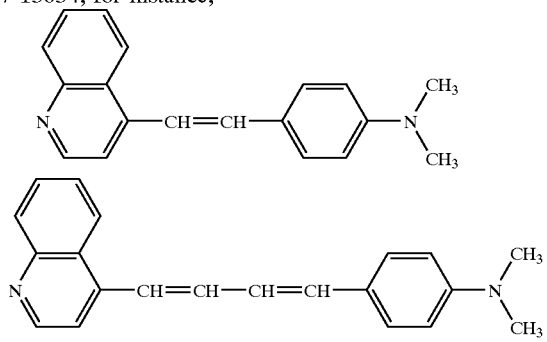

cationic dyes described in JP-A No. 62-143044, for instance,

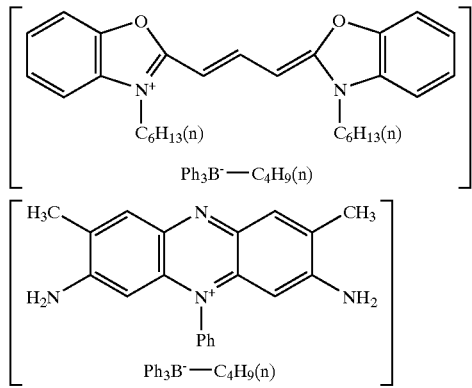

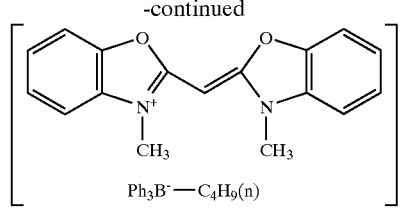

quinoxalinium salts described in JP-B No. 59-24147 such as

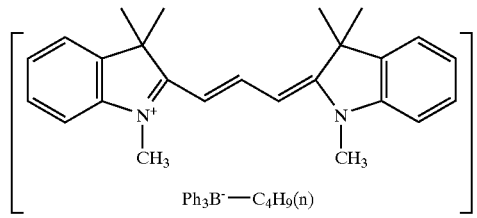

new methylene blue compounds described in JP-A No. 64-33104 such as

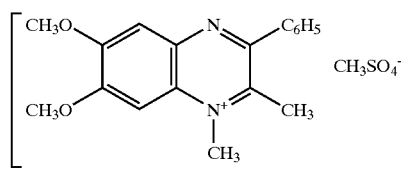

anthraquinones described in JP-A No. 64-56767 such as

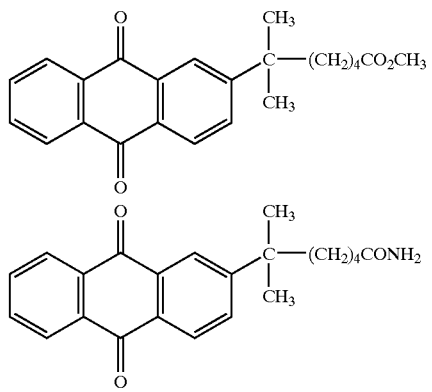

benzoxanthene dyes described in JP-A No. 2-1714 and acridines described in JP-A Nos. 2-226148 and 2-226149 such as

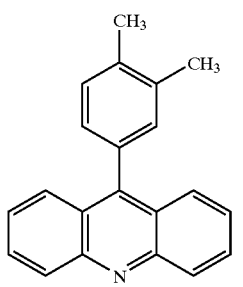
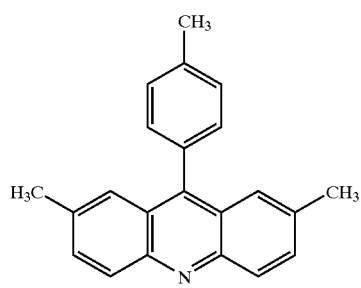
pyrilium salts described in JP-B No. 40-28499 such as
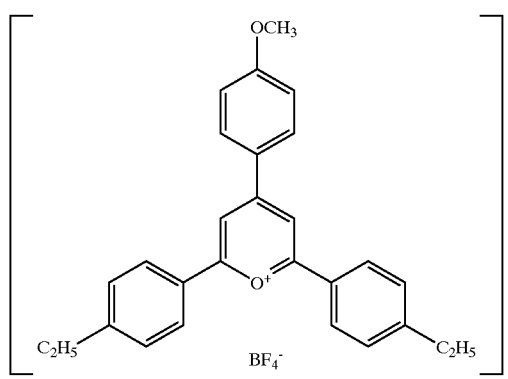
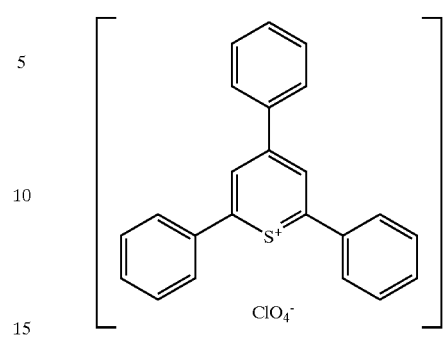
cyanines described in JP-B No. 46-42363 such as
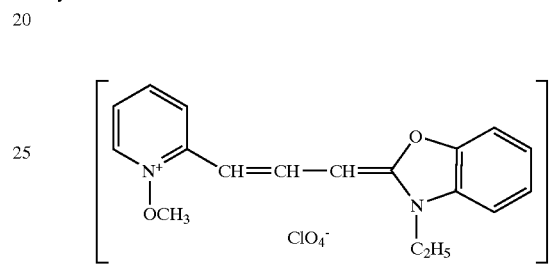
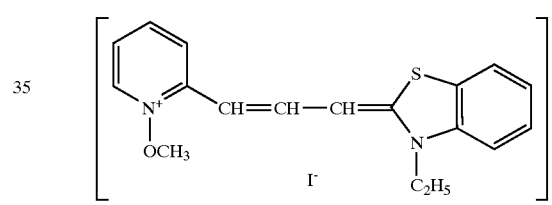
benzofuran dyes described in JP-A No. 2-63053 such as
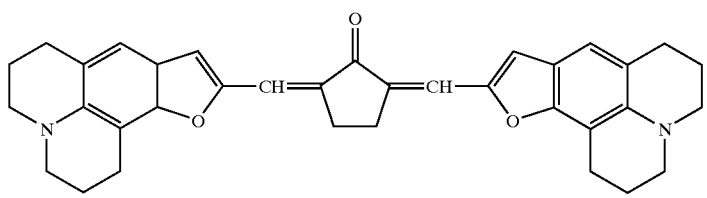
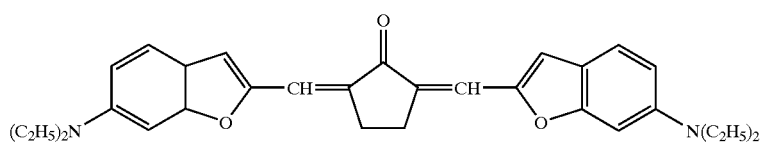

conjugated ketone dyes described in JP-A Nos.2-85858 and 2-216154 such as

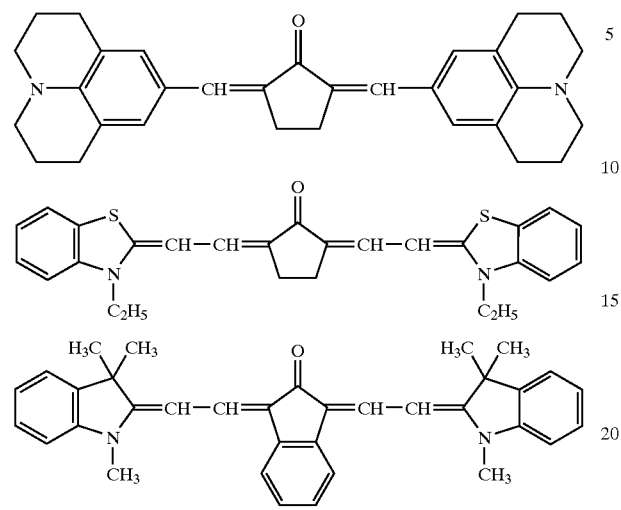

dyes described in JP-A No. 57-10605 and azocinnamylidene derivatives described in JP-B No. 2-30321 such as

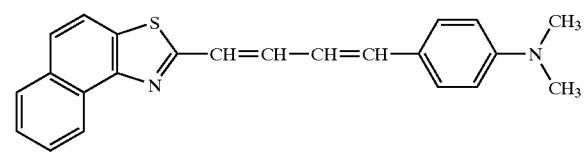

cyanine-based dyes described in JP-A No. 1-287105 such as

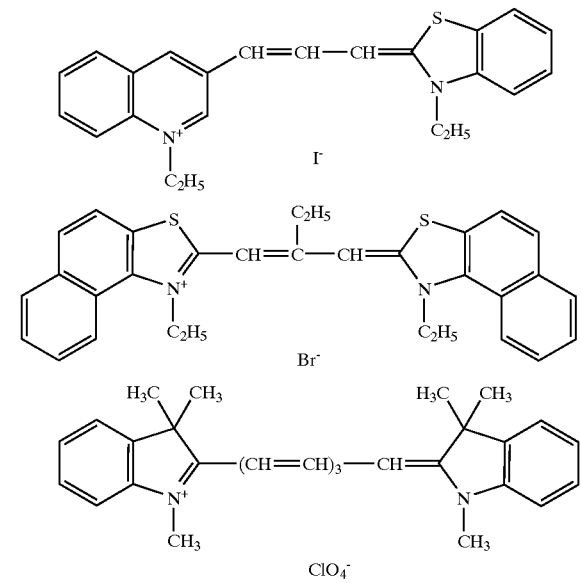

xanthene-based dyes described in JP-A Nos.62-31844, 62-31848 and 62-143043 such as

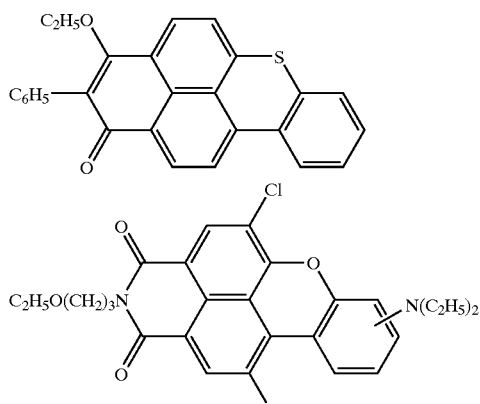

aminostyryl ketones described in JP-B No. 59-28325 such as

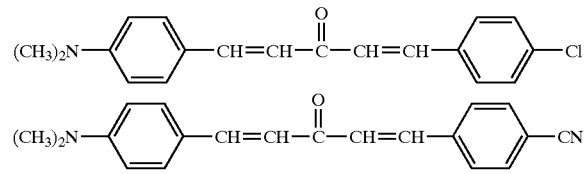

dyes represented by the following general formulae (13) to (15) described in JP-A No. 2-179643 such as General formula (13)

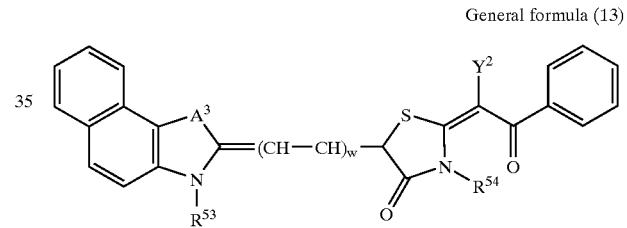

General formula (14)

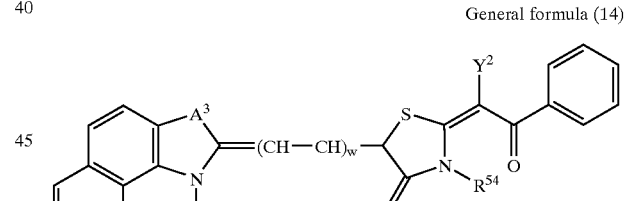

General formula (15)

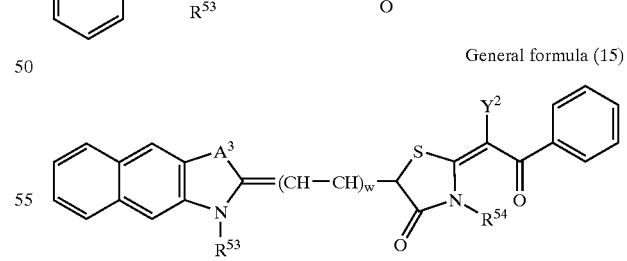

(In general formulae (13) to (15), $A^3$ represents an oxygen atom, sulfur atom, selenium atom, tellurium atom, alkyl or aryl substituted nitrogen atom or dialkyl substituted carbon atom; $Y^2$ represents a hydrogen atom, alkyl group, substituted alkyl group, aryl group, substituted aryl group, aralkyl group, acyl group or substituted alkoxycarbonyl group; $R^{53}$ and $R^{54}$ each represent a hydrogen atom, alkyl group having 1 to 18 carbon atoms, or substituted alkyl group that has, as a substituent group, $-OR^{55}$, $-(CH_2CH_2O)_w-R^{55}$, halogen atom (F, Cl, Br, I), and a group represented by the following formula and from 1 to 18 carbon atoms (here, $R^{55}$ represents a hydrogen atom or alkyl group having 1 to 10 carbon atoms, $B^1$ represents a dialkylamino group, hydroxyl group, acyloxy group, halogen atom or nitro group; and w denotes an integer of 0 to 4.))

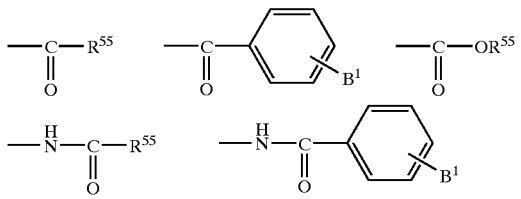

merocyanine dyes represented by the following general formula (16) described in JP-A No. 2-244050, General formula (16)

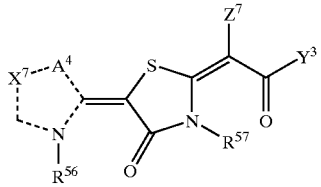

(In general formula (16), $R^{56}$ and $R^{57}$ each independently represent a hydrogen atom, alkyl group, substituted alkyl group, alkoxycarbonyl group, aryl group, substituted aryl group or aralkyl group. $A^4$ represents an oxygen atom, sulfur atom, selenium atom, tellurium atom, alkyl or aryl substituted nitrogen atom, or dialkyl substituted carbon atom. $X^7$ represents a nonmetal atom group necessary for forming a nitrogen-containing 5-membered heterocyclic ring. $Y^3$ represents a substituted phenyl group, nonsubstituted or substituted polynuclear aromatic ring, or nonsubstituted or substituted heteroaromatic ring. $Z^7$ represents a hydrogen atom, alkyl group, substituted alkyl group, aryl group, substituted aryl group, aralkyl group, alkoxy group, alkylthio group, arylthio group, substituted amino group, acyl group or alkoxycarbonyl group, and may bond with $Y^3$ to form a ring. As preferable examples, the following compounds)

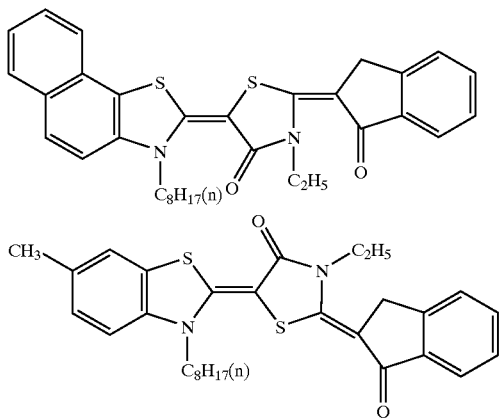

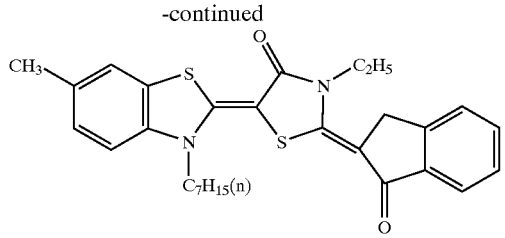

merocyanine dyes represented by the following general formula (17) set forth in JP-B No. 59-28326, General formula (17)

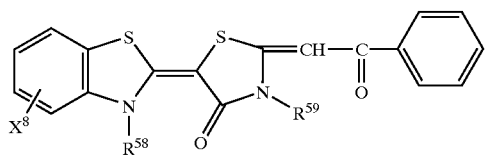

(In general formula (17), $R^{58}$ and $R^{59}$ each represent a hydrogen atom, alkyl group, substituted alkyl group, aryl group, substituted aryl group or aralkyl group, and these may be the same each other or different from each other. $X^8$ represents a substituent group whose sigma (σ) value according to Hammett is in a range of −0.9 to +0.5), merocyanine dyes represented by the following general formula (18) set forth in JP-A No. 59-89303, General formula (18)

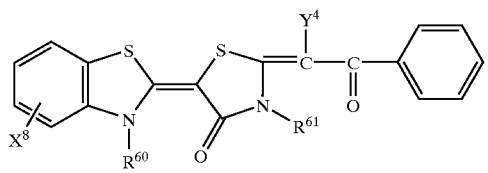

[(In general formula (18), $R^{60}$ and $R^{61}$ each independently represent a hydrogen atom, alkyl group, substituted alkyl group, aryl group, substituted aryl group or aralkyl group. $X^9$ represents a substituent group whose sigma (σ) value according to Hammett is in a range of −0.9 to +0.5. $Y^4$ represents a hydrogen atom, alkyl group, substituted alkyl group, aryl group, substituted aryl group, aralkyl group, acyl group or alkoxycarbonyl group.) Preferable examples presented by general formula (18) include the following compounds.]

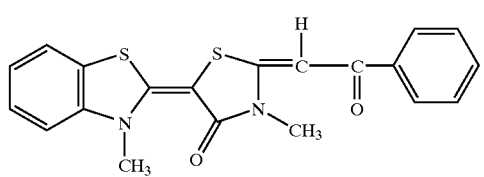

-continued

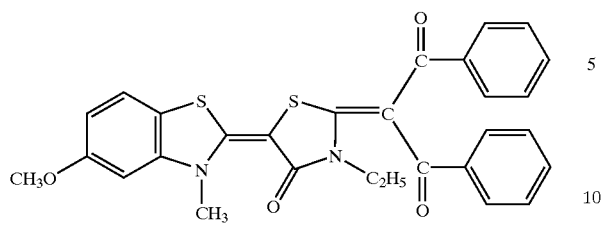

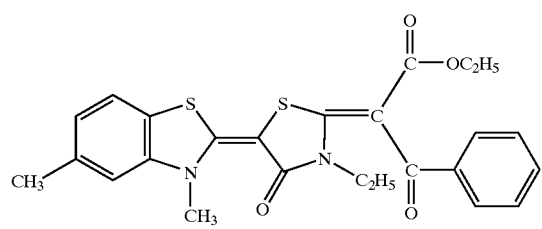

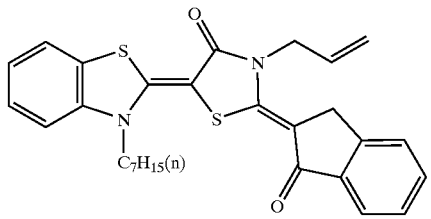

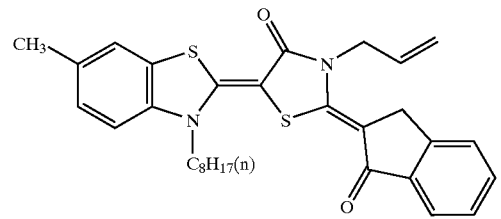

benzopyran-based dyes represented by the following general formula (20) disclosed in JP-A No. 08-334897, merocyanine dyes represented by the following general formula (19) disclosed in Japanese Patent No. 3278307

General formula (19)

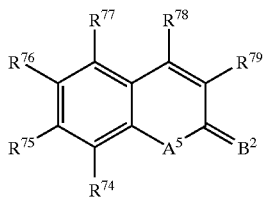

General formula (20)

[(In general formula (19), $R^{62}$, $R^{63}$, $R^{64}$, $R^{65}$, $R^{70}$ $R^{71}$ $R^{72}$ and $R^{73}$ each independently represents a hydrogen atom, halogen atom, alkyl group, substituted alkyl group, aryl group, substituted aryl group, hydroxyl group, substituted oxy group, mercapto group, substituted thio group, amino group, substituted amino group, substituted carbonyl group, sulfo group, sulfonate group, substituted sulfinyl group, substituted sulfonyl group, phosphono group, substituted phosphono group, phosphonate group, substituted phosphonate group, cyano group, or nitro group; alternatively, $R^{62}$ and $R^{63}$, $R^{63}$ and $R^{64}$, $R^{64}$ and $R^{65}$, $R^{70}$ and $R^{71}$, $R^{71}$ and $R^{72}$, and $R^{72}$ and $R^{73}$ may mutually bond to form an aliphatic group or aromatic ring; $R^{66}$ represents a hydrogen atom, alkyl group, substituted alkyl group, aryl group, or substituted aryl group; $R^{67}$ represents a substituted or non-substituted alkenylalkyl group, or substituted or nonsubstituted alkynylalkyl group; $R^{68}$ and $R^{69}$ each independently represent a hydrogen atom, halogen atom, alkyl group, substituted alkyl group, aryl group, substituted aryl group, or substituted carbonyl group.) Preferable examples represented by general formula (19) include the following compounds.]

(In general formula (20), $R^{74}$ to $R^{77}$ each independently represent a hydrogen atom, halogen atom, alkyl group, aryl group, hydroxyl group, alkoxy group or amino group. Furthermore, $R^{74}$ to $R^{77}$ may form a ring consisting of non-metal atoms with carbon atoms with which each of $R^{74}$ to $R^{77}$ may bond. $R^{78}$ represents a hydrogen atom, alkyl group, aryl group, heteroaromatic group, cyano group, alkoxy group, carboxy group or alkenyl group. $R^{79}$ is a group represented by $R^{78}$ or $-Z^7-R^{78}$, and $Z^7$ represents a carbonyl group, sulfonyl group, sulfynyl group or arylene-dicarbonyl group. Furthermore, $R^{78}$ and $R^{79}$ may together form a ring made of non-metal atoms. $A^5$ represents an oxygen atom, sulfur atom, NH or N atom having a substituent group. $B^2$ represents an oxygen atom or a group of $=C(G^7)(G^8)$. $G^7$ and $G^8$, either same or different, represent a hydrogen atom, cyano group, alkoxycarbonyl group, aryloxycarbonyl group, acyl group, arylcarbonyl group, alkylthio group, arylthio group, alkylsulfonyl group, arylsulfonyl group, or fluorosulfonyl group. However, $G^7$ and $G^8$ do not become the hydrogen atom at the same time. Furthermore, $G^7$ and $G^8$ may form a ring made of non-metal atoms together with carbon atoms.) and so on.

Furthermore, specific examples thereof include indolenine cyanine dyes disclosed by the present inventors in JP-A No. 2002-278057.

Other than the above, as the sensitizing dye, in particular, the following IR absorbers (dyes or pigments) can be also preferably used. Examples of preferable dyes include cyanine dyes set forth in JP-A Nos.58-125246, 59-84356, 59-202829, and 60-78787, cyanine dyes described in GB Patent No. 434,875, and the specific indolenine cyanine dyes described above.

Furthermore, near IR absorption sensitizing agents set forth in U.S. Pat. No. 5,156,938 can be also preferably used, still furthermore, substituted arylbenzo(thio)pyrilium salts described in U.S. Pat. No. 3,881,924, trimethinethia pyrylium salts set forth in JP-A No. 57-142645 (U.S. Pat. No. 4,327,169), pyrylium-based compounds set forth in JP-A Nos. 58-181051, 58-220143, 59-41363, 59-84248, 59-84249, 59-146063 and 59-146061, cyanine dyes described in JP-A No. 59-216146, pentanemethinethiopyrylium salts described in U.S. Pat. No. 4,283,475, and pyrylium compounds set forth in JP-B Nos. 5-13514 and 5-19702 also can be preferably used.

Still furthermore, examples of preferable dyes include near-IR absorbing dyes described as formulae (I) and (II) in U.S. Pat. No. 4,756,993, and phthalocyanine-based dyes described in EP No. 916513A2.

Furthermore, anionic IR absorbing agents set forth in Japanese Patent Application No. 10-79912 also can be preferably used. The anionic IR absorbing agent indicates one that does not have a cationic structure but has an anionic structure in a mother nucleus of a dye that substantially absorbs an IR ray. Examples thereof include compounds such as (c1) anionic metal complexes, (c2) anionic carbon blacks, (c3) anionic phthalocyanines, and furthermore (c4) compounds represented by the following general formula (21). The cation pair of the anionic IR absorbing agents is a monovalent positive ion including proton or a multivalent positive ion.

General formula (21)

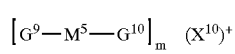

Here, (c1) the anionic metal complex indicates one in which a central metal of a complex portion that substantially absorbs light and a ligand become an anion as a whole.

Examples of the (c2) anionic carbon black include the carbon blacks having, as a substituent group, an anionic group such as sulfonic acid, carboxylic acid, or phosphonic acid group. In order to introduce the groups in the carbon black, methods of oxidizing carbon black with a desired acid as described in Carbon Black Kyoukai ed., *Carbon Black Binran (Handbook of Carbon Blacks)*, 3rd ed., Carbon Black Kyoukai, 5 Apr., 1995, pp 12 can be applied.

The (c3) anionic phthalocyanine is a phthalocyanine skeleton having the anion group set forth in the explanation of the (c2) as a substituent group and forms an anion as a whole.

The compounds (c4) represented by general formula (21) will be described in detail. In general formula (21) above, $G^9$ represents an anionic substituent group, and $G^{10}$ represents a neutral substituent group. $(X^{10})^+$ represents a from 1- to m-valent cation including a proton; and m represents an integer of 1 to 6. $M^5$ represents a conjugate chain, and the conjugate chain $M^5$ may have a substituent group and a cyclic structure. The conjugate chain $M^5$ can be represented by the following formula.

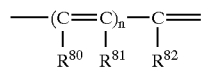

In the above formula, $R^{80}$, $R^{81}$ and $R^{82}$ each independently represents a hydrogen atom, halogen atom, cyano group, alkyl group, aryl group, alkenyl group, alkynyl group, carbonyl group, thio group, sulfonyl group, sulfinyl group, oxy group or amino group, and these may bond each other to form a ring structure. Here, n represents an integer of 1 to 8.

Of the anionic infrared absorbing agents represented by general formula (21), the following IRA-1 to IRA-5 can be preferably used.

IRA-1

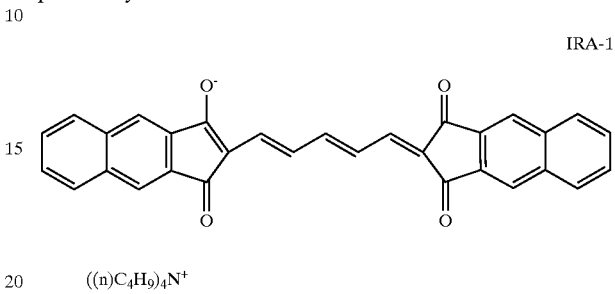

$((n)C_4H_9)_4N^+$

IRA-2

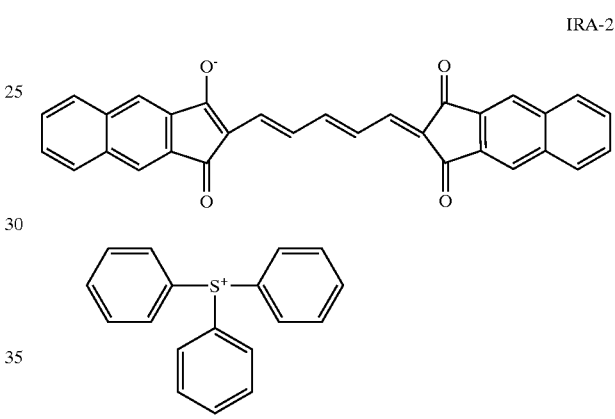

IRA-3

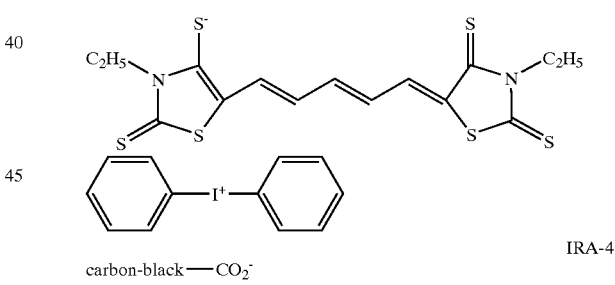

carbon-black—$CO_2^-$

IRA-4

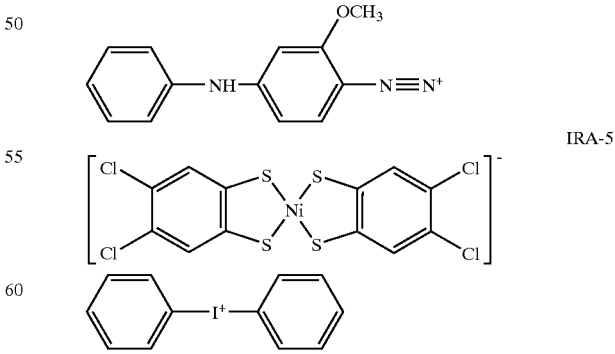

IRA-5

Furthermore, cationic infrared absorbing agents represented by the following IRC-1 to IRC-44 can be also preferably used.

IRC-1
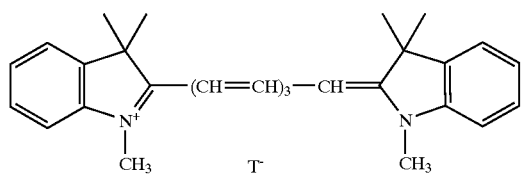
IRC-2
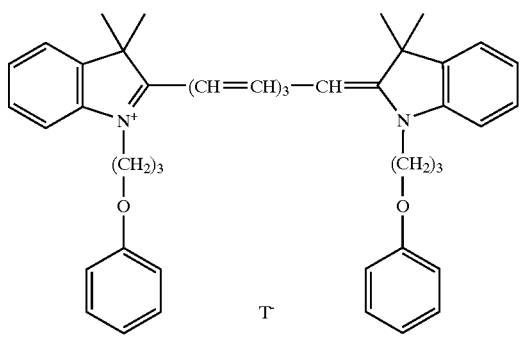
IRC-3
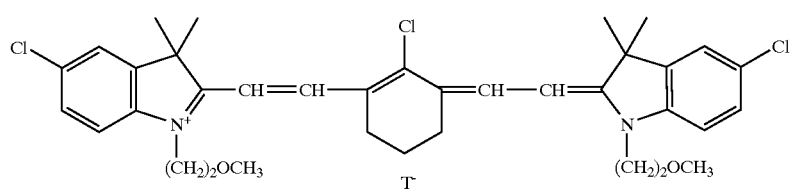
IRC-4
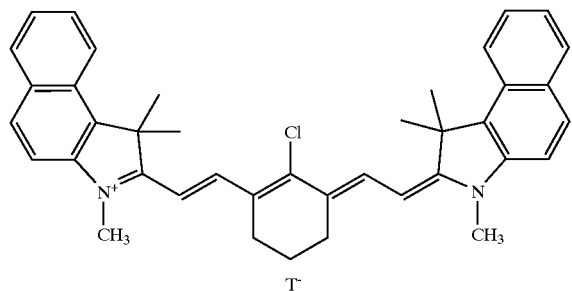
IRC-5
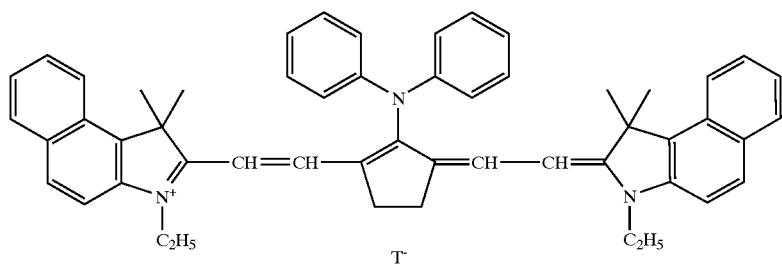
IRC-6
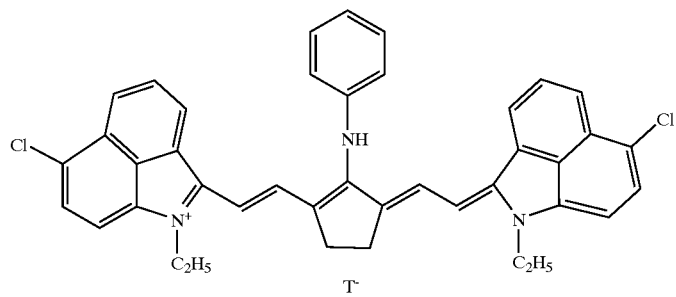
IRC-7
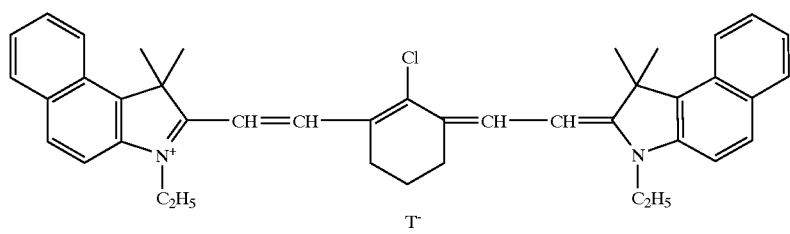

-continued
IRC-8
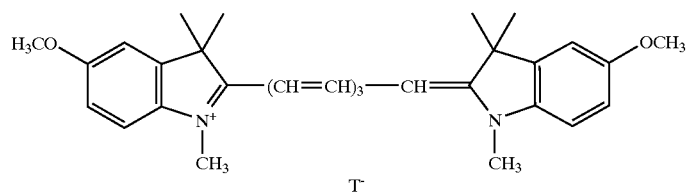
IRC-9
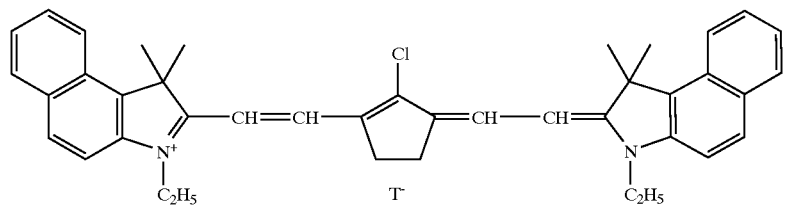
IRC-10
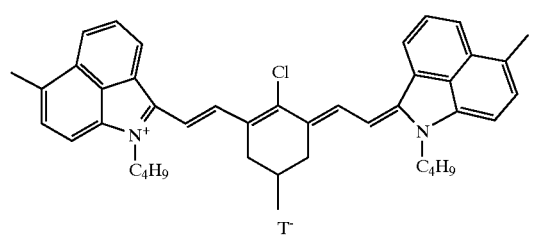
IRC-11
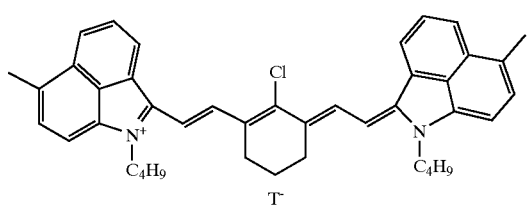
IRC-12
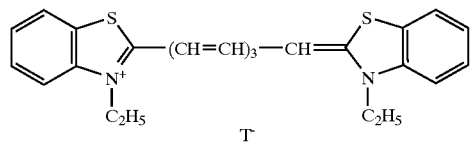
IRC-13
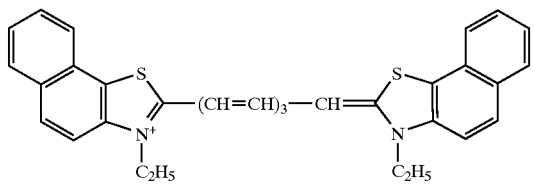
IRC-14
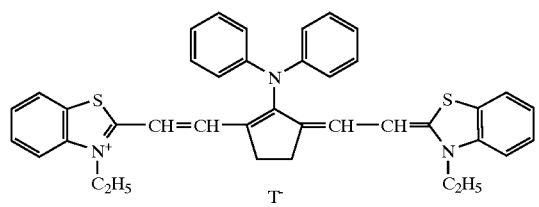
IRC-15
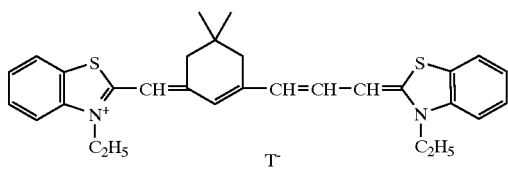
IRC-16
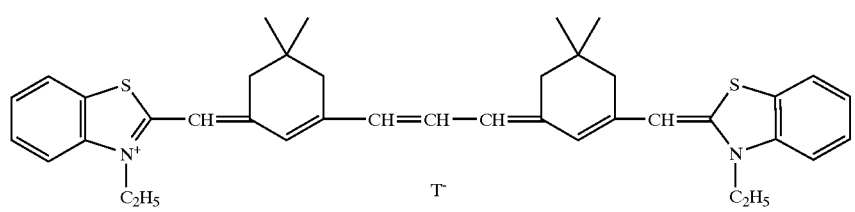
IRC-17
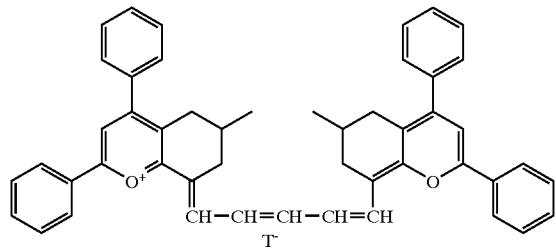
IRC-18
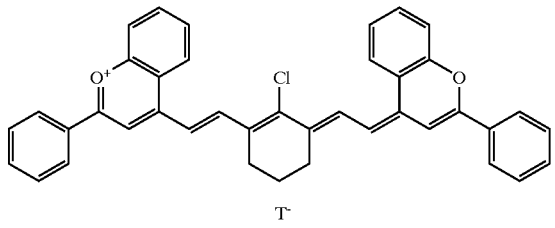

-continued
IRC-19
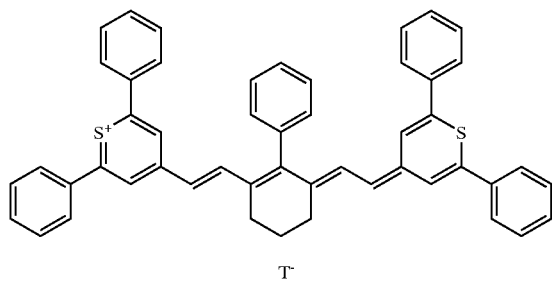
T⁻
IRC-20
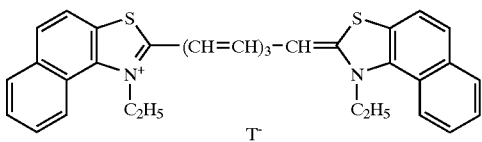
T⁻
IRC-21
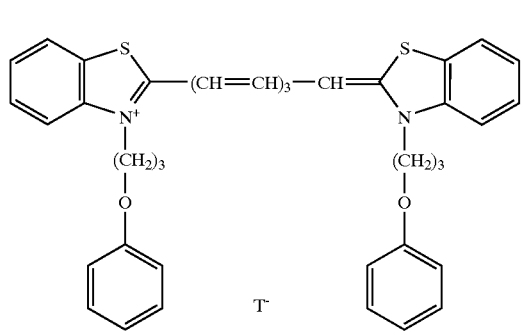
T⁻
IRC-22
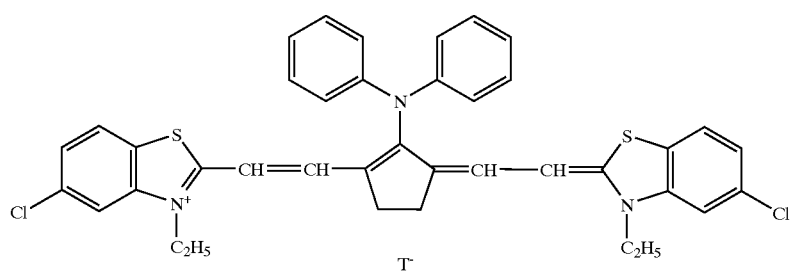
T⁻
IRC-23
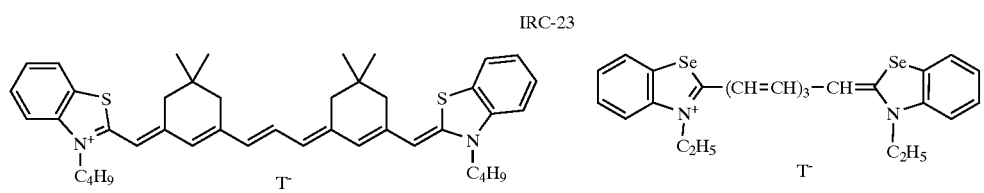
T⁻
IRC-24
T⁻
IRC-25
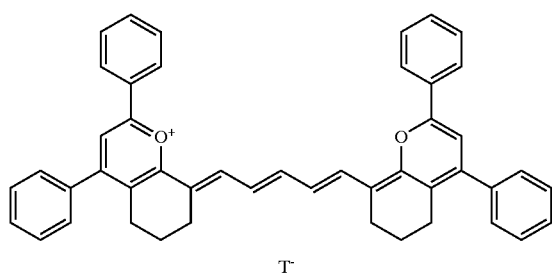
T⁻
IRC-26
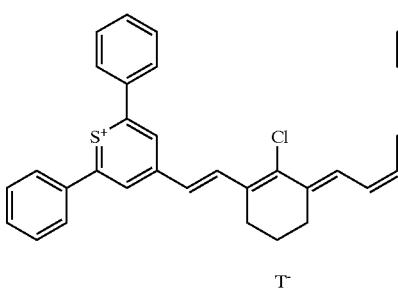
T⁻
IRC-27
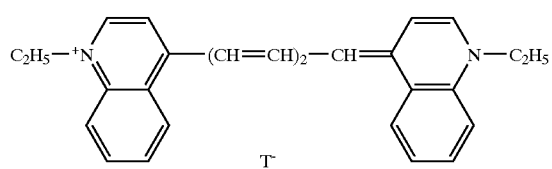
T⁻
IRC-28
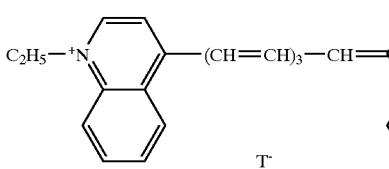
T⁻

-continued
IRC-29
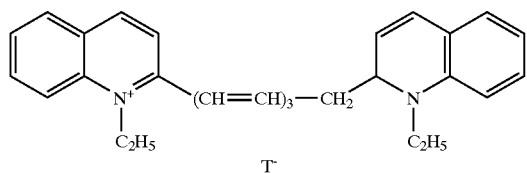
IRC-30
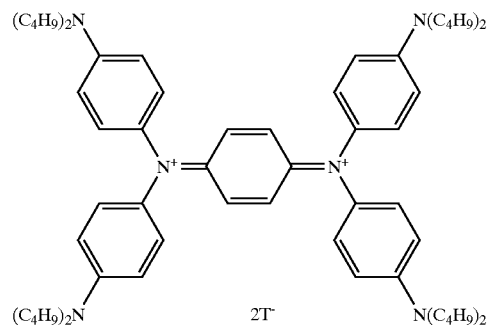
IRC-31
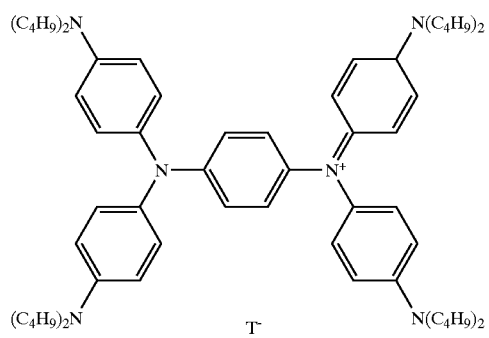
IRC-32
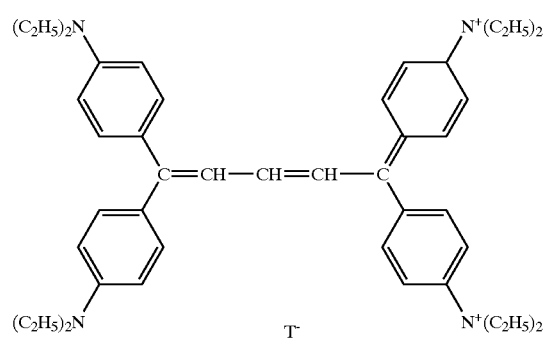
IRC-33
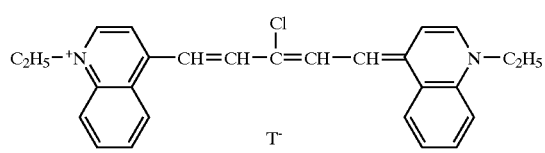
IRC-34
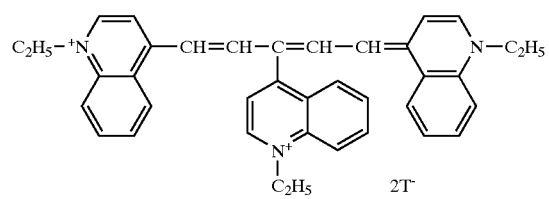
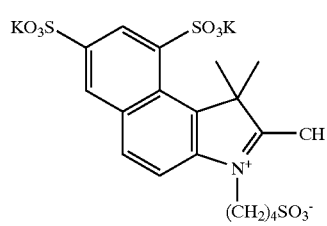
IRC-35
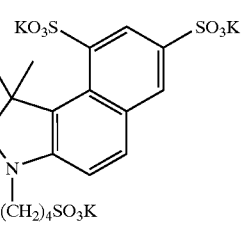
IRC-36
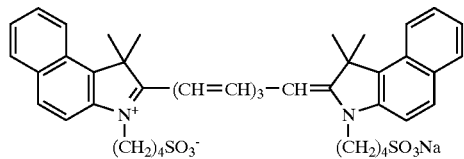
IRC-37
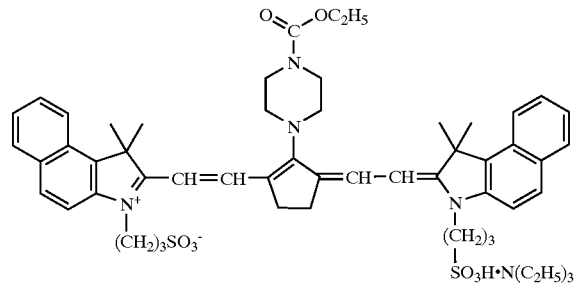

-continued
IRC-38
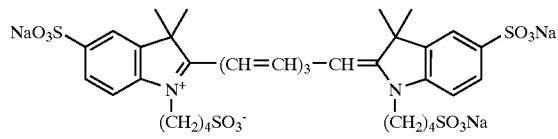
IRC-39
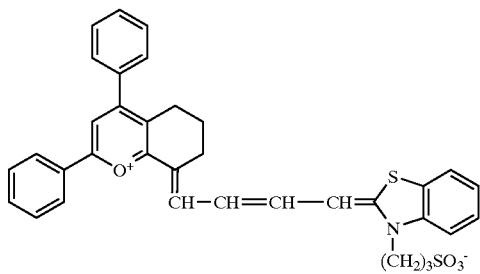
IRC-40
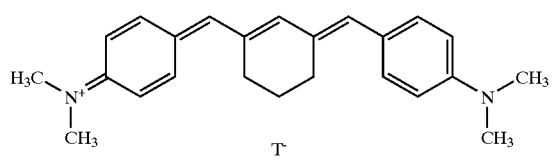
IRC-41
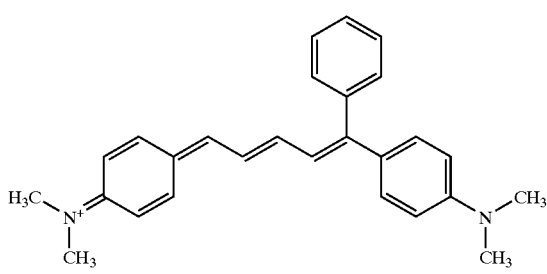
IRC-42
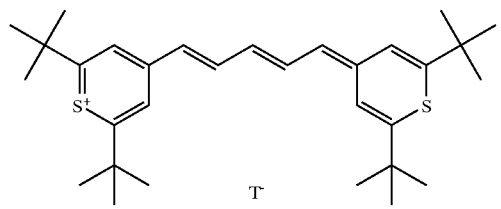
IRC-43
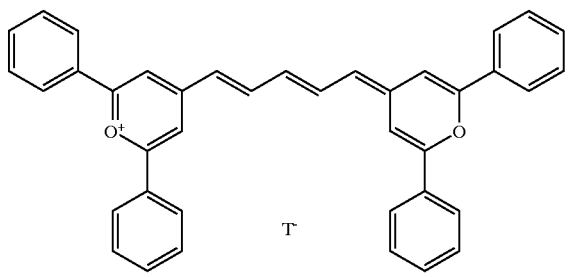
IRC-44
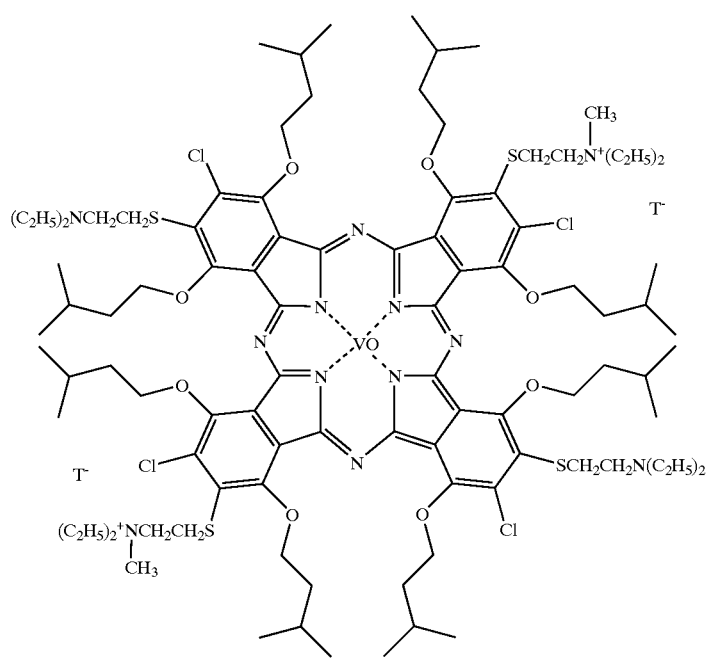
In the structural formulae, T⁻ represents a monovalent pairing anion, preferably of a halogen anion (F⁻, Cl⁻, Br⁻, I⁻), Lewis acid anion ($BF_4^-$, $PF_6^-$, $SbCl_6^-$, $ClO_4^-$), alkylsulfonic acid anion, or arylsulfonic acid anion.

The alkyl of the alkylsulfonic acid means a straight chain, a branched chain or a cyclic alkyl group having 1 to 20 carbon atoms. Specific examples thereof include a methyl group, ethyl group, propyl group, butyl group, pentyl group, hexyl group, heptyl group, octyl group, nonyl group, decyl group, undecyl group, dodecyl group, tridecyl group, hexadecyl group, octadecyl group, eicosyl group, isopropyl group, isobutyl group, s-butyl group, t-butyl group, isopentyl group, neopentyl group, 1-methylbutyl group, isohexyl group, 2-ethylhexyl group, 2-methylhexyl group, cyclohexyl group, cyclopentyl group, and 2-norbornyl group. Among these, alkyl groups of straight chain having 1 to 12 carbon atoms, branched chain having 3 to 12 carbon atoms, and ring having 5 to 10 carbon atoms are more preferable.

Examples of aryl group of the aryl sulfonic acid include those having one benzene ring, those having 2 or 3 benzene rings forming a condensed ring, or those having a benzene ring and a 5-membered unsaturated ring forming a condensed ring. Specific examples of the aryl group include a phenyl group, naphthyl group, anthryl group, phenanthryl group, indenyl group, acenabutenyl group, and fluorenyl group. Among these, a phenyl group and naphthyl group are more preferable.

Furthermore, non-ionic infrared absorbing agents represented by the following IRN-1 to IRN-9 can be also preferably used.

IRN-1
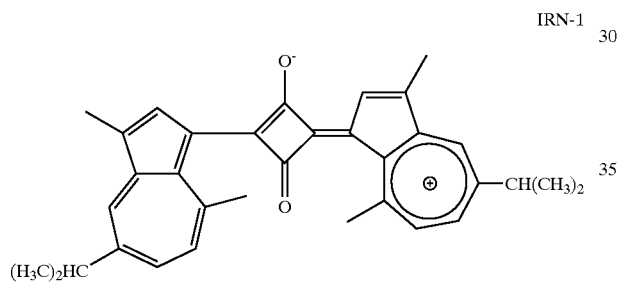

IRN-2
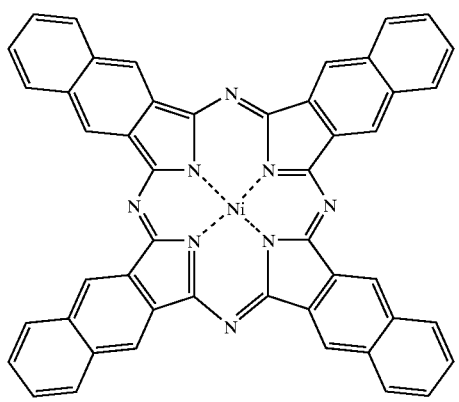

IRN-3
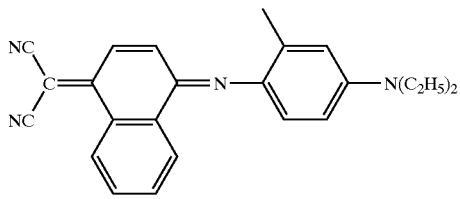

IRN-4
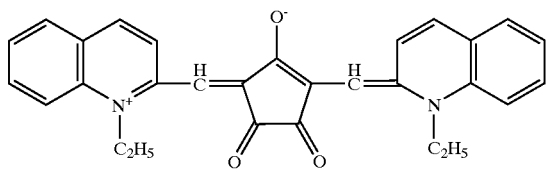

IRN-5
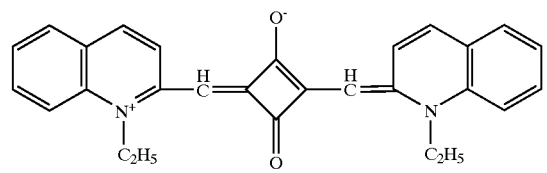

IRN-6
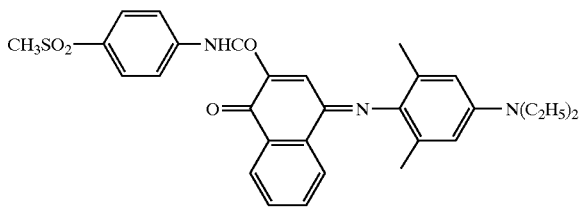

IRN-7
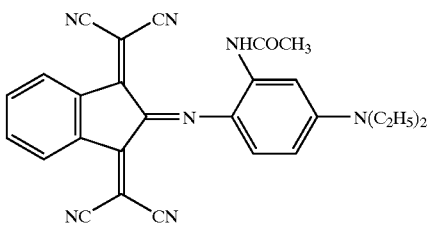

IRN-8
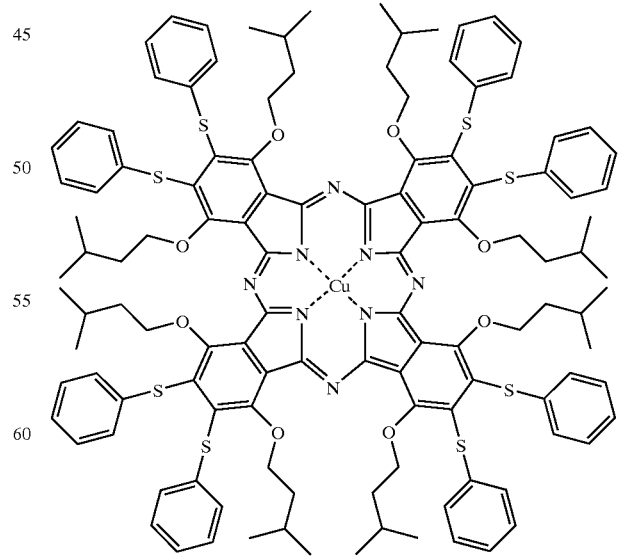

-continued

IRN-9

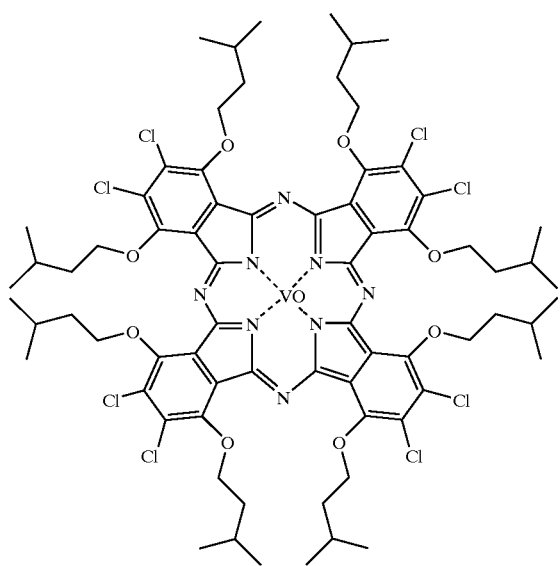

Among the above-mentioned compounds, examples of the particularly preferable anionic infrared absorbing agent include IRA-1, as the cationic infrared absorbing agents, IRC-7, IRC-30, IRC-40 and IRC-42, and as the non-ionic infrared absorbing agent, IRN-9.

<Pigment>

Pigments used in the invention include commercially available pigments and pigments described in Nihon Ganryou Gijutsu Kyoukai, ed., *Color index (C. I.) binran (Color index handbook)* and *Saishin ganryou binran (Handbook of modem pigments)*, 1977, *Saishin ganryou ouyou gijutsu (Modern technology of application of pigments)*, CMC, 1986, and *Insatsu inki gijutsu (Printing ink technology)*, CMC, 1984.

Examples of the pigments include a black pigment, yellow pigment, orange pigment, brown pigment, red pigment, violet pigment, blue pigment, green pigment, fluorescent pigment, metal powder pigment, and additionally, polymer-bound dyes. Specific examples thereof include an insoluble azo pigment, azolake pigment, condensed azo pigment, chelate azo pigment, phthalocyanine-based pigment, anthraquinone-based pigment, perylene and perynone-based pigment, thioindigo-based pigment, quinacridone-based pigment, dioxazine-based pigment, isoindolinone-based pigment, quinophthalone-based pigment, dyeing lake pigment, azine pigment, nitroso pigment, nitro pigment, natural pigment, fluorescent pigment, inorganic pigment and carbon black. Of these pigments, carbon black is preferable.

These pigments may be used without or with surface treatment applied. As the surface treatment method, a method of applying surface coating of a resin or wax, a method of adhering a surfactant, a method of bonding a reactive substance (for example, a silane coupling agent, epoxy compound, polyisocyanate and the like) on the pigment surface, and the like can be considered. The above-mentioned surface treatment methods are described in *Kinzoku Sekken no seishitsu to ouyou (Properties and application of metallic soap)*, Saiwai Shobou, *Insatsu inki gijutsu (Printing ink technology)*, CMC, 1984, and *Saishin ganryou ouyou gijutsu (Modern technology of application of pigments)* CMC, 1986.

The particle diameter of the pigment is preferably in a range of 0.01 to 10 µm, more preferably 0.05 to 1 µm, and particularly preferably 0.1 to 1 µm. When the particle diameter of the pigment is less than 0.01 µm, the material dispersed in an image-recording layer coating solution is not preferable from a viewpoint of the stability, and when the particle diameter is over 10 µm, uniformity of the image-recording layer is not preferable.

As a method of dispersing the pigment, known dispersing technologies used to produce ink, toner and the like can be used. Examples of the dispersing machine include an ultrasonic disperser, sand mill, attriter, pearl mill, super mill, ball mill, impeller, disperser, KD mill, colloid mill, dynatron, three roll mill, and press kneader. The details thereof are described in *Saishin ganryou ouyou gijutsu (Modern technology of application of pigments)* CMC, 1986.

A sensitizing dye being added to accelerate the curing reaction of the photo- or thermo-polymerizable composition according to the invention may be directly added in the composition together with other components. However, when another layer is disposed adjacently thereto and the sensitizing dye is added thereto, a similar effect can be obtained.

In particular, when the photo- or thermo-polymerizable composition according to the invention is used in a negative image-recording layer of a planographic printing plate precursor described later, the sensitizing dye may be added to a layer the same as the image-recording layer, or by disposing another layer, may be added thereto. However, when the negative image-recording material is prepared, the optical density at the absorption maximum in the range of wavelength of 300 to 1200 nm of the recording layer is preferably in a range of 0.1 to 3.0. When deviating from the range, the sensitivity tends to become lower. Since the optical density is determined depending on an amount of the sensitizing dye added and a thickness of the recording layer, a predetermined optical density can be obtained by controlling the conditions of both. The optical density of a recording layer can be measured according to an ordinary method. Examples of the measuring method include a method of forming, on a transparent or white support, a recording layer having a thickness that is appropriately determined in a range in which a coating amount after drying is that required for a planographic printing plate, and measuring the optical density with a transmission-type optical densitometer, and a method of forming a recording layer on a reflective support such as aluminum, and measuring the reflection density thereof.

When a sensitizing dye is used, a molar ratio of the polymerization initiator to the sensitizing dye in the polymerizable composition is from 100:0 to 1:99, more preferably from 90:10 to 10:90, and most preferably from 80:20 to 20:80.

Furthermore, in the polymerizable composition according to the invention, in order to further improve the sensitivity or to suppress the polymerization hindrance due to oxygen from occurring, known compounds having the above functions may be added as a co-sensitizing agent.

Examples of such co-sensitizing agents include such as amines such as compounds described in M. R. Sander et al, Journal of Polymer Society, 10, 3173 (1972), JP-B No. 44-20189, JP-A Nos.51-82102, 52-134692, 59-138205, 60-84305, 62-18537, and 64-33104, and Research Disclosure 33825. Specific examples include triethanol amine, p-dimethylamino-benzoic acid ethyl ester, p-formyldimethyl aniline, and p-methylthiodimethyl aniline.

Other examples of the co-sensitizing agents include such as thiols and sulfides, such as thiol compounds described in JP-A No. 53-702, JP-B No. 55-500806 and JP-A No.

5-142772, and disulfide compounds described in JP-A No. 56-75643. Specific examples thereof include 2-mercaptobenzothiazole, 2-mercaptobenzooxazole, 2-mercaptobenzoimidazole, 2-mercapto-4(3H)-quinazoline and β-mercaptonaphthalene.

Other examples include amino acid compounds (for instance, N-phenylglycine and so on), organometallic compounds described in JP-B No. 48-42965 (for instance, tributyl tin acetate and so on), hydrogen donators described in JP-B No. 55-34414, sulfur compounds described in Japanese Patent No. 3112771 (for instance, trithiane and so on), phosphorus compounds described in JP-A No. 6-250389 (diethyl phosphite and so on) and Si—H, Ge—H compounds described in JP-A No. 8-065779 and so on.

When the co-sensitizing agent is used, it is appropriate to use it in an amount of 0.01 to 50 parts by weight based on one parts by weight of the polymerization initiator, more preferably by 0.02 to 20 parts by weight, and most preferably by 0.05 to 10 parts by weight.

In the polymerizable composition according to the invention, a linear organic polymer is preferably contained as a binder. As such "linear organic polymer", as far as it is a linear organic polymer that has the compatibility with a photo-polymerizable ethylenic unsaturated compound, whatever linear organic compounds may be used. Because the solubility or swelling property in water or a weak alkaline aqueous solution allows to perform water development or weak alkaline aqueous solution development, a linear organic polymer that is soluble or swelling in water or a weak alkaline aqueous solution is preferably selected. The linear organic polymer can be selected in accordance with whichever of water, a weak alkaline aqueous solution or an organic solvent is used as a developer. For instance, when a water-soluble organic polymer is used, water development can be realized. Examples of such linear organic polymers include addition polymers having a carboxylic acid group on a side chain such as described in JP-A No. 59-44615, JP-B Nos.54-34327, 58-12577 and 54-25957, JP-A Nos.54-92723, 59-53836 and 59-71048, that is, methacrylic acid copolymers, acrylic acid copolymers, itaconic acid copolymers, crotonic acid copolymers, maleic acid copolymers, and partially esterified maleic acid copolymers. Furthermore, there are acidic cellulose derivatives that similarly have a carboxylic acid group on a side chain. Other than these, one in which a cyclic acid anhydride is added to an addition polymer having a hydroxyl group is useful.

In particular, among these, a [benzil(meth)acrylate/(meth) acrylic acid/at need, other addition polymerizable vinyl monomer] copolymer and [aryl(meth)acrylate/(meth)acrylic acid/at need, other addition polymerizable vinyl monomer] copolymer are preferable. Other than these, as water-soluble linear polymers, polyvinyl pyrrolidone and polyethylene oxide are useful. Furthermore, in order to improve the strength of the cured coating, alcohol-soluble polyamides and polyethers of 2,2-bis-(4-hydroxyphenyl)-propane and epichlorohydrin are also useful.

An amount of the other known binder to be used is 40% by mass or less based on a total amount of the polymerizable composition, preferably 30% by mass or less, and further preferably 20% by mass or less. When it is 40% by mass or more, the coating property deteriorates, and storage stability and press life tend to deteriorate.

In the polymerizable composition according to the invention, in order to inhibit the compound that is contained in the composition and has a polymerizable ethylenic unsaturated double bond from undergoing unnecessary thermal polymerization during the manufacture or storage thereof, a slight amount of a thermal polymerization inhibitor is preferably added.

Examples of suitable thermal polymerization inhibitors include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol) and N-nitrosophenylhydroxyamine cerous salt.

An amount of the thermal polymerization inhibitor to be added is preferably approximately in a range of 0.01 to 5% by mass based on a total solid component in the polymerizable composition.

Furthermore, if necessary, in order to inhibit the polymerization inhibition due to oxygen from occurring, behenic acid or a higher fatty acid derivative such as behenic acid amide may be added and allowed to localize on the photosensitive layer surface during the drying step after the coating. An amount of the higher fatty acid derivative to be added is preferably approximately in a range of 0.5 to 10% by mass in a total composition.

Furthermore, when the polymerizable composition according to the invention is applied to a recording layer of a planographic printing plate precursor, with an intention of coloring the recording layer, a dye or pigment may be added. Thereby, the plate inspecting properties such as the visibility after the plate making and the image densitometer aptitude can be improved. As a coloring agent used here, a pigment is particularly preferably used. This is because many of the dyes tend to cause the lowering of the exposure sensitivity of the polymerizable composition. When the dye is used as the coloring agent, this point is also considered. Specific examples of the coloring agent include pigments such as phthalocyanine-based pigments, azoic pigments, carbon blacks, and titanium oxide, and dyes such as ethyl violet, crystal violet, azoic dyes, anthraquinone-based dyes and cyanine-based dyes. An amount of the dye and pigment to be added is preferably approximately in a range of 0.5 to 5% by mass in a total composition.

—Other Additives—

Furthermore, other than the above additives, in order to improve characteristics as an image recording material, and furthermore to improve the physical properties of the cured coating, known additives such as an inorganic filler, plasticizer and a sensitizing solution capable of improving the inking property of the recording layer surface may be added.

Examples of the plasticizer include, for instance, dioctyl phthalate, didodecyl phthalate, triethylene glycol dicaprylate, dimethyl glycol phthalate, tricredyl phosphate, dioctyl adipate, dibutyl sebacate and triacetyl glycerin. When a binder is used, the plasticizer can be added by 10% by mass or less based on a total weight of the compound that has the ethylenic unsaturated double bond and the binder.

Furthermore, in order to intensify the effect of heating and exposure that are applied after the development to improve the film strength (press life) described later, additives such as a UV initiator and thermal-crosslinking agent may be used.

When the polymerizable composition according to the invention is used as a planographic printing plate precursor, in order to improve the intimate contact between a recording layer and a support and in order to heighten the developing property (removability) in a unexposed area of the recording layer, an intermediate layer may be disposed therebetween. Furthermore, to the recording layer, a compound that can interact with a substrate of the support may be added. Examples of such compounds include compounds having a diazonium structure and phophone compounds. These can be used by adding to the recording layer or by adding to an undercoat layer coating composition, and thereby the intimate contact is improved and press life can be heightened. Furthermore, in order to improve the removability of a non-image area, a hydrophilic polymer such as polyacrylic acid or polysulfonic acid may be added or an undercoat layer containing these may be formed. Thereby, the developability of the non-image area can be improved and the stains of the non-image area can be effectively suppressed from occurring.

When the polymerizable composition according to the invention is coated on a support and formed into a recording layer, the polymerizable composition may be dissolved in various kinds of organic solvents and used.

Examples of the solvent to be used include acetone, methyl ethyl ketone, cyclohexanone, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetyl acetone, cyclohexanone, diacetone alcohol, ethylene glycol monoethyl ether acetate, ethylene glycol ethyl ether acetate, ethylene glycol monoisopropyl ether, ethylene glycol monobutyl ether acetate, 3-methoxypropanol, methoxymethoxy ethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethylsulfoxide, γ-butyrolactone, methyl lactate, and ethyl lactate. These solvents can be used singly or in combination. A concentration of solid components in the coating solution is suitably in a range of 2 to 50% by mass.

A coating amount of the recording layer, which can mainly affect on the sensitivity of a photosensitive layer, the developability, and the strength and press life of the exposed film, is desirable to be selected in accordance with applications. When a covering amount is too small, press life tends to deteriorate. On the other hand, when it is too much, in addition to the sensitivity becoming lower and the exposure taking a longer time period, the development also takes a longer time period. A recording layer coating amount when the polymerizable composition according to the invention is used as a planographic printing plate precursor for use in scan exposure is preferably approximately in a range of 0.1 to 10 g/m² as a dry coating weight, and more preferably in a range of 0.5 to 5 g/m².

[Support]

As a support that can be used in an image recording material thereto the polymerizable composition according to the invention is applied, one whose surface is hydrophilic is preferable, and as far as it is a so far known hydrophilic support that can be used in the planographic printing plate, it can be used without particular limitation.

The support substrate is preferably a planar substance stable in the dimension, and examples thereof include paper, paper laminated with plastic (for instance, polyethylene, polypropylene, polystyrene and so on), metal plate (for instance, aluminum, zinc, copper and so on), plastic film (for instance, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal and so on), and paper or plastic film thereon the metal mentioned above is laminated or vapor deposited. The surface of the support may be subjected to appropriate known physical or chemical treatment to endow with hydrophilic property or to improve the strength when necessary.

Examples of particularly preferable supports include paper, polyester film or aluminum plate. Among these, the aluminum plate that is excellent in the dimensional stability, relatively less expensive, and can supply a surface that is excellent in the hydrophilic property and the strength owing to the surface treatment in accordance with the necessity is particularly preferable.

Furthermore, a composite sheet in which an aluminum sheet is laminated onto a polyethylene terephthalate film described in JP-B No. 48-18327 is preferable.

A preferable aluminum plate is a pure aluminum plate and an alloy plate that is mainly made of aluminum and slightly contains foreign elements, and furthermore a plastic film thereon aluminum is laminated or vapor deposited may be used. The foreign elements contained in the aluminum alloy include silicon, iron, manganese, copper, magnesium, chromium, zinc, bismuth, nickel, titanium and so on. A content of the foreign elements in the alloy is at most 10% by mass or less. Aluminum particularly preferable in the invention is pure aluminum. However, since perfectly pure aluminum is very difficult to produce from a viewpoint of smelting technology, one that contains foreign elements slightly can be allowed.

Thus, the aluminum plate that can be applied to the invention is not particularly specified in the composition thereof, but the aluminum plate made of so far known material can be utilized. A thickness of the aluminum plate used in the invention is approximately in a range of 0.1 to 0.6 mm, preferably 0.15 to 0.4 mm, and particularly preferably 0.2 to 0.3 mm.

Furthermore, in particular in the case of a support that has an aluminum surface, it is preferable that the surface treatment such as surface roughening treatment (graining), immersion treatment in an aqueous solution of sodium silicate, potassium zirconate fluoride, or phosphate, or anodic oxidation has been applied.

The roughening of the surface of the aluminum plate can be performed according to various methods. For instance, a method of mechanically roughening a surface, a method of electrochemically dissolving and roughening a surface, and a method of chemically selectively dissolving a surface can be applied. As the mechanical method, known methods such as ball polishing, brush polishing, blast polishing and buff polishing method can be used. Furthermore, as the electrochemical roughening method, there is a method in which the roughening is applied by passing an alternating current or direct current through an electrolytic solution of hydrochloric acid or nitric acid. As disclosed in JP-A No. 54-63902, both of these surface-roughening methods may be used in combination. Furthermore, prior to the roughening treatment of an aluminum plate in order to remove rolling oil on the surface thereof, degreasing treatment with, for instance, a surfactant, organic solvent or alkaline aqueous solution may be applied when necessary.

Furthermore, the aluminum plate that is subjected, after the surface roughening, to the immersion treatment in a sodium silicate aqueous solution and thereby the surface thereof is rendered hydrophilic can be preferably used. For instance, as described in JP-B No. 47-5125, an aluminum plate that is, after the anodic oxidation, immersed in an alkali metal silicate aqueous solution can be preferably used. The anodic oxidation can be performed, for example, by passing a current, with the aluminum plate as an anode, through an electrolytic solution of one or more kinds of aqueous or non-aqueous solutions of inorganic acids, such as phosphoric acid, chromic acid, sulfuric acid and boric acid, organic acids, such as oxalic acid and sulfamic acid, or salts thereof.

As such treatment that renders the support surface hydrophilic due to silicate compound, silicate electrodeposition such as described in U.S. Pat. No. 3,658,662 is effective. Furthermore, surface treatment in which a support thereto electrolytic graining such as described in JP-B No. 46-27481 and JP-A Nos.52-58602 and 52-30503 is applied is further subjected to the anodic oxidation and sodium silicate treatment is also useful.

Furthermore, one that is described in JP-A No. 56-28893 and in which the mechanical surface roughening, the chemical etching, the electrolytic graining, the anodic oxidation and the sodium silicate treatment are sequentially applied is also preferable.

Still furthermore, one in which after these treatments, water-soluble resins such as polyvinyl phosphonic acid, polymers and copolymers having a sulfonic acid group on a side chain and polyacrylic acid, water-soluble metal salts (for instance, zinc borate) or yellow dye, amine salts are undercoated is also preferable.

Another example of the treatment that renders a support surface hydrophilic is a sol-gel treatment in which a covalent bond is formed with a functional group that can cause an addition reaction by a radical as described in Japanese Patent No. 3223222.

Another preferable example is any support on which a waterproof hydrophilic layer is disposed as a surface layer. Examples of such surface layers include a layer that is described in, for instance, U.S. Pat. No. 3,055,295 and JP-A No. 56-13168 and made of an inorganic pigment and a binder, a hydrophilic swelling layer described in JP-A No. 9-80744, and a sol-gel film described in JP-T No. 8-507727 and made of titanium oxide, polyvinyl alcohol and silicic acid.

These treatments that renders hydrophilic, other than being applied to render the surface of the support hydrophilic, are applied to inhibit the polymerizable composition disposed thereon from detrimentally reacting and to improve the intimate contact of the photosensitive layer.

[Protective Layer]

A protective layer may be disposed on the recording layer containing the polymerizable composition of the invention when necessary. Such planographic printing plate precursor is usually exposed in the air. Accordingly, the protective layer has a function of inhibiting lower molecular weight compounds such as oxygen and basic substances that are present in the air and disturb image formation reaction generated by exposure in the photosensitive layer from entering into the photosensitive layer, and thereby suppressing the image formation reaction due to the exposure in the air from being disturbed. Accordingly, the characteristics desired for such protective layer are low transmittance of low molecular weight compounds such as oxygen, excellent transmittance of light that is used in exposure, excellent adherence with the photosensitive layer, and easy removal in the development step after the exposure.

Such devices as to the protective layer have been so far made and are detailed in U.S. Pat. No. 3,458,311 and JP-A No. 55-49729. As materials that can be used in the protective layer, for instance, water-soluble polymer compounds that are relatively excellent in the crystallinity can be well used. As specific examples thereof, water-soluble polymers such as polyvinyl alcohol, polyvinyl pyrrolidone, acidic celluloses, gelatin, gum arabic, and polyacrylic acid are known. When, among these, polyvinyl alcohol is used as a main component, from a viewpoint of the fundamental characteristics such as the oxygen-shielding property and the development removability, the most excellent results are generated. The polyvinyl alcohol used in the protective layer possesses the necessary oxygen shielding property and the water-solubility. Accordingly, as far as an unsubstituted vinyl alcohol unit is contained, it may be partially substituted by ester, ether and acetal. Furthermore, similarly, part thereof may have another copolymer component.

Specific examples of the polyvinyl alcohol include those that are hydrolyzed by 71 to 100% and have a molecular weight in a range of 300 to 2400. Specific examples available from Kuraray Co,. Ltd. include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613, and L-8.

Components (selection of PVA, use of additives) and the coating amount of the protective layer are selected in consideration of, in addition to the oxygen shielding property and the development removability, the fogging property, the intimate contact property and the bruise resistance. In general, the higher the hydrolysis rate of the PVA being used is (the higher the content of unsubstituted vinyl alcohol unit in the protective layer is) and the thicker the film thickness is, the higher becomes the oxygen shielding property; accordingly, the more advantageous is from the standpoint of sensitivity. However, when the oxygen shielding property is excessively heightened, there are problems in that during the manufacture and raw storage, unnecessary polymerization reaction may be caused, and during image exposure, unnecessary fogging and a fat image line may be caused. Furthermore, the intimate contact with the image area and the bruise resistance are also very important from a viewpoint of plate handling. That is, when a hydrophilic layer made of a water-soluble polymer is laminated on a lipophilic polymerization layer, a film is likely to be peeled owing to adherence deficiency, and the peeled area causes defects such as curing failure owing to polymerization inhibition due to oxygen.

For this, in order to improve the adherence between two layers, various kinds of proposals have been submitted. For instance, U.S. Pat. Nos. 292,501 and 44,563 describe that when in a hydrophilic polymer mainly made of polyvinyl alcohol, from 20 to 60% by mass of acrylic emulsion or water-insoluble vinyl pyrrolidone-vinyl acetate copolymer is mixed and this mixture is laminated on a polymerization layer, sufficient adherence can be obtained. For the protective layer in the invention, all of the known techniques can be applied. Coating methods of such protective layers are detailed in, for instance, U.S. Pat. No. 3,458,311 and JP-A No. 55-49729.

Furthermore, another function can be given to the protective layer. For instance, when a coloring agent (water-soluble dye or the like) that is excellent in the transmittance of light used for exposure (for instance, light in a wavelength range of 760 to 1200 nm when an infrared laser is used) and can efficiently absorb light in the wavelength that is not involved in the exposure is added, without causing the lowering of the sensitivity, the safelight aptitude can be further heightened.

Still furthermore, still another function can be given to the protective layer. For instance, when laser light is used as a light source, in some cases, the photosensitive composition is desired to be excellently photosensitive in the wavelength of the light source but not in other wavelength. For instance, when the light source is one that emits in an infrared region of 750 nm or more, it can be used in a practically lighted room. However, actually, in some cases, even shorter wavelength light such as that of a fluorescent lamp is sensed. In such cases, a coloring agent (water-soluble dye or the like)

that is excellent in the transmittance of light of the light source and can efficiently absorb light in the wavelength of less than 700 nm is preferably added. As still another example, when a light source is one that radiates in a ultra-violet region of 450 nm or less, it can be used practically under safelight. However, in actual, in some cases, visible light of 500 nm or more can be sensed. In such case, when a coloring agent (water-soluble dye or the like) that is excellent in the transmittance of light of the light source and can efficiently absorb light in the wavelength of 500 nm or more is added, without causing lowering of the sensitivity, the safelight aptitude can be further heightened.

Known methods can be used without limitation for exposing polymerizable compositions of the invention to polymerize and cure. A preferable light source for exposure is a laser. It is possible to utilize the following lasers as available laser light sources in a wavelength of 350 to 450 nm.

Examples of gas lasers include an Ar ion laser (364 nm, 351 nm, from 10 mW to 1 W), Kr ion laser (356 nm, 351 nm, from 10 mW to 1 W), and He-Cd laser (441 nm, 325 nm, from 1 mW to 100 mW); examples of solid lasers include a Nd: combination of YAG ($YVO_4$) and a SHG crystal (twice) (355 nm, from 5 mW to 1 W) and Cr: combination of LiSAF and an SHG crystal (430 nm, 10 mW); examples of semiconductor laser include $KnbO_3$, ring resonator (430 nm, 30 mW), a combination of a waveguide-type wavelength converter with AlGaAs and InGaAs semiconductors (from 380 to 450 nm, from 5 mW to 100 mW), a combination of a waveguide-type wavelength converter with AlGaInP and AlGaAs semiconductors (from 300 to 350 nm, from 5 mW to 100 mW), and AlGaInN (from 350 to 450 rm, 5 mW to 30 mW); and examples of pulse lasers include a $N_2$ laser (337 nm, from 0.1 to 10 mJ pulse) and XeF (351 nm, from 10 to 250 mJ pulse).

In particular, of these lasers, AlGaInN semiconductor laser (commercially available semiconductor laser of InGaN type, from 400 to 410 nm, from 5 to 30 mW) is advantageous from the viewpoints of wavelength characteristics and cost.

Other than the above, as the light sources available in a range of 450 to 700 nm, an $Ar^+$ laser (488 nm), YAG-SHG laser (532 nm), He—Ne laser (633 nm), He—Cd laser, and red semiconductor laser (from 650 to 690 nm), and as the light sources available in a range of 700 to 1200 nm, semiconductor laser (from 800 to 850 nm) and Nd-YAG laser (1064 nm) can be preferably used.

Other than the above, a ultrahigh pressure mercury lamp, high-pressure mercury lamp, medium-pressure mercury lamp and low-pressure mercury lamp, chemical lamp, carbon arc lamp, Xenon lamp, metal halide lamp, ultra-violet laser lamp (ArF excimer laser, KrF excimer lamp and so on), and radiation such as an electron beam, X-ray, ion beam and infrared ray can be used.

Among these, as the light sources of light beam that is used in image exposure of the polymerizable composition according to the invention, the light sources having an emission wavelength in from near infrared to infrared region are preferable; in particular, the solid lasers and semiconductor lasers are preferable.

Furthermore, an exposure system can be any one of an inner surface drum method, outer surface drum method, and flat bed method.

In the image formation material in which the polymerizable composition according to the invention is used as a recording layer, normally, after the image exposure, the recording layer is developed with a developing solution to remove an unexposed area thereof, and thereby an image is obtained. When these polymerizable compositions are used in preparation of planographic printing plates, examples of the developing solutions include those described in JP-B No. 57-7427. Examples of developing solutions include aqueous solutions of inorganic alkali agents such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate, or ammonium water, and organic alkali agents such as monoethanol amine or diethanol amine. Such alkali solution is added so that the concentration thereof may be from 0.1 to 10% by mass, and more preferably from 0.5 to 5% by mass.

Furthermore, such alkaline aqueous solution may slightly contain a surfactant and an organic solvent such as benzyl alcohol, 2-phenoxyethanol, and 2-butoxyethanol when necessary. Examples of alkaline aqueous solution include those recited in U.S. Pat. Nos. 3,375,171 and 3,615,480.

Still furthermore, the developing solutions described in JP-A Nos.50-26601 and 58-54341, and JP-B Nos.56-39464 and 56-42860 are also excellent.

Furthermore, as the developing solution, use of the developing solution containing a specific aromatic nonion surfactant described in JP-A No. 2002-202616 is preferable to the present system in which the polymerizable composition mainly made of polymer is used from the viewpoint of the developability.

A printing plate developed with the above-mentioned developing solution and replenishing solution is subjected to the after treatment with wash water, a rinse solution containing a surfactant or the like, and a desensitizing solution containing gum Arabic and a starch derivative. As the after treatment when the polymerizable composition according to the invention is used as a printing plate, these treatments can be used in various combinations.

In addition to the above, as a plate-making process of the planographic plate precursor that is a preferable application of the polymerizable composition according to the invention, when necessary, before the exposure, during the exposure, and during from the exposure to development, an entire surface thereof may be heated. Owing to such heating, an image formation reaction in the photosensitive layer is accelerated, and advantages such as improving sensitivity and press life and stabilization of the sensitivity result. Furthermore, with an intention of improving the image strength and press life, the image after the development may be effectively subjected to an entire surface after-heating or an entire surface exposure. Ordinarily, the heating before the development is preferably applied under a mild condition of 150° C. or less. When the temperature is too high, there is a problem in that even the non-image area is fogged. The heating after the development is applied under a very strong condition. Usually, it is in a range of 200 to 500° C. When the temperature is lower, a sufficient image strengthening effect cannot be obtained, and when it is too high, problems such as deterioration of the support and pyrolysis of the image area are caused. In the exposure of a scanning exposure planographic printing plate according to the invention, known methods can be applied without limitation.

The polymerizable compositions according to the invention can be applied to a recording layer of scanning exposure planographic printing plate precursor. Moreover, it can also be applied to a high sensitive photo-shaping material, to a hologram material by using the characteristics of the refractive index that varies due to polymerization, and to electronic materials such as photoresist.

EXAMPLES

In the following, the present invention will be explained with embodiments; however, the invention is not limited to these embodiments.

Synthesis of Specific Alkali-soluble Polymerizable Polymer

Synthesis Example 1

P-1

Into a flask, 5-aminosalicyric acid (0.5 mol), sodium hydrogen carbonate (0.5 mol) and N,N-dimethyl acetamide (1 L) were introduced. A reaction solution was cooled to 0° C. Thereto, methacrylic acid chloride (0.5 mol) was dropped over 1 hour. After stirring for 3 hours, when the reaction solution is added to 2L of water under stirring, crystals precipitated. The crystals were filtered and dried followed by recrystallizing from toluene/isopropanol=5/1, and thereby an intermediate product (A-1a) was obtained at a yield of 80%.

Intermediate product A-1a

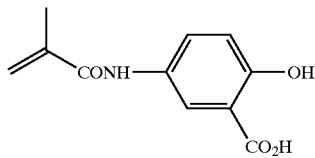

In the next place, the intermediate product A-1a (0.2 mol), pyridine (0.4 mol) and acetone (500 ml) were introduced, a reaction solution was cooled to 0° C. followed by dropping 2-bromoisobutylic acid bromide (0.3 mol) over 1 hour. After stirring for 3 hours, when the reaction solution was added to 1 L of a 0.1 N hydrochloric acid aqueous solution under stirring, crystals precipitated. The crystals were filtered and dried, followed by recrystallizing from hexane/isopropanol=2/1, and thereby a monomer (A-1 M) that becomes a site corresponding to general formula (I) in a target polymer (P-1) was obtained at a yield of 50%. The structure of the substance was confirmed with NMR, IR and GPC.

Monomer (A-1M)

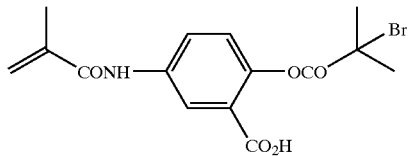

Next, in a flask, the monomer (A-1M) (0.1 mol), 2-bromo-2-methylpropionyloxyethyl methacrylate (0.1 mol), V-59 (available from Wako Pure Chemical Industries, Ltd., azoic thermal-polymerization initiator) (0.006 mol) and N,N-dimethyl acetamide (200 ml) were mixed and stirred at 70° C. for 5 hours.

A reaction solution was cooled to 0° C., thereto DBU (1,8-diazabicyclo[5,4,0]-7-undecene) (0.2 mol) was added followed by stirring for 3 hours, and when the reaction solution was added to 1 L of a 0.5 N hydrochloric acid aqueous solution under stirring, white powder precipitated. The powder was filtered and dried, and thereby P-1 was obtained at a yield of 85%. The structure of the substance was confirmed with NMR, IR and GPC.

Synthesis Example 2

P-2

Into a flask, 4-aminosalicyric acid (0.5 mol), sodium hydrogen carbonate (0.5 mol) and N,N-dimethyl acetamide (1 L) were introduced. A reaction solution was cooled to 0° C. Thereto, methacrylic acid chloride (0.5 mol) was dropped over 1 hour. After stirring for 3 hours, when the reaction solution was added to 2L of water under stirring, crystals precipitated. The crystals were filtered and dried followed by recrystallizing from toluene/isopropanol=5/1, and thereby an intermediate product (A-3a) was obtained at a yield of 85%.

Intermediate product A-3a

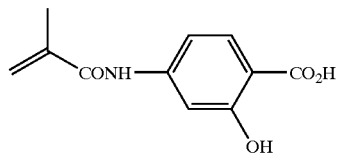

In the next place, the intermediate product A-3a (0.2 mol), pyridine (0.4 mol) and acetone (500 ml) were introduced, a reaction solution was cooled to 0° C. followed by dropping 2-bromoisobutylic acid bromide (0.4 mol) over 1 hour. After stirring for 3 hours, when the reaction solution was added to 1 L of a 0.1 N hydrochloric acid aqueous solution under stirring, crystals precipitated. The crystals were filtered and dried, followed by recrystallizing from hexane/isopropanol=2/1, and thereby a monomer (A-3M) that becomes a site corresponding to general formula (I) in a target polymer (P-2) was obtained at a yield of 50%. The structure of the substance was confirmed with NMR, IR and GPC.

Monomer (A-3M)

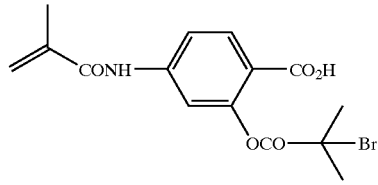

Next, in a flask, the monomer (A-3M) (0.1 mol), 2-bromo-2-methylpropionyloxyethyl methacrylate (0.1 mol), V-59 (available from Wako Pure Chemical Industries, Ltd., azoic thermal-polymerization initiator) (0.006 mol) and N,N-dimethyl acetamide (200 ml) were mixed and stirred at 70° C. for 5 hours. A reaction solution was cooled to 0° C., thereto DBU (1,8-diazabicyclo[5,4,0]-7-undecene) (0.2 mol) was added followed by stirring for 3 hours further followed by adding little by little the reaction solution to 1 L of a 0.5 N hydrochloric acid aqueous solution under stirring, and thereby white powder precipitated. The powder was filtered and dried, and thereby P-2 was obtained at a yield of 90%. The structure of the substance was confirmed with NMR, IR and GPC.

Synthesis Example 3

P-16

In a flask, the monomer (A-1M) obtained in synthesis example 1 (0.1 mol), methacrylic acid methyl (0.04 mol), 2-bromo-2-methylpropionyloxyethyl methacrylate (0.06 mol), V-59 (available from Wako Pure Chemical Industries, Ltd., azoic thermal-polymerization initiator) (0.006 mol) and N,N-dimethyl acetamide (200 ml) were mixed and stirred at 70° C. for 5 hours. A reaction solution was cooled to 0° C., thereto DBU (1,8-diazabicyclo[5,4,0]-7-undecene) (0.2 mol) was added followed by stirring for 3 hours, further followed by adding the reaction solution little by little to 1 L of a 0.5 N hydrochloric acid aqueous solution while stirring, and thereby white powder precipitated. The powder was filtered and dried, and thereby P-16 was obtained at a yield of 90%. The structure of the substance was confirmed with NMR, IR and GPC.

Synthesis Example 4

P-31

In a flask, glycidyl methacrylate (0.16 mol), methacrylic acid methyl (0.04 mol), V-59 (available from Wako Pure Chemical Industries, Ltd., azoic thermal-polymerization initiator) (0.006 mol) and N,N-dimethyl acetamide (200 ml) were mixed and stirred at 70° C. for 5 hours. When 1 L of hexane was added thereto, solid precipitated.

The solvent was subjected to decantation to remove the solvent. Thereafter, in a flask, the solid, sodium acrylate (0.16 mol), piperidine (0.01 mol) and N,N-dimethyl acetamide (200 ml) were added followed by stirring at 50° C. for 5 hours further followed by returning to room temperature. Thereto, triethylamine (0.16 mol) and succinic acid anhydride (0.16 mol) were added followed by stirring further 3 hours. When, after the stirring, a reaction solution was added little by little to 1 L of a 0.5 N hydrochloric acid aqueous solution while stirring, white solid precipitated. The solvent was removed by means of decantation followed by drying, and thereby P-31 was obtained at a yield of 70%. The structure of the substance was confirmed with NMR, IR and GPC.

Similarly to the above, all compounds specifically shown can be similarly synthesized.

Examples 1 to 18, Comparative Examples 1 to 21

In the following, specific examples in which the polymerizable composition of the invention is used as a recording layer of the planographic printing plate precursor will be explained in detail.

<Preparation of Support>

An aluminum plate having a thickness of 0.3 mm was immersed in a 10% by mass sodium hydroxide aqueous solution at 60° C. for 25 seconds for etching followed by washing with running water further followed by neutralizing with 20% by mass nitric acid still furthermore followed by water washing. Subsequently, with a sine wave alternating current, in a 1% by mass nitric acid aqueous solution, at a quantity of electricity of 300 C/dm² at anodizing, the electrolytic surface roughening was applied. Subsequently, the plate was dipped in a 1% by mass sodium hydroxide aqueous solution at 40° C. for 5 seconds followed by dipping in a 30% by mass sulfuric acid aqueous solution, and thereby the desmutting was applied at 60° C. for 40 seconds. Thereafter, in a 20% by mass sulfuric acid aqueous solution, under a current density of 2 A/dm², the anodic oxidation was applied for 2 minutes so that a thickness of an anodic oxidation film might be 2.7 g/m². When the surface roughness thereof was measured, it was found to be 0.3 μm (in terms of Ra according to JIS B0601).

On a back surface of thus treated plate, the following sol-gel reaction solution was coated by using a bar coater followed by drying at 100° C. for 1 minute. Thereby, a support provided with a backcoat layer having a dry coating amount of 70 mg/m² was prepared.

| (Sol-gel reaction solution) | |
| --- | --- |
| Tetraethyl silicate | 50 parts by weight |
| Water | 20 parts by weight |
| Methanol | 15 parts by weight |
| Phosphoric acid | 0.05 parts by weight |

When the above components were mixed and stirred, after approximately 5 minutes, heat generation began. After the reaction was allowed to continue for 60 minutes, a solution shown below was added, and thereby a backcoat coating solution was prepared.

| | |
| --- | --- |
| Condensed resin of pyrogallol with formaldehyde (molecular weight 2000) | 4 parts by weight |
| Dimethyl phthalate | 5 parts by weight |
| Fluorinated surfactant (N-butylperfluorooctane sulfonamide ethyl acrylate/polyoxyethylene acrylate copolymer: molecular weight 20000) | 0.7 parts by weight |
| Methanol silica sol (manufactured by Nissan Chemical Industry, Ltd., methanol: 30 wt %) | 50 parts by weight |
| Methanol | 800 parts by weight |

<Preparation of Recording Layer>

On thus treated aluminum plate, a recording layer forming solution having the following composition was coated so that a dry coating weight might be 1.5 g/m² followed by drying at 100° C. for 1 minute, and thereby a recording layer was formed.

| (Recording layer forming solution) | |
| --- | --- |
| Polymer [A] described in the Table below | (2.0~r) g |
| Polymerization initiator [X] described in the Table below | 0.2 g |
| Sensitizing dye [Y] described in the Table below | 0.3 g |
| Polymerizing compound [R] described in the Table below | r g |
| Fluorinated surfactant (Megafac F-177, produced by Dai-Nippon Ink & Chemicals, Inc.) | 0.03 g |

[In the Tables 2 to 4 below, when the polymerizable compound [R] is described as "none", r is 0 g, and a content of the polymer [A] becomes 2.0 g. In the other cases, a content of the polymerizable compound described as [R] is 1.0 g (r=1.0 g), and the content of the polymer [A] becomes 1.0 g.]

TABLE 2

| | A | X | Y | R | Protective layer | Light source (nm) |
| --- | --- | --- | --- | --- | --- | --- |
| Example 1 | P-1 | X-1 | Y-1 | R-1 | Present | 400 |
| Example 2 | P-3 | X-1 | Y-1 | None | Present | 400 |
| Example 3 | P-6 | X-1 | Y-1 | R-1 | Present | 400 |
| Example 4 | P-10 | X-1 | Y-1 | R-1 | Present | 400 |
| Example 5 | P-16 | X-2 | Y-2 | R-2 | Present | 400 |
| Example 6 | P-29 | X-2 | Y-2 | R-2 | Present | 400 |
| Example 7 | P-31 | X-2 | Y-2 | R-2 | Present | 400 |
| Comparative Example 1 | TP-1 | X-1 | Y-1 | R-1 | Present | 400 |
| Comparative Example 2 | TP-3 | X-1 | Y-1 | None | Present | 400 |

TABLE 2-continued

| | A | X | Y | R | Protective layer | Light source (nm) |
|---|---|---|---|---|---|---|
| Comparative Example 3 | TP-6 | X-1 | Y-1 | R-1 | Present | 400 |
| Comparative Example 4 | TP-10 | X-1 | Y-1 | R-1 | Present | 400 |
| Comparative Example 5 | TP-16 | X-2 | Y-2 | R-2 | Present | 400 |
| Comparative Example 6 | TP-29 | X-2 | Y-2 | R-2 | Present | 400 |
| Comparative Example 7 | TP-31 | X-2 | Y-2 | R-2 | Present | 400 |

TABLE 3

| | A | X | Y | R | Protective layer | Light source (nm) |
|---|---|---|---|---|---|---|
| Example 8 | P-5 | X-1 | Y-3 | R-1 | Present | 532 |
| Example 9 | P-11 | X-1 | Y-3 | R-1 | Present | 532 |
| Example 10 | P-22 | X-2 | Y-4 | R-1 | Present | 532 |
| Example 11 | P-30 | X-2 | Y-4 | R-2 | Present | 532 |
| Comparative Example 8 | TP-5 | X-1 | Y-3 | R-1 | Present | 532 |
| Comparative Example 9 | TP-11 | X-1 | Y-3 | R-1 | Present | 532 |
| Comparative Example 10 | TP-22 | X-2 | Y-4 | R-1 | Present | 532 |
| Comparative Example 11 | TP-30 | X-2 | Y-4 | R-2 | Present | 532 |

TABLE 4

| | A | X | Y | R | Protective layer | Light source (nm) |
|---|---|---|---|---|---|---|
| Example 12 | P-2 | X-3 | Y-5 | R-3 | None | 830 |
| Example 13 | P-8 | X-3 | Y-5 | R-3 | None | 830 |
| Example 14 | P-12 | X-3 | Y-5 | None | None | 830 |
| Exam le 15 | P-19 | X-3 | Y-5 | R-4 | None | 830 |
| Example 16 | P-31 | X-4 | Y-6 | R-4 | None | 830 |
| Example 17 | P-33 | X-4 | Y-6 | R-4 | None | 830 |
| Example 18 | P-34 | X-4 | Y-6 | R-4 | None | 830 |
| Comparative Example 12 | TP-2 | X-3 | Y-5 | R-3 | None | 830 |
| Comparative Example 13 | TP-8 | X-3 | Y-5 | R-3 | None | 830 |
| Comparative Example 14 | TP-12 | X-3 | Y-5 | None | None | 830 |
| Comparative Example 15 | TP-19 | X-3 | Y-5 | R-4 | None | 830 |
| Comparative Example 16 | TP-31 | X-4 | Y-6 | R-4 | None | 830 |
| Comparative Example 17 | TP-33 | X-4 | Y-6 | R-4 | None | 830 |
| Comparative Example 18 | TP-34 | X-4 | Y-6 | R-4 | None | 830 |
| Comparative Example 19 | KP-2 | X-3 | Y-6 | R-3 | None | 830 |
| Comparative Example 20 | KP-12 | X-3 | Y-6 | None | None | 830 |
| Comparative Example 21 | KP-31 | X-4 | Y-6 | R-4 | None | 830 |

In the above Tables 2 to 4, structures of polymers that are used in place of the specific polymerizable polymers according to the invention in the Comparative Examples are shown below. Among the following compounds, the polymer TP-1 that is used in Comparative Example 1 in place of the specific polymerizable polymer P-1 has a structure that does not have a polymerizable group X in a side chain structure represented by general formula (I) of the polymer P-1, and, hereinafter, the polymers denoted with a mark "TP" represent those having the similar structure (no polymerizable group X) corresponding to the specific polymerizable polymer "P". Furthermore, polymer KP-2 that is used in Comparative Example 19 has a structure that does not have an alkali-soluble group A in a side chain structure represented by general formula (I) of the polymer P-2, and, hereinafter, the polymers denoted with a mark "KP" represent those that have the similar structure (no alkali-soluble group A) corresponding to the specific polymerizable polymer "P".

TP denotes ones therefrom a polymerizable group of a polymerizing-acid group side chain of P is removed.

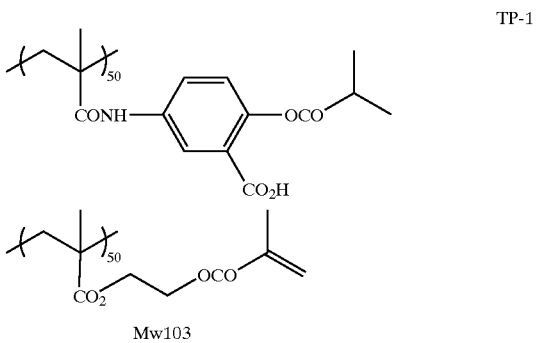

TP-1

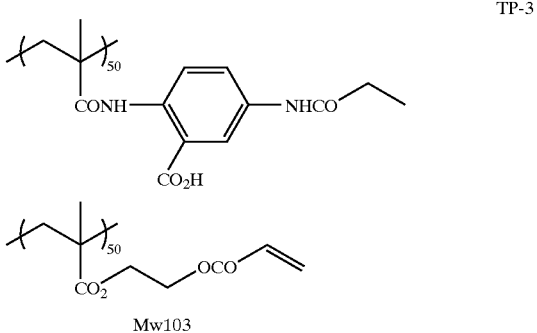

TP-3

TP-6

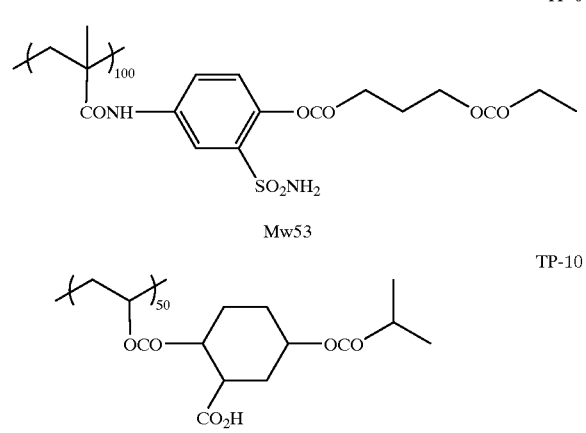

TP-10

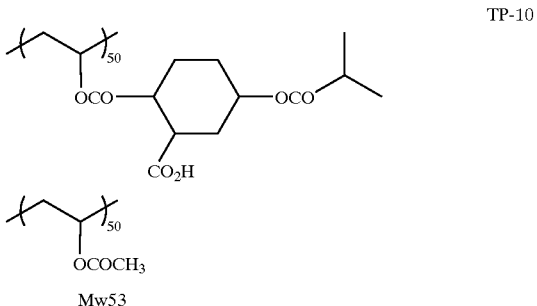

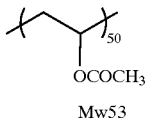

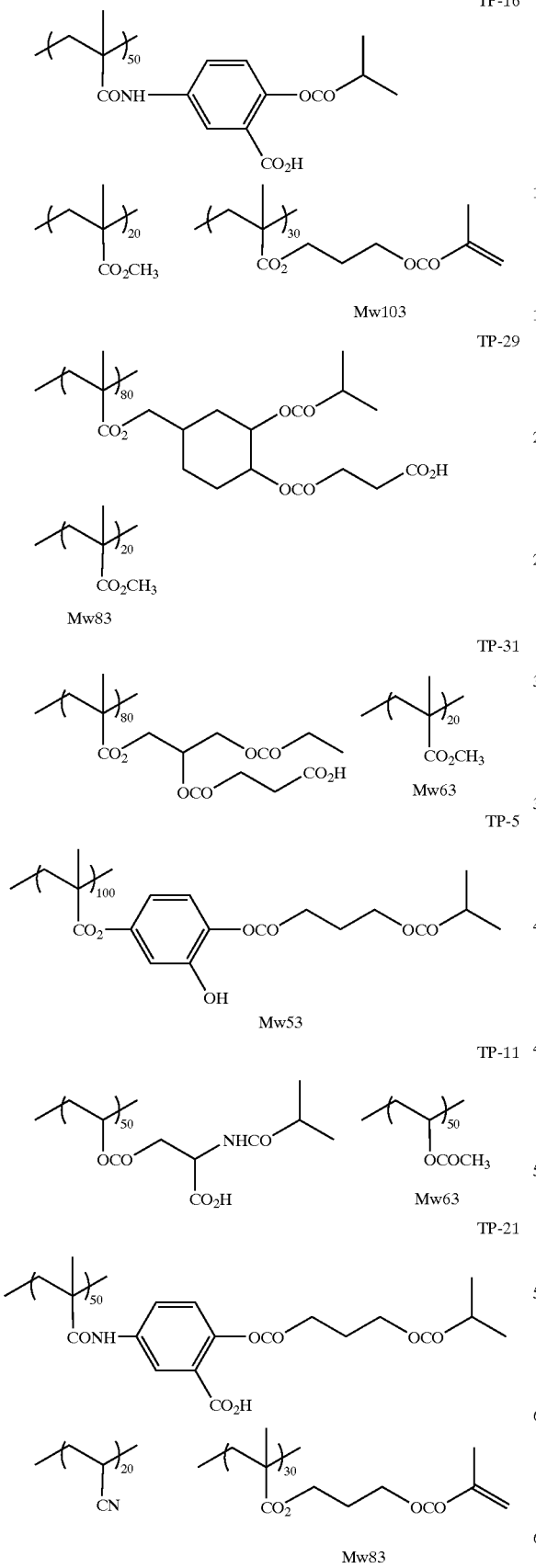
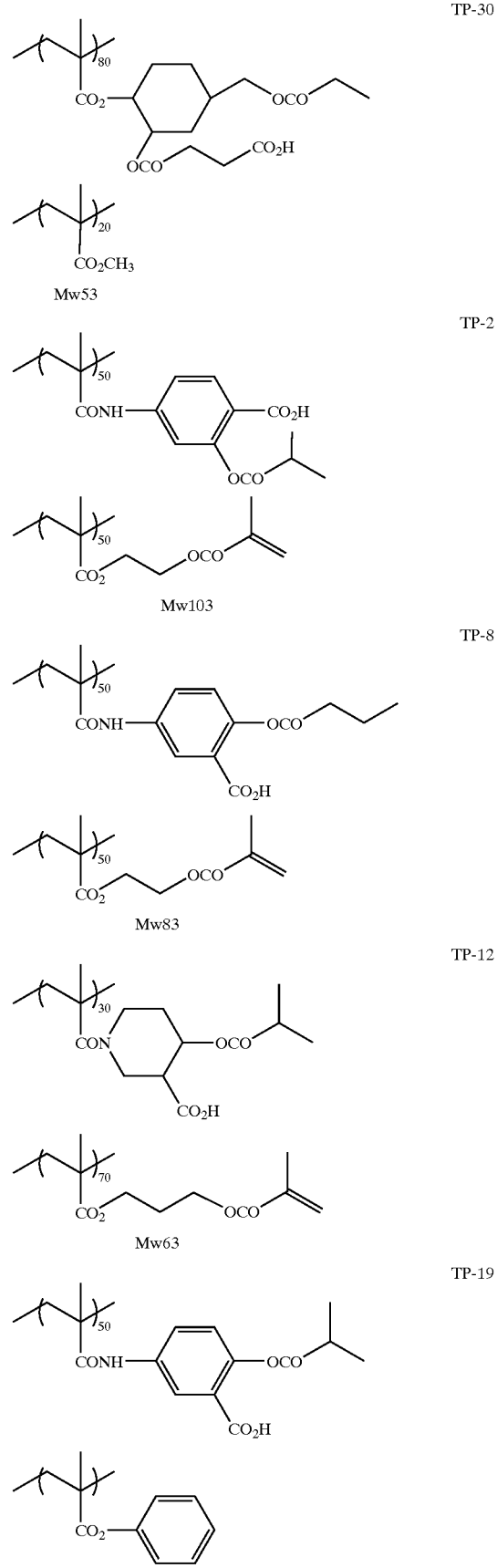

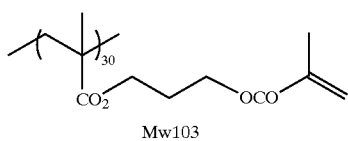
Mw103

TP-31

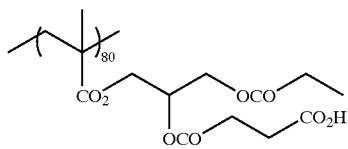

Mw63

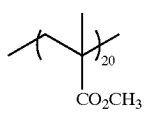
Mw63

TP-33

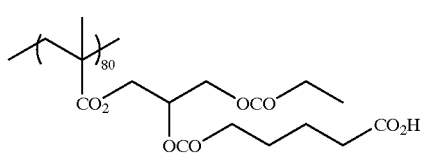
Mw63

TP-34

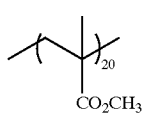
Mw63

KP denotes ones in which an acid group of a polymerizing-acid group side chain of "P" is removed, and, without changing a ratio, for drvelopment purpose, 20 mol percent of acrylic acid is copolymerized.

KP-2

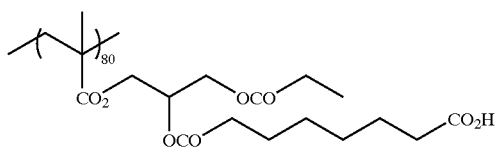

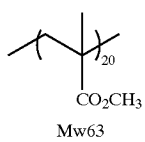

KP-12

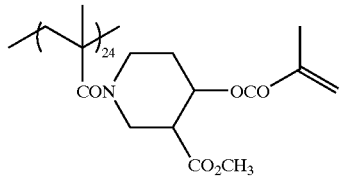

KP-31

Furthermore, structures of the polymerization initiators "X", the sensitizing dyes "Y" and the polymerizable compounds "R" described in the Tables 2 to 4 are shown below.

X-1

X-2

X-3

X-4
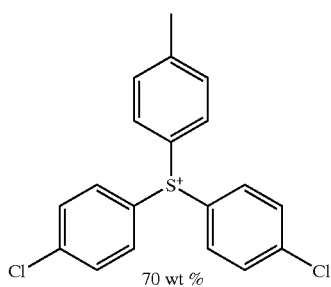
70 wt %
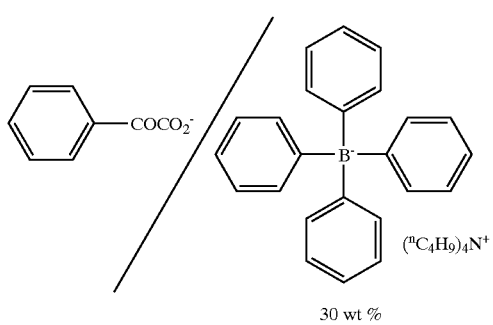
30 wt %
Y-1
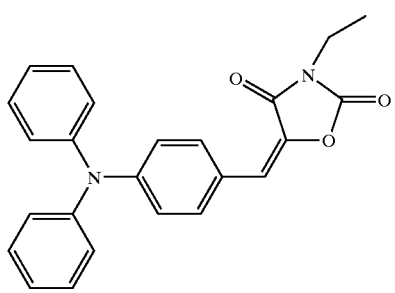
Y-2
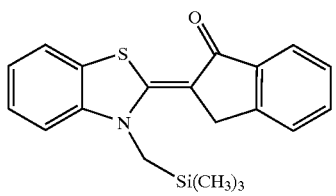
Y-3
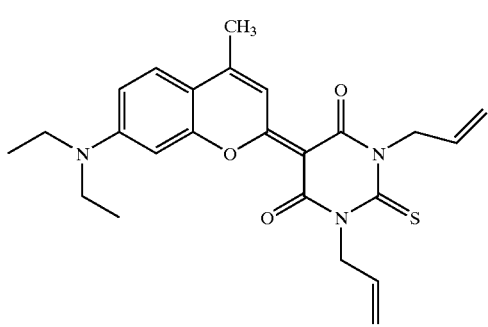
Y-4
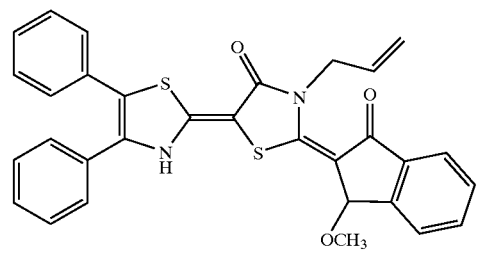
Y-5
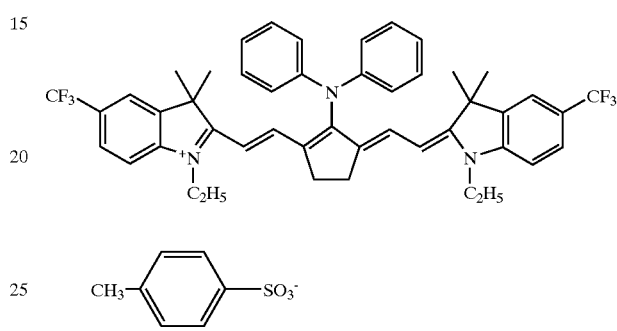
Y-6
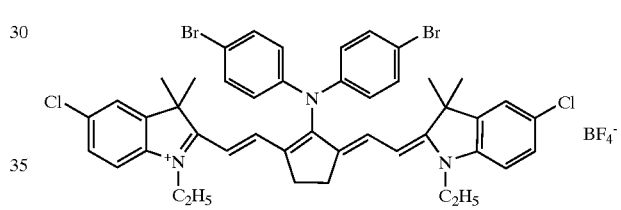
R-1
R-2
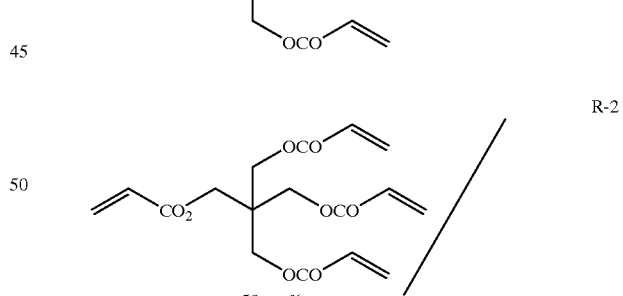
50 wt %
50 wt %
R-3
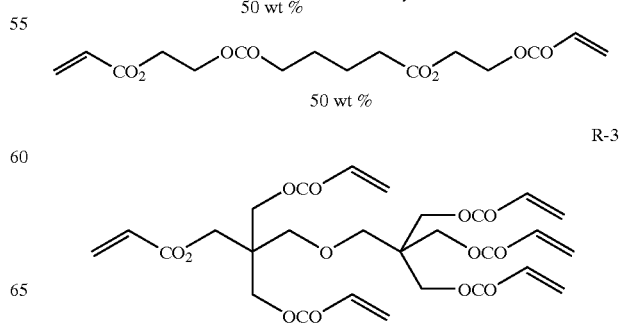

-continued

R-4

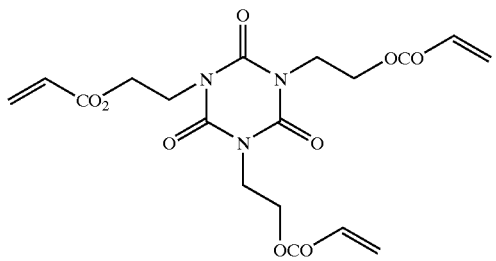

<Preparation of Protective Layer>

Partially on the photosensitive layer, a 3% by mass polyvinyl alcohol (degree of saponification: 98 mol %, and degree of polymerization: 550) aqueous solution was coated so that a dry coating weight might be 2 g/m² followed by drying at 100° C. for 2 minutes, and thereby an image recording material was obtained. Presence of the protective layer is described in the Tables 2 to 4.

<Evaluation of Image Recording Material>

The obtained image recording materials were evaluated according to the following methods. Results are shown in Tables 5 to 7 below.

(Evaluation of Image Quality/Press Life)

The recording layers were subjected to scanning exposure with a laser corresponding to each of the polymerizable compositions used therein to thereby form 0.5% dots (highlight), and after the exposure, developing was carried out with the respective developing solutions described below. A 400 nm semiconductor laser, 532 nm FD-YAG laser, and 830 semiconductor laser were used in the air to expose the polymerizable compositions, respectively, in Examples 1 to 7 and Comparative Examples 1 to 7, Examples 8 to 11 and Comparative Examples 8 to 11, and Examples 12 to 18 and Comparative Examples 12 to 21.

In the present evaluation, the following developing solutions were used. In Examples 3, 8 and 10 and Comparative Examples 3, 8 and 10, a developing solution 2 was used, and for the rest, a developing solution 1 was used.

| (Composition of developing solution 1) | |
|---|---|
| DV-2 (available from Fuji Photo-Film Co.) | 200 g |
| Water | 800 g |

(Composition of Developing Solution 2)

KOH was added to the above developing solution 1 and thereby pH thereof is adjusted to 13.0.

With the image recording material obtained at this time as a printing plate, a Heiderberg KOR-D printer was used to print. After the printing, with the number of printed sheets as an index of press life, relative comparison was made.

Examples 1, 8 and 12 corresponding to the respective exposure wavelengths were taken as references of the respective exposure systems and were assigned to 200. From the standpoint of manufacture, the larger the index is, the more favorable. That the number is larger means that press life is larger in a high definition highlight area, that is, that the image quality is practically higher and press life in the high image quality area is excellent, that is, the compatibility between the image quality and press life is attained.

(Evaluation of Sensitivity)

Each of the recording materials was subjected to scanning exposure with a laser having a wavelength corresponding to each of the recording layers, that is, the same laser as used in the evaluation of the image quality/press life. After exposure, the image recording material was developed by being immersed in a developing solution having the above composition, at 25° C. for 10 seconds. The sensitivity of the image recording material was defined as the minimum exposure amount for an image to be formed under the respective exposure conditions and was calculated in mJ/cm². The results were used for relative comparison between each other. That is, in accordance with the respective exposure wavelengths, Examples 1, 8 and 12 were taken as the references of the respective systems, and relative sensitivities with respect to the respective references (1.0) were obtained.

Relative sensitivity is defined as (sensitivity of reference sensitive material/sensitivity of target sensitive material).

The larger the relative sensitivity is, the better the sensitivity is evaluated to be.

(Evaluation of Storage Stability)

The unexposed image recording material was left for three days under a high temperature condition (60° C.), thereafter, the image recording material which had been stored was exposed in a similar manner as described above, an amount of energy necessary for recording was calculated, and a ratio of the energy before the high temperature storage to that after the high temperature storage (energy after the high temperature storage/energy before the high temperature storage) was obtained. The energy ratio is preferably 1.1 or less from the standpoint of manufacture, and a value in this range means that storage stability is excellent.

Results of the respective evaluations are shown in Tables 5 to 7.

TABLE 5

| | Relative sensitivity | Image quality/press life index | Storage stability |
|---|---|---|---|
| Example 1 | 1.0 | 200 | 1.1 |
| Example 2 | 1.0 | 200 | 1.05 |
| Example 3 | 1.1 | 170 | 1.05 |
| Example 4 | 1.0 | 170 | 1.1 |
| Example 5 | 1.1 | 200 | 1.05 |
| Example 6 | 1.1 | 180 | 1.05 |
| Example 7 | 1.0 | 160 | 1.1 |
| Comparative Example 1 | 0.6 | 150 | 1.1 |
| Comparative Example 2 | 0.6 | 150 | 1.05 |
| Comparative Example 3 | 0.4 | 110 | 1.05 |
| Comparative Example 4 | 0.5 | 100 | 1.1 |
| Comparative Example 5 | 0.6 | 140 | 1.05 |
| Comparative Example 6 | 0.4 | 120 | 1.05 |
| Comparative Example 7 | 0.5 | 90 | 1.1 |

TABLE 6

| | Relative sensitivity | Image quality/press life index | Storage stability |
|---|---|---|---|
| Example 8 | 1.0 | 200 | 1.1 |
| Example 9 | 1.1 | 180 | 1.05 |
| Example 10 | 1.2 | 210 | 1.1 |
| Example 11 | 1.1 | 180 | 1.1 |
| Comparative Example 8 | 0.6 | 130 | 1.1 |
| Comparative Example 9 | 0.5 | 110 | 1.05 |
| Comparative Example 10 | 0.6 | 130 | 1.1 |
| Comparative Example 11 | 0.5 | 120 | 1.1 |

TABLE 7

| | Relative sensitivity | Image quality/ press life index | Storage stability |
|---|---|---|---|
| Example 12 | 1.0 | 200 | 1.05 |
| Example 13 | 1.0 | 190 | 1.1 |
| Example 14 | 1.0 | 180 | 1.1 |
| Example 15 | 1.0 | 210 | 1.05 |
| Example 16 | 1.0 | 170 | 1.1 |
| Example 17 | 0.9 | 150 | 1.1 |
| Example 18 | 0.7 | 130 | 1.1 |
| Comparative Example 12 | 0.5 | 100 | 1.05 |
| Comparative Example 13 | 0.5 | 120 | 1.1 |
| Comparative Example 14 | 0.5 | 100 | 1.1 |
| Comparative Example 15 | 0.4 | 120 | 1.05 |
| Comparative Example 16 | 0.4 | 90 | 1.1 |
| Comparative Example 17 | 0.4 | 90 | 1.1 |
| Comparative Example 18 | 0.4 | 100 | 1.1 |
| Comparative Example 19 | 0.5 | 110 | 1.5 |
| Comparative Example 20 | 0.5 | 100 | 1.5 |
| Comparative Example 21 | 0.5 | 100 | 2.0 |

From the results of Tables 5 to 7, it was found that all of the image recording materials according to examples in which the polymerizable compositions according to the invention were used as the recording layers were capable of recording with high sensitivity, could attain both the high image quality and the excellent press life, and were excellent also in storage stability.

From results of Examples 12 to 18, it was found that as the linking group of Q, one having a ring structure was more effective than one having a chain structure, and, in the chain structure, when the closer the polymerizable group X and the alkali-soluble group A were, the more excellent in the effect.

Furthermore, when Examples 12 to 14 and Comparative Examples 19 to 21 were compared, it was found that the polymers having a side chain structure of general formula (I) in which a polymerizable group and an alkali-soluble group are located with a specific positional relationship was superior in all of the sensitivity, press life and stability to the polymer that contains the above functional groups as different constituent units, that is, the above side chain structure was important in attaining the effect of the invention.

According to the invention, the photo- or thermo-polymerizable composition that allows the curing reaction occurring and forwarding with high sensitivity, is excellent in hardness of the obtained cured film, and is excellent in storage stability can be provided. Furthermore, the polymerizable composition is preferable as a recording layer of a planographic printing plate precursor that allows recording with high sensitivity by infrared laser and is excellent in press life and storage stability.

What is claimed is:

1. A photo- or thermo-polymerizable composition comprising an alkali-soluble polymerizable polymer that contains a structure represented by the following general formula (I) on a side chain:

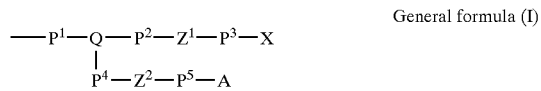

General formula (I)

wherein X represents a polymerizable group; A represents an alkali-soluble group; Q represents a hydrocarbon linking group or a hetero ring; $Z^1$ and $Z^2$ each independently represent a single bond or a hydrocarbon linking group; $P^1$ to $P^5$ each independently represent a single bond, or a linking group constituted by a hydrogen atom, a nitrogen atom, an oxygen atom, a sulfur atom, and a carbonyl group (>C=O).

2. The photo- or thermo-polymerizable composition of claim 1, wherein a main chain of the alkali-soluble polymerizable polymer comprises at least one selected from the group consisting of polystyrene, polyacryl, and polymethacryl.

3. The photo- or thermo-polymerizable composition of claim 1, wherein the polymerizable group represented by X is a radical polymerizable group.

4. The photo- or thermo-polymerizable composition of claim 3, wherein the radical polymerizable group is contained in the alkali-soluble polymerizable polymer in an amount of 0.1 to 10.0 mmol per gram of the alkali-soluble polymerizable polymer.

5. The photo- or thermo-polymerizable composition of claim 1, wherein the alkali-soluble group represented by A is one selected from the group consisting of carboxylic acid, sulfonic acid imide, barbituric acid, and phenol.

6. The photo- or thermo-polymerizable composition of claim 1, wherein the alkali-soluble group represented by A is contained in the alkali-soluble polymerizable polymer in an amount of 0.1 to 10.0 mmol per gram of the alkali-soluble polymerizable polymer.

7. The photo- or thermo-polymerizable composition of claim 1, wherein Q is a hydrocarbon linking group having a cyclic structure.

8. The photo- or thermo-polymerizable composition of claim 1, wherein at least one of $P^2$ and $P^3$ is a linking group constituted by a hydrogen atom, a nitrogen atom, an oxygen atom, a sulfur atom, and a carbonyl group (>C=O).

9. The photo- or thermo-polymerizable composition of claim 1, wherein the structure represented by general formula (I) is contained in the alkali-soluble polymerizable polymer in an amount of 0.1 to 10.0 mmol per gram of the alkali-soluble polymerizable polymer.

10. The photo- or thermo-polymerizable composition of claim 1, wherein a weight average molecular weight of the alkali-soluble polymerizable polymer is in a range of 3,000 to 500,000.

11. The photo- or thermo-polymerizable composition of claim 1, wherein a glass transition point (Tg) of the alkali-soluble polymerizable polymer is in a range of 70 to 300° C.

12. The photo- or thermo-polymerizable composition of claim 1, wherein the alkali-soluble polymerizable polymer is contained in the photo- or thermo-polymerizable composition in an amount of 5 to 100% by mass based on a total solid component of the photo- or thermo-polymerizable composition.

13. The photo- or thermo-polymerizable composition of claim 1, further comprising a polymerizable crosslinking agent having a molecular weight of 1,000 to 10,000.

14. The photo- or thermo-polymerizable composition of claim 15, wherein the polymerizable crosslinking agent is contained in the photo- or thermo-polymerizable composition in an amount of 5 to 90% by mass based on a total amount of the photo- or thermo-polymerizable composition.

15. The photo- or thermo-polymerizable composition of claim 1, further comprising a polymerization initiator.

16. The photo- or thermo-polymerizable composition of claim 1, further comprising a sensitizing dye.

17. The photo- or thermo-polymerizable composition of claim 16, wherein the sensitizing dye has $\lambda_{max}$ in a range of 330 nm to 700 nm.

18. The photo- or thermo-polymerizable composition of claim 16, wherein the sensitizing dye has $\lambda_{max}$ in a range of 800 nm to 1300 nm.

19. A planographic printing plate precursor, comprising a support and a recording layer, wherein the recording layer contains a photo- or thermo-polymerizable composition that includes an alkali-soluble polymerizable polymer that contains a structure represented by the following general formula (I) on a side chain:

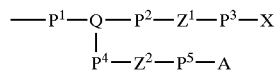

General formula (I)

wherein X represents a polymerizable group; A represents an alkali-soluble group; Q represents a hydrocarbon linking group or a hetero ring; $Z^1$ and $Z^2$ each independently represent a single bond or a hydrocarbon linking group; and $P^1$ to $P^5$ each independently represent a single bond, or a linking group constituted by a hydrogen atom, a nitrogen atom, an oxygen atom, a sulfur atom, and a carbonyl group (>C=O).

* * * * *